United States Patent
Nakasuji et al.

(10) Patent No.: US 7,157,703 B2
(45) Date of Patent: Jan. 2, 2007

(54) ELECTRON BEAM SYSTEM

(75) Inventors: Mamoru Nakasuji, Kanagawa-ken (JP); Tohru Satake, Kanagawa-ken (JP); Nobuharu Noji, Kanagawa-ken (JP); Shoji Yoshikawa, Tokyo (JP); Takeshi Murakami, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/651,105

(22) Filed: Aug. 29, 2003

(65) Prior Publication Data

US 2004/0159787 A1    Aug. 19, 2004

(30) Foreign Application Priority Data

| Aug. 30, 2002 | (JP) | ................... 2002-253197 |
| Nov. 1, 2002 | (JP) | ................... 2002-319687 |
| Jan. 6, 2003 | (JP) | ................... 2003-000178 |

(51) Int. Cl.
*H01J 37/26* (2006.01)

(52) U.S. Cl. ........................................ 250/311

(58) Field of Classification Search ............... 250/311, 250/307, 397
See application file for complete search history.

(56) References Cited

U.S. PATENT DOCUMENTS

| 5,557,105 A * | 9/1996 | Honjo et al. ................. 250/310 |
| 5,763,893 A * | 6/1998 | Nakasuji ................. 250/492.2 |
| 5,892,224 A | 4/1999 | Nakasuji |
| 5,923,034 A * | 7/1999 | Ogasawara et al. .......... 250/311 |
| 2002/0028399 A1 | 3/2002 | Nakasuji et al. |
| 2002/0033449 A1 | 3/2002 | Nakasuji et al. |
| 2002/0088940 A1 | 7/2002 | Watanabe et al. |
| 2003/0132382 A1* | 7/2003 | Sogard ....................... 250/311 |
| 2004/0036032 A1* | 2/2004 | Leung et al. ........... 250/423 R |

FOREIGN PATENT DOCUMENTS

| JP | 05-275519 | 10/1993 |
| JP | 11-108864 | 4/1999 |
| JP | 11-132975 | 5/1999 |
| JP | 11-186150 | 7/1999 |
| JP | 11-283545 | 10/1999 |
| JP | 2000/028688 | 1/2000 |
| JP | 2000/332080 | 11/2000 |
| JP | 2001/242104 | 9/2001 |
| JP | 2002/164011 | 6/2002 |

* cited by examiner

*Primary Examiner*—Nikita Wells
*Assistant Examiner*—James Leybourne
(74) *Attorney, Agent, or Firm*—Wenderoth, Lind & Ponack, L.L.P.

(57) ABSTRACT

Provided is an electron beam system, in which an electron beam emitted from an electron gun is irradiated to a stencil mask, and the electron beam that has passed through the stencil mask is magnified by an electron lens and then detected by a detector having a plurality of pixels so as to form an image of the sample. Further provided is an electron beam system, in which a primary electron beam emitted from an electron gun is directed to a sample surface of a sample prepared as a subject to be inspected, and an electron image formed by a secondary electron beam emanated from the sample is magnified and detected, wherein an NA aperture is disposed in a path common to both of the primary electron beam and the secondary electron beam. An electron lens is disposed in the vicinity of a sample surface, and in this arrangement, a crossover produced by the electron gun, the electron lens and the NA aperture may be in conjugate relationships relative to each other with respect to the primary electron beam.

33 Claims, 37 Drawing Sheets

Fig. 14
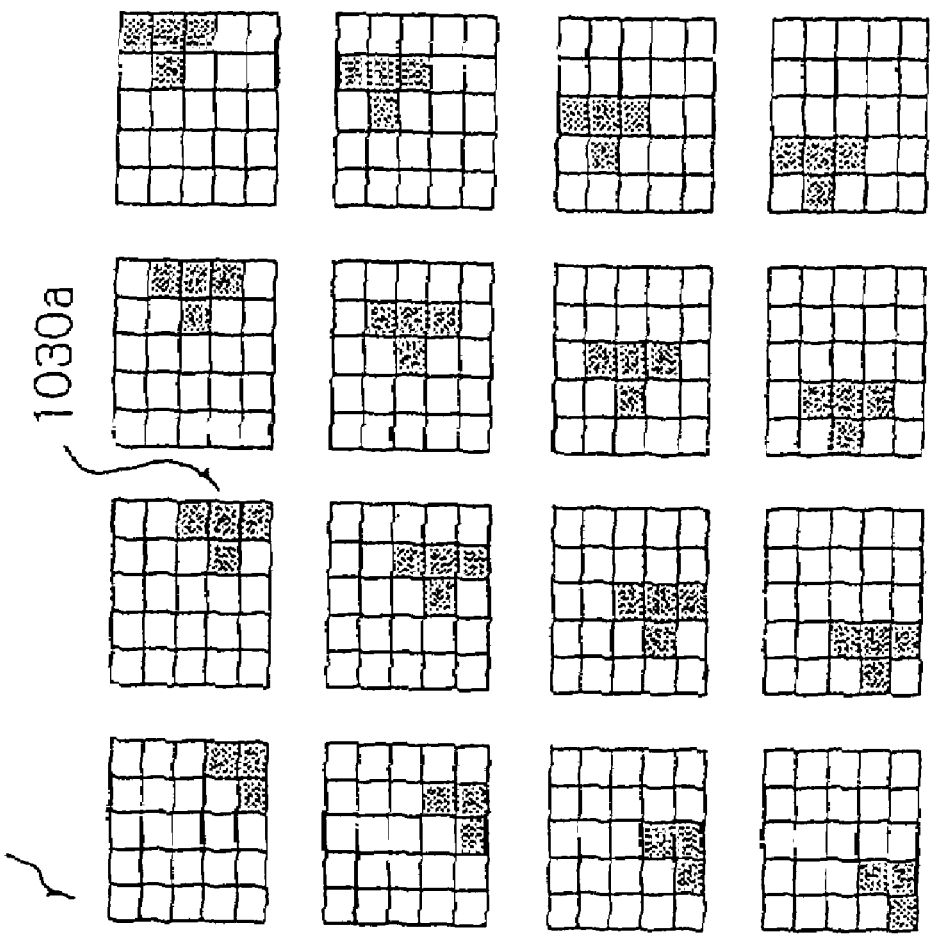
IMAGE TO BE INSPECTED FOR DIFFERENT LOCATIONS
1030a
1032
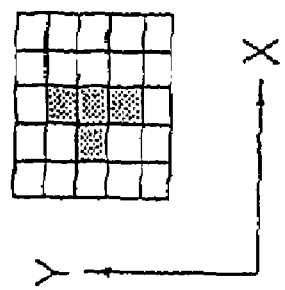
REFERENCE IMAGE 1036

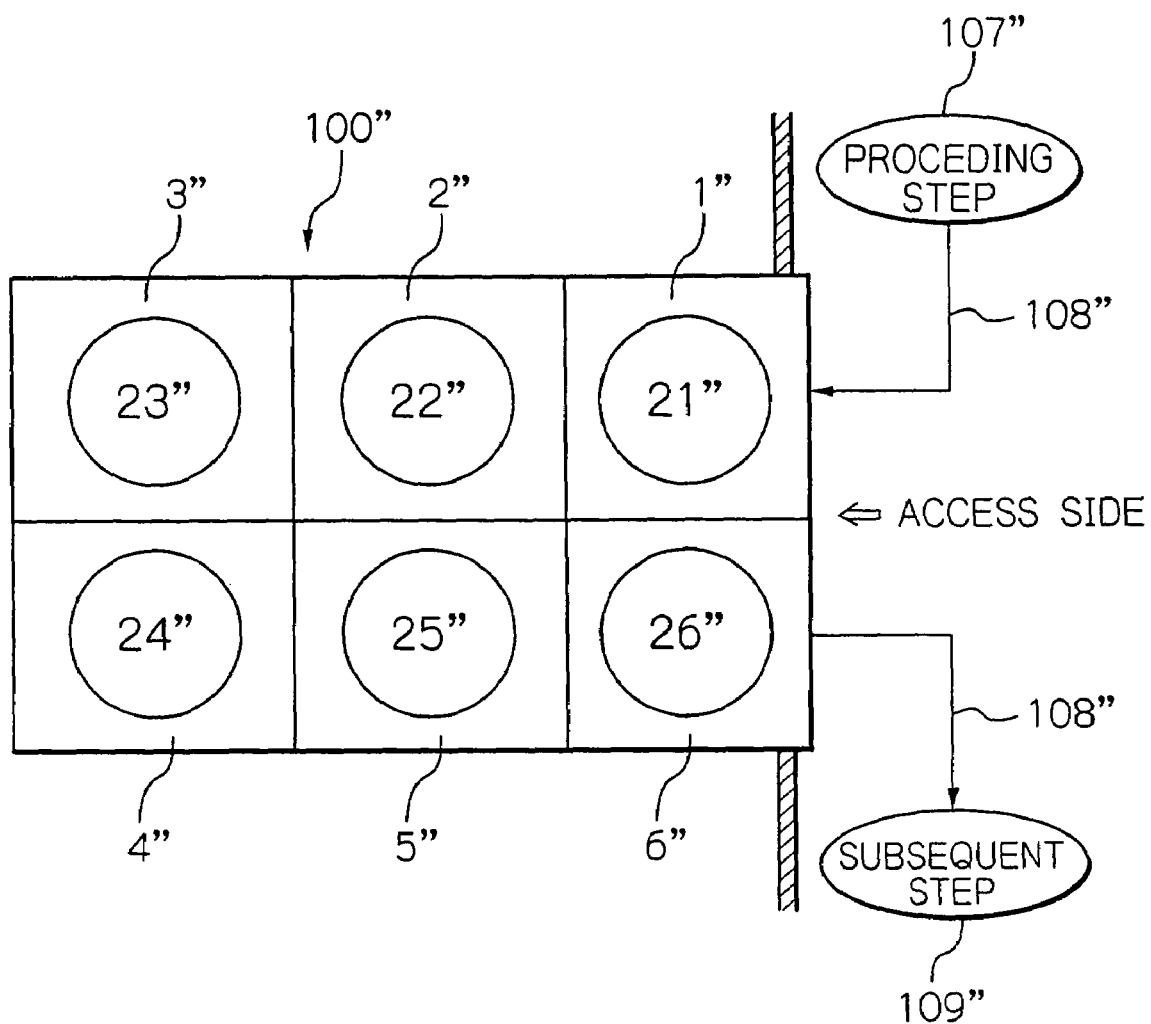

a) GENERAL VIEW b) PLAN VIEW OF STAGE SECTION

MOVING DIRECTION OF STAGE

ELECTRON BEAM SYSTEM

BACKGROUND OF THE INVENTION

The present invention relates to an electron beam system that can provide an evaluation, such as a defect inspection, for an electron beam transmission mask with high throughput and high reliability, and further to a manufacturing method of a device to be used in such an electron beam system.

In a common practice for a defect inspection of a variety of masks including a stencil mask according to related art, a light such as a visible ray is transmitted through the mask and an image therefrom is detected by a CCD camera to thereby perform inspection (inspection by an optical system).

In a defect inspection apparatus of the above-described related optical system, however, any defects having a size not greater than 0.2 µm could not be detected.

Besides, although there has been one such device (an inspection apparatus of an SEM system) that allows an electron beam to scan a mask, in which secondary electrons emanated from this mask or back-scattered electrons therefrom are detected so as to inspect the mask for any potential defects therein, this device has been suffered from a problem of quite a long time being required for the inspection.

SUMMARY OF THE INVENTION

The present invention has been made in the light of above-pointed problems, and an object thereof is to provide an electron beam system that allows for inspection for a minute defect with high throughput and high reliability, and also to provide a device manufacturing method that can improve a yield of device manufacturing by performing the mask inspection using such a system.

According to an aspect of the present invention, there is provided an electron beam system comprising an electron gun for emitting an electron beam and irradiating the electron beam against a sample, an electron lens for magnifying the electron beam that has passed through the sample, and a detector for detecting this magnified electron beam and forming an image of the sample.

According to another aspect of the present invention, there is provided a semiconductor manufacturing apparatus for a wafer or a mask, specifically a semiconductor manufacturing apparatus with an inspection apparatus incorporated therein.

According to still another aspect of the present invention, there is provided an electron beam system in which a primary electron beam emitted from an electron gun is irradiated onto a surface of a sample to be inspected, and an electron image formed by a secondary electron beam emanated from the sample is magnified so as to be used for a detection. The system further comprises an NA aperture along an optical path commonly shared by the primary electron beam and the secondary electron beam, and an electron lens disposed in the vicinity of the surface of the sample, wherein a crossover created by the electron gun and the electron lens and the NA aperture are respectively in a conjugate relationship relative to each other.

BRIEF DESCRIPTION OF THE DRAWINGS

FIG. 14 is a conceptual diagram showing a plurality of regions to be inspected, which are partially overlapped one on the other while being offset from each other over a surface of a mask;

FIG. 18 is a schematic diagram illustrating a principle of a second invention;

DETAILED DESCRIPTION OF THE PREFERRED EMBODIMENTS

Figure 1:
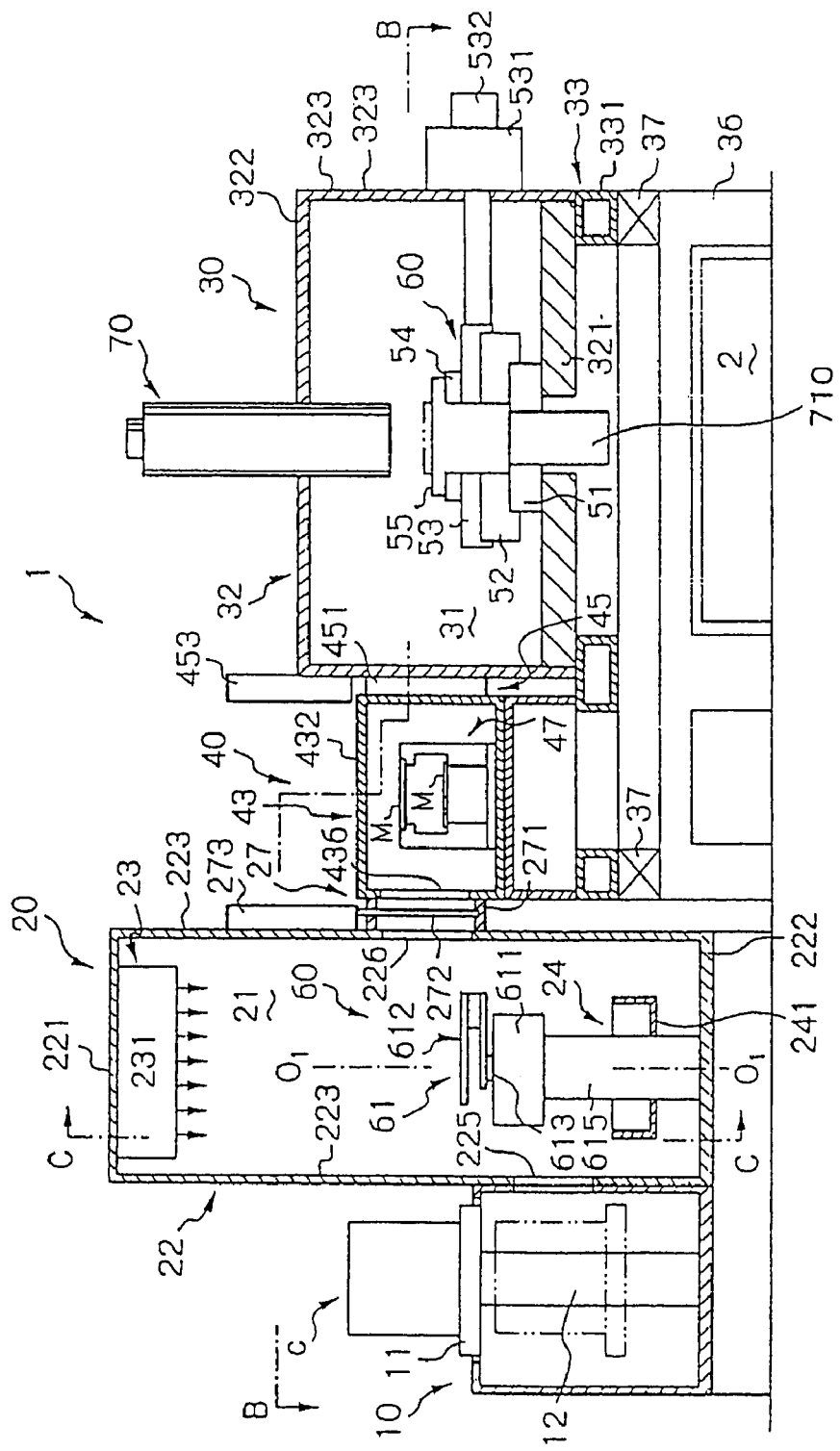
FIG. 1 is an elevational view illustrating main components of an inspection apparatus according to an embodiment of a first invention, taken along A—A line of FIG. 2A.

First of all, an outline of an electron beam system according to an embodiment of a first invention will be described.

[1] This electron beam system is defined as such an electron beam system, in which an electron beam emitted from an electron gun is irradiated to a sample, and the electron beam that has passed through the sample is magnified by an electron lens and further detected by a detector having a plurality of pixels so as to form an image of the sample.

[2] In the electron beam system, the sample may be a stencil mask.

[3] In the electron beam system, the electron beam to be irradiated may be an electron beam of good collimation.

[4] In the electron beam system, an optical system for irradiation may comprise at least one shaping aperture, wherein an image of the shaping aperture may be formed onto a surface of the sample.

[5] In the electron beam system, the shaping aperture may comprise a plurality of shaping apertures disposed in the vicinity of an optical axis, and in another system, an area of the sample subject to the irradiation may be modified by changing an overlap of the shaping apertures relative to each other.

[6] In the electron beam system, the electron gun may comprise a thermal electron emission cathode, so that the electron gun can be operated under a space-charge-limited-condition.

[7] In the electron beam system, the electron beam system may further comprise at least a two-stage arrangement of electron lenses and at least one shaping aperture, wherein a primary ray exiting from the at least one shaping aperture may be irradiated in a collimated state onto the sample.

[8] In the electron beam system, the optical system for irradiation may comprise an entrance pupil of an irradiation lens system, wherein a source image may be formed on the entrance pupil.

[9] In the electron beam system, a magnification of a magnifying lens may be made variable in dependence on a size of an irradiation area of the electron beam.

[10] In the electron beam system, the irradiation area of the electron beam may be specified as a rectangular shape having long sides and short sides, wherein a detection (evaluation) of the sample may be performed while continuously moving a sample table carrying the sample in a direction along the short sides.

[11] In the electron beam system, the electron beam may be driven to scan in a step-by-step manner or in a sequential manner.

[12] In the electron beam system, the detector may comprise a scintillator, a CCD detector and an optical lens, wherein a size of an image formed by the scintillator may be adjusted by using the optical lens so that the image may be formed on a CCD plane in the CCD detector.

[13] In the electron beam system, the electron gun may be designed as such an electron gun of a small electron source image having an FE, a TFE, or a Schottky cathode.

[14] In the electron beam system, the electron gun may be disposed under the sample and a detector for detecting a defect in the sample may be disposed above the sample or a stencil mask.

[15] In the electron beam system, a plurality of magnifying lenses for magnifying the electron beam may be disposed between the electron gun and the detector, and further the magnifying lens serving for magnifying the electron beam that has passed through the sample (a variety of masks) firstly among the others may be a doublet lens.

[16] In the electron beam system, the magnifying lens may comprise an NA aperture, wherein the magnifying lens may be designed such that any electron beams having bad property in collimation, which have been scattered on the sample, can be eliminated by the NA aperture. In a specific configuration thereof, the NA aperture is disposed between components of the doublet lens.

[17] In the electron beam system, the detector may be configured such that an MCP and a scintillator may be placed in a vacuum environment, which is followed by a relay optical system, serving also as a vacuum window, and a CCD detector or a TDI detector in this sequence.

[18] In the electron beam system, the relay optical system and the CCD detector, or the relay optical system and the TDI detector, may be disposed in a vacuum environment.

[19] In the electron beam system, the image detector may comprise an MCP, an EB-CCD detector or an EB-TDI detector.

[20] In the electron beam system, a detector serving for detecting secondary electrons or back scattered electrons may be placed on an electron gun side of the sample, and by changing a focal length of the lens, a crossover image of small size may be formed on a surface of the sample so as to scan it, thereby performing registration of the sample.

[21] In the electron beam system, a detector serving for detecting secondary electrons or back scattered electrons may be placed on an electron gun side of the sample, and further an electron beam of small size may be formed by reducing an overlap of two shaping apertures, which is used to form a crossover image on a surface of the sample and to scan it, thereby performing registration of the sample.

[22] In the electron beam system, an equivalent scan frequency per pixel may be set to be higher than 200 MHz.

[23] In the electron beam system, a defect inspection of a sample may be performed by comparing an image data, obtained by an electron beam that has passed through the sample, with a previously stored pattern data.

[24] In the electron beam system, a defect in a stencil mask may be detected by irradiating an electron beam emitted from an electron gun, against a stencil mask and then by detecting electrons that have passed through the stencil mask.

[25] In the electron beam system, the electron beam system may comprise a plurality of optical systems, wherein the term "a plurality of optical systems" refers to such a form that comprises a plurality of optical systems for irradiation including electron guns and a plurality of detectors including detecting sensors, with each of the optical systems for irradiation corresponding to each of the detectors in one-by-one manner.

[26] The electron beam system may be used to provide a manufacturing method of a semiconductor device using a stencil mask that has experienced a defect inspection.

One specific example may be a manufacturing method of a semiconductor device comprising the following steps:

(a) a step for manufacturing a mask;

(b) a step for inspecting this manufactured mask by using the electron beam system; and (c) a step for manufacturing a variety of chips by using the mask that has experienced a defect inspection.

Further, the electron beam system may be applied also to a lithography step in a wafer processing process. In that case, in order to selectively process a layer of thin film, a wafer substrate and the like, a mask that has been inspected by the electron beam system may be used to form a resist pattern.

A preferred embodiment of a first invention will now be described with reference to the attached drawings, taking by way of example a semiconductor inspection apparatus serving for inspecting a substrate or a mask (e.g., a stencil mask) having a patterned surface as an object of inspection.

Figure 2A:
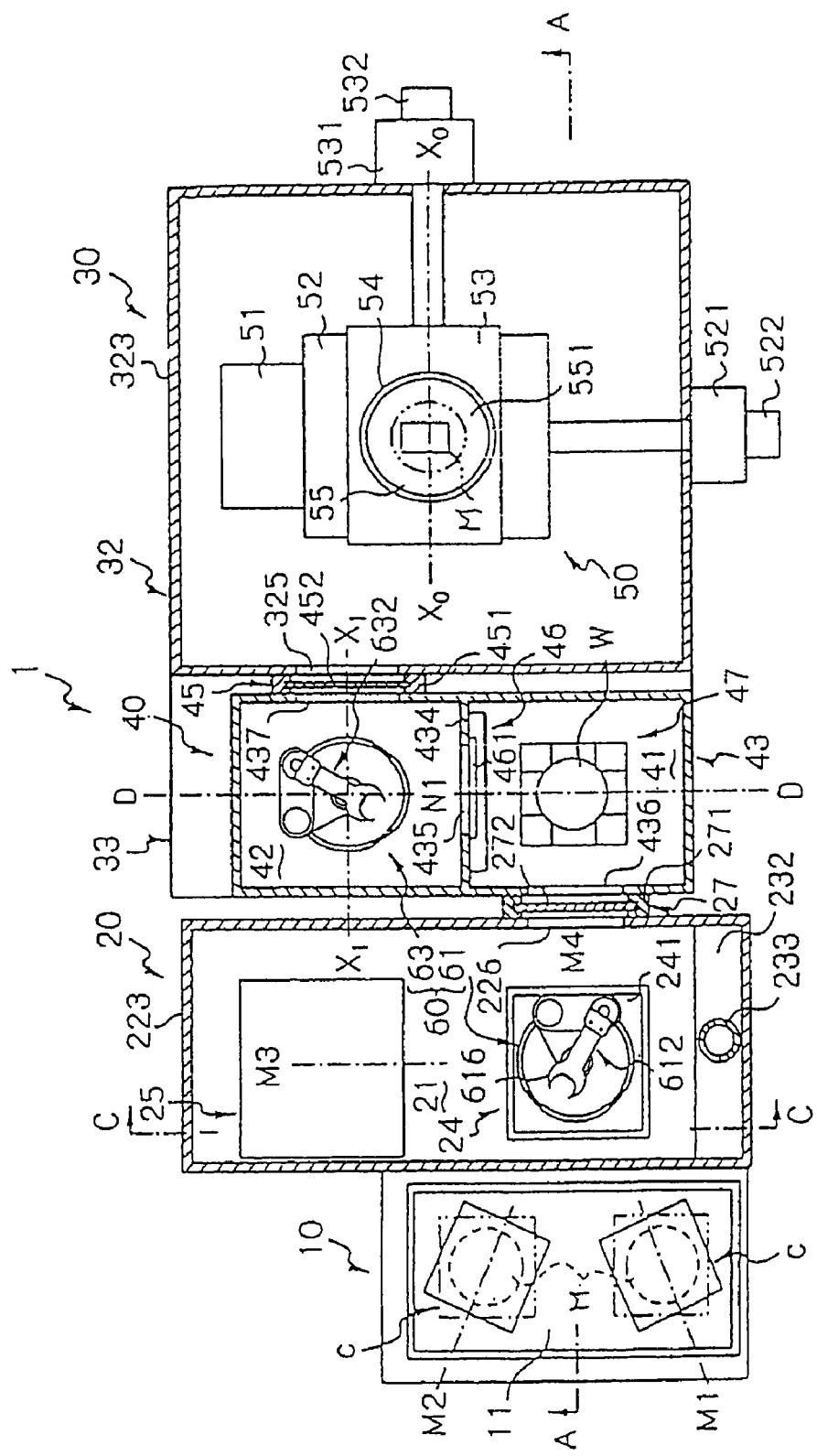
FIG. 2A is a plan view illustrating main components of the inspection apparatus shown in FIG. 1, taken along B—B line of FIG. 1.

FIGS. 1 and 2A show main components of a semiconductor inspection apparatus 1 of the present embodiment in an elevational view and a plan view.

The semiconductor inspection apparatus 1 of this embodiment comprises: a cassette holder 10 for holding a cassette containing a plurality of masks "M"; a mini-environment unit 20; a main housing 30 defining a working chamber; a loader housing 40, located between the mini-environment unit 20 and the main housing 30, and defining two loading chambers; a loader 60 for picking up masks from the cassette holder 10 and loading them onto a sample table 50 located within the main housing 30; and an electron beam system 70 disposed in the main housing 30, all of which are arranged in such a physical relationship as depicted in FIGS. 1 and 2A.

Cassette Holder

The cassette holder 10 is designed to hold a plurality (two in this embodiment) of cassettes "c" (e.g., a closed cassette, such as SMIF, FOUP, manufactured by Assist Inc.), each containing a plurality (e.g., five) of masks M placed side by side in parallel with each other along an up and down direction. This cassette holder may employ a suitable structure depending on specific cases selectively such that for a case where a cassette is transferred by a robot or the like and loaded onto the cassette holder 10 automatically, a specific suitable structure therefor may be employed, and that for a case where a loading operation is manually performed, an open cassette structure suitable therefor may be employed. In this embodiment, the cassette holder 10 has employed a system for automatically loading the cassette c, and comprises, for example, an elevating table 11 and an elevating mechanism 12 for moving up and down the elevating table 11, wherein the cassette c can be set on the elevating table 11 automatically in a state illustrated by the chain line in FIG. 2A, and after having been set, the cassette c is rotated automatically into an orientation illustrated by the solid line in FIG. 2A for heading to an axial line of rotational movement of a first transport unit within the mini-environment unit. Further, the elevating table 11 is lowered into a position indicated by the chain line in FIG. 1. Thus, the cassette holder used in a case of automatic loading or a cassette holder used in the case of manual loading may appropriately employ any known structure, and detailed description of this structure and function will be herein omitted.

Figure 2B:
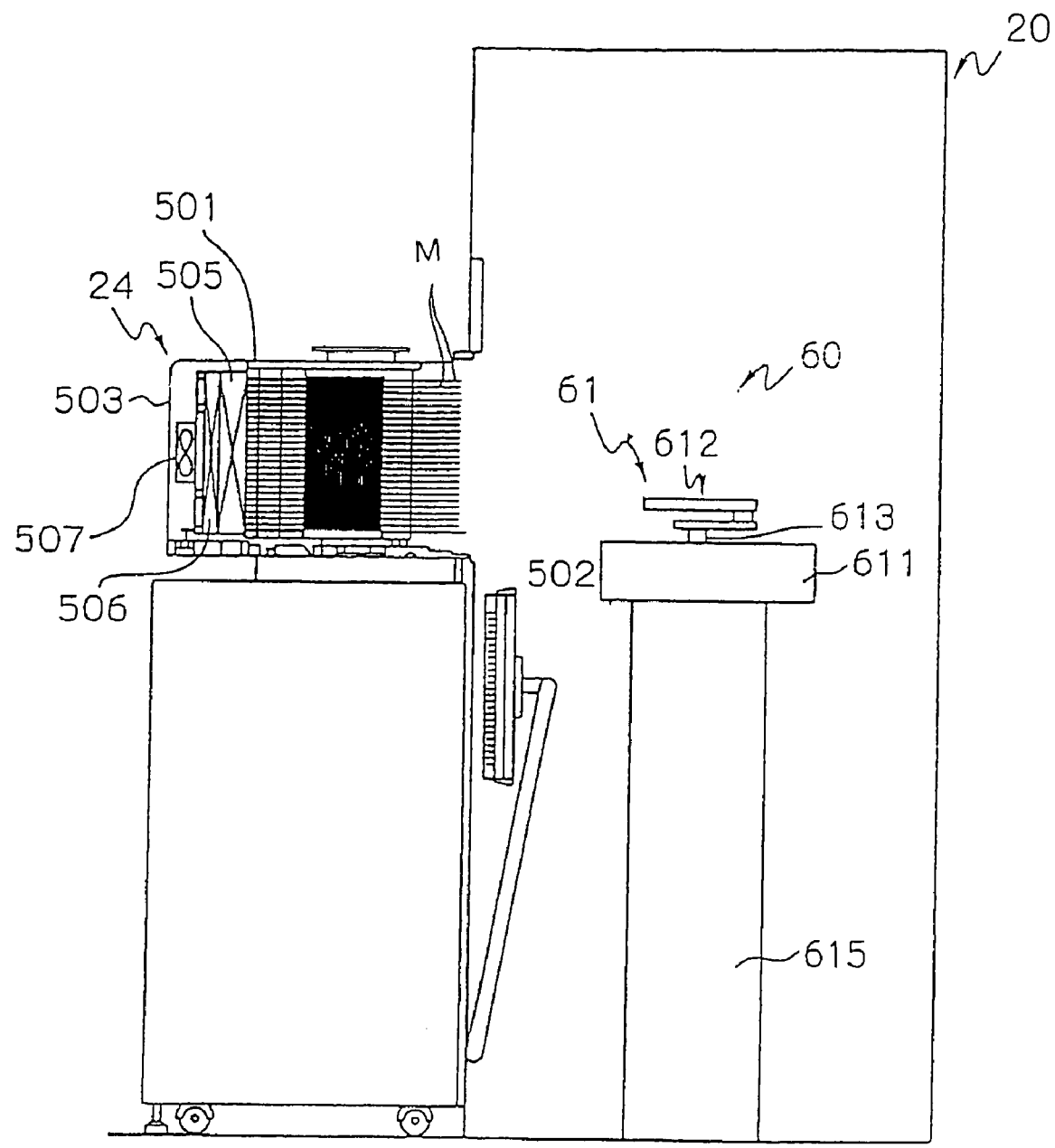
FIG. 2B is a schematic sectional view illustrating another embodiment of a substrate carry-in unit in the first invention.

In an alternative embodiment, as shown in FIG. 2B, a plurality of mask substrates is accommodated in a state where they are contained in slot-type pockets (not shown) secured firmly to an inner side of a box main body 501, so that these mask substrates may be transferred and stored in this state. This substrate carrier box 24 consists of a rectangular parallelepiped box main body 501; a substrate carry-in and carry-out door 502, which is joined with an automatic opening and closing system therefor so that an opening formed in a side surface of the box main body 501 may be opened and closed automatically; a lid 503 for covering another opening, located opposite to this door opening, serving for attaching/detaching filter elements and a fan motor; slot-type pockets (not shown) for holding substrates M; a ULPA filter 505; a chemical filter 506; and a fan motor 507. In this embodiment, the substrates are taken in and out by a first transport unit 612 of a robot system.

It is to be noted that the substrates or the masks M contained in the cassette c are those subject to inspection, and such an inspection may be performed after or in the course of a process for processing a mask in a series of processes for manufacturing a semiconductor. Specifically, those substrates or the masks that have experienced a film-depositing step, an etching step, an ion implantation step and the like, or those masks that have been patterned on a surface thereof may be accommodated in the cassette. Since a number of those masks are accommodated in the cassette c so as to be spaced in parallel from each other along the up and down direction, an arm of the first transport unit is adapted to move up and down so that a mask in a desired position can be held by the first transport unit, as will be described later.

Mini-Environment Unit

Figure 3:
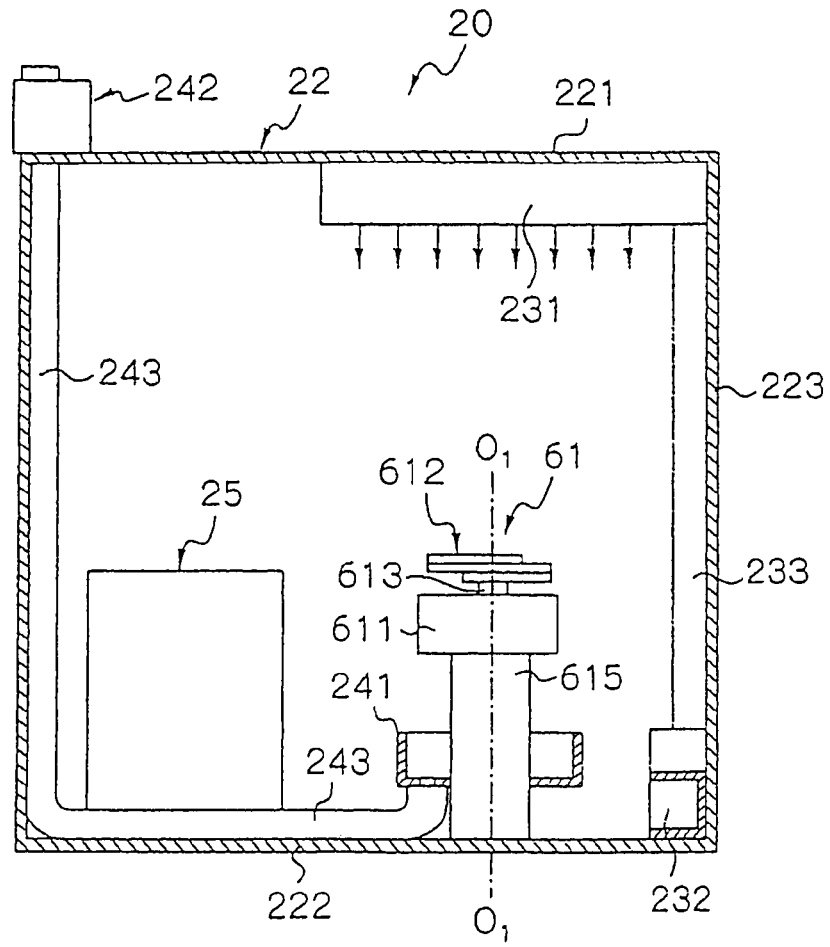
FIG. 3 is a sectional view illustrating a mini-environment unit of FIG. 1, taken along C—C line of FIG. 2A.

In FIGS. 1 through 3, the mini-environment unit 20 comprises: a housing 22 defining a mini-environment space 21 of which atmosphere may be controlled; a gas circulator 23 for providing atmosphere control by circulating a gas such as a clean air within the mini-environment space 21; an exhausting device 24 for recovering and then exhausting a portion of air supplied into the mini-environment space 21; and a pre-aligner 25 arranged within the mini-environment space for providing a coarse alignment of a substrate or a mask subject to an inspection.

The housing 22 comprises a top wall 221, a bottom wall 222 and circumferential walls 223 surrounding four circumferential portions so as to provide a structure to separate the mini-environment space 21 from an external environment. In order to provide the atmosphere control of the mini-environment space, the gas circulator 23 comprises, as shown in FIG. 3, a gas supply unit 231 which is attached to the top wall 221 within the mini-environment space 21 for cleaning the gas (air in this illustrate embodiment) and then directing a laminar flow of thus cleaned air right below through one or more gas blowoff openings (not shown); a recovery duct 232 located on the bottom wall 222 within the mini-environment space for recovering air that has flown down toward a bottom; and a conduit 233 interconnecting the recovery duct 232 and the gas supply unit 231 for returning recovered air back to the gas supply unit 231. In this embodiment, the gas supply unit 231 is designed to intake about 20% of supply air from outside of the housing 22 for cleaning, but a ratio of the gas to be taken in from an outer environment may be arbitrarily selected. The gas supply unit 231 comprises a HEPA or ULPA filter of a known structure to create clean air. The laminar flow of the clean air directed downward, or a down flow, is supplied such that it can flow mainly through a conveying surface of the first transport unit located within the mini-environment space 21, as will be described later, to thereby prevent any dust, which may possibly be produced by the transport unit, from adhering to the mask. Consequently, the blowoff opening for the down flow may not necessarily be arranged in a location near the top wall as illustrated but it may be arranged at a level above the conveying surface defined by the transport unit. Also, the down flow may not necessarily flow entirely across the mini-environment space. It is to be noted that depending on each particular case, cleanliness may be ensured by using ionic air as the clean air. Further, a sensor for observing the cleanliness in the mini-environment space may be provided therein, so that an operation of the unit may be shut down when the cleanliness is degraded. An access port 225 is formed in a location of the circumferential wall 223 of the housing 22 adjacent to the cassette holder 10. A shutter system of a known structure may be arranged in the vicinity of the access port 225 so that the access port 225 can be closed from the mini-environment unit side. The laminar down flow created in the vicinity of the mask may be at a flow velocity of 0.3–0.4 m/sec, for example. The gas supply unit may not necessarily be disposed within the mini-environment space but may be disposed external to the mini-environment space.

The exhausting device 24 comprises: a suction duct 241 disposed in a location lower than the mask conveying surface of the transport unit and in a lower portion of the transport unit; a blower 242 disposed external to the housing 22; and a conduit 243 for interconnecting the suction duct 241 and the blower 242. This exhausting device 24 sucks the gas flowing down along a circumference of the transport unit and containing dust which may possibly be produced by the transport unit, through the suction duct 241, and exhausts that air to the outside of the housing 22 via the conduits 243, 244 and the blower 242. In that case, the air may be exhausted through an exhaust pipe (not shown) laid near the housing 22.

The pre-aligner 25 disposed within the mini-environment space 21 is designed to detect optically or mechanically a contour of the mask, and to provide in advance an alignment of the mask in a rotational direction around axis line O—O of the mask within an accuracy of ±1 degree. The pre-aligner is a constitutional part of a mechanism for determining a coordinate of a subject to be inspected in accordance with claims of the present invention, and takes a role for providing a coarse alignment of the subject to be inspected. Since the pre-aligner may be of any known structure, description of its structure and function will be omitted.

It is understood that although it is not shown, a recovery duct for the exhausting device may also be provided under the pre-aligner so that the air containing dust from the pre-aligner can be exhausted to the outside.

Main Housing

In FIG. 1 and FIG. 2A, the main housing 30 defining the working chamber 31 comprises a housing main body 32, which is supported by a housing supporting device 33 loaded on a vibration insulating device or a vibration isolating device 37 located on a table frame 36. The housing supporting device 33 comprises a frame structure 331 assembled into a rectangular shape. The housing main body 32 is disposed and mounted securely onto the frame structure 331 and comprises a bottom wall 321 loaded on the frame structure, a top wall 322 and circumferential walls 323 connected to both of the bottom wall 321 and the top wall 322 to surround four circumferential portions, thereby isolating the working chamber 31 from the outside. Although the bottom wall 321 is shown, in this embodiment, to be made of a relatively thick steel plate in order to prevent any displacement from being induced from the loading of devices, such as a sample table, loaded thereon, other structures may be employed. In this embodiment, the housing main body and the housing supporting device 33 have been assembled in a rigid structure, wherein the vibration isolating device 37 prevents vibration from a floor on which the table frame 36 is installed from being transmitted to this rigid structure. An access port 325 for taking in and out a mask is formed in one circumferential wall from among those circumferential walls 323, which is adjacent to a loader housing, which will be described later.

It is to be understood that the vibration isolating device may be of an active type having an air spring, a magnetic bearing and the like, or alternatively of a passive type having the same elements. Either of these types may have a known structure, and description of its structure and function will be herein omitted. The working chamber 31 is designed to be held in a vacuum atmosphere by a vacuum device (not shown) having a known structure. A controller 2 for controlling an overall operation of the apparatus is located under the table frame 36.

Loader Housing

Figure 4:
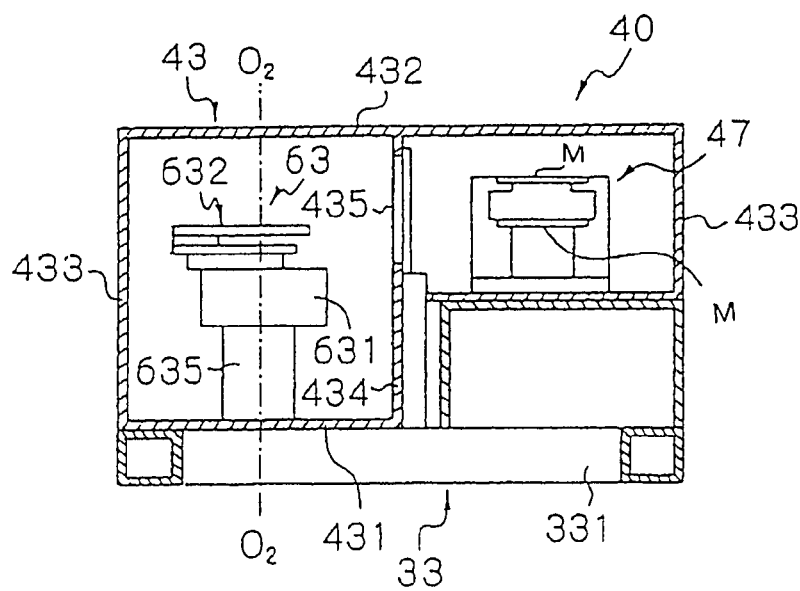
FIG. 4 is a sectional view illustrating a loader housing of FIG. 1, taken along D—D line of FIG. 2A.

Referring to FIGS. 1, 2A and 4, the loader housing 40 comprises a housing main body 43 defining a first loading chamber 41 and a second loading chamber 42. The housing main body 43 comprises a bottom wall 431, a top wall 432, circumferential walls 433 surrounding four circumferential portions, and a partition wall 434 for separating the first loading chamber 41 and the second loading chamber 42, so that both loading chambers may be isolated from an external environment. An access port 435 is formed in the partition wall 434 for passing mask M between two loading chambers. Further, access ports 436 and 437 are formed in locations of the circumferential walls 433 adjacent to the mini-environment unit and the main housing, respectively. The housing main body 43 of this loader housing 40 is mounted on and supported by the frame structure 331 of the housing supporting device 33. Accordingly, this loader housing 40 is also designed to be protected from any vibrations otherwise transmitted from the floor. The access port 436 of the loader housing 40 and the access port 226 of the housing 22 of the mini-environment unit are aligned and interconnected with each other, and at a connecting point therebetween a shutter system 27 is arranged so as to selectively block communication between the mini-environment space 21 and the first loading chamber 41. The shutter system 27 includes a sealing member 271 surrounding circumferences of the access ports 226 and 436 and fixedly secured in tight contact to circumferential wall 433, a door 272 working cooperatively with the sealing member 271 so as to block an air passage through the access ports, and a driving device 273 for driving that door. Further, the access port 437 of the loader housing 40 and the access port 325 of the housing main body 32 are aligned and interconnected with each other, and at a connecting point therebetween a shutter system 45 is arranged so as to selectively seal and block communication between the second loading chamber 42 and the working chamber 31. The shutter system 45 includes a sealing member 451 surrounding the access ports 437 and 325 and fixedly secured in tight contact to circumferential walls 433 and 323, a door 452 working cooperatively with the sealing member 451 so as to block an air passage through the access ports, and a driving device 453 for driving that door. Further, the opening formed in the partition wall 434 is provided with a shutter system 46 which selectively seals and blocks communication between the first and the second loading chambers by closing a door 461. Those shutter systems 27, 45 and 46 are designed to provide an airtight sealing for each chamber when they are in closed positions. Those shutter systems may be of any known systems, and detailed description of their structure and function will be herein omitted. It is to be noted that since a method for supporting the housing 22 of the mini-environment unit 20 is different from that for supporting the loader housing, in order to prevent vibration from the floor from being transmitted to the loader housing 40 and the main housing 30 via the mini-environment unit 20, a cushion member for vibration isolation should be arranged between the housing 22 and the loader housing 40 such that it may surround circumferences of the access ports to be air-tight.

Figure 5A:
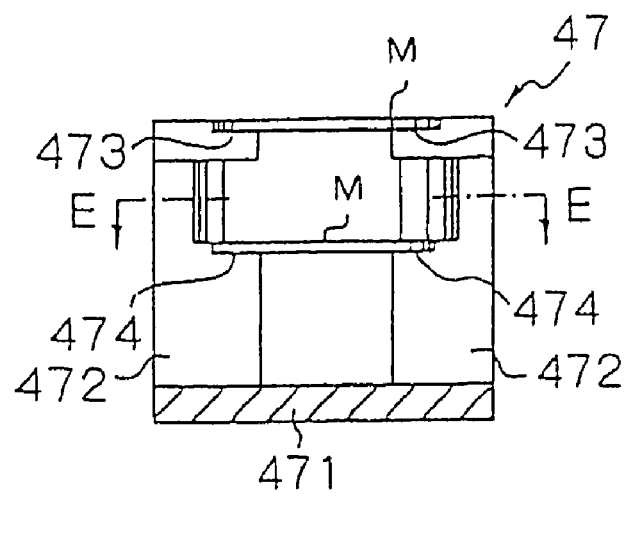
FIG. 5A is an enlarged side view of a mask rack.
Figure 5B:
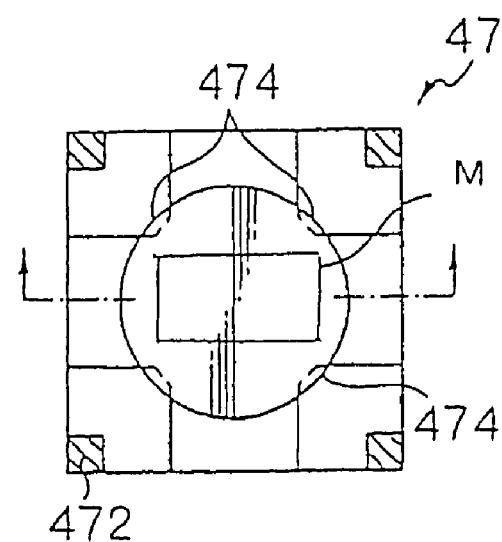
FIG. 5B is a sectional view taken along E—E line of FIG. 5A.

In the first loading chamber 41, a mask rack 47 is arranged, which holds a plurality (two in this embodiment) of masks M in a horizontal state to be spaced from each other in the up and down direction. The mask rack 47, as shown in FIGS. 5A and 5B, comprises four support struts 472 fixed in an upright state to a rectangular base board 471 at its four corners as spaced from each other, with each one of the support struts defining double steps of supporting sections 473 and 474, wherein mask M is supported by the support struts 472 with its peripheral edge carried on the supporting sections. Thus constructed mask rack 47 allows a first or a second transport unit, which will be described later, to extend a tip of an arm thereof through a space between adjacent supporting struts so as to approach and grip the mask by its arm.

The loading chambers 41 and 42 are adapted to have an atmosphere controlled to be in a high vacuum condition (in a range of $10^{-5}$ to $10^{-6}$ Pa as a vacuum level) by aid of a well-known vacuum exhausting device (not shown) including a vacuum pump, though not shown. In that case, the first loading chamber 41 may be held in a lower vacuum atmosphere as a low vacuum chamber, while the second loading chamber 42 may be held in a higher vacuum atmosphere as a high vacuum chamber, thereby providing an effective way to prevent contamination of the mask. Employing such a configuration can help transfer a subsequent mask, that is accommodated in the loading chamber and is going to be subjected to a defect inspection, into the working chamber without delay. Employing such loading chambers may help improve throughput of the defect inspection by associatively working with an electron beam system, which will be described later, and further help maintain a vacuum level in surroundings of the electron beam source, which is required to be held in a high vacuum condition, at as high a vacuum condition as possible.

The first and the second loading chambers 41 and 42 are connected with a vacuum exhausting pipe and a vent pipe for an inactive gas (e.g., purified dry nitrogen), respectively (both not shown). With this arrangement, an atmospheric condition in each loading chamber can be achieved by this inactive gas vent (the inactive gas is injected to prevent an oxygen gas and the like, other than the inactive gas, from adhering to a surface). A device that can provide such an inactive gas vent may have a well-known configuration, and a detailed description thereof will be omitted.

It is to be noted that in an inspection apparatus using an electron beam according to the present invention, it is important that a substance represented by lanthanum hexaboride ($LaB_6$) that can be used as an electron beam source of an electronic optical system, which will be described later, should not be brought into contact with oxygen or the like as much as possible after once having been heated up to such a high temperature where a thermal electron has been emitted therefrom in order not to reduce a lifetime thereof, and this can be ensured by applying the atmosphere control as described above to the working chamber in which the electronic optical system is installed, in a step prior to a transfer operation of the mask thereinto.

Sample Table

A stage device or the sample table 50 comprises: a stationary table 51 located on the bottom wall 321 of the main housing 30; a Y table 52 operatively mounted on the stationary table to be capable of moving in the Y direction (a direction orthogonal to the sheet surface in FIG. 1); an X table 53 operatively mounted on the Y table to be capable of moving in the X direction (left and right directions in FIG. 1); a turntable 54 capable of rotating on the X table; and a holder 55 located on the turntable 54. A mask M is releasably loaded on a mask loading surface 551 of the holder 55. The holder may have a known structure allowing for the mask to be releasably gripped in a mechanical manner or by an electrostatic chuck system. The sample table 50 is adapted to provide a highly precise alignment of the mask held in the holder on the loading surface 551 with respect to an electron beam irradiated from the electronic optical system in the X direction, Y direction and Z direction (i.e., the up and down direction in FIG. 1) as well as a rotational direction around an axial line orthogonal to a supporting surface of the mask (i.e., the $\theta$ direction), by actuating a plurality of tables described above using a servo motor, an encoder and a variety of sensors (not shown). It is to be noted positioning in the Z direction may be achieved by, for example, making a position of a loading surface on the holder to be fine-tunable. In these operations, a reference position of the loading surface is detected by a position measuring device employing a laser of very fine diameter (laser interference range finder using a principle of interferometer) and the position is controlled by a feedback circuit, though not shown, and in association with or instead of the above control, a position of a contour of the mask is measured to detect a position within a plane and a rotational position of the mask with respect to the electron beam, and the turntable is rotated by, for example, a stepping motor capable of fine angle controlling so as to control the position of the mask. In order to prevent or minimize, if any, a production of dust within the working chamber, servo motors 521 and 531 and encoders 522 and 532 for the sample table are disposed external to the main housing 30. It is to be noted that the sample table 50 may be of known structure used in, for example, a stepper, and a detailed description on its structure and operation will be herein omitted. Also, the laser interference range finder may be of known structure, and a detailed description of its structure and operation will be omitted.

A reference can be set for a signal obtained by inputting in advance the rotational position and/or the position in the X- and Y-directions of the mask, with respect to the electron beam, to a signal detecting system or an image processing system, both of which will be described later. Further, a mask chuck mechanism disposed in this holder is configured such that a voltage required to chuck the mask may be applied to an electrode of an electrostatic chuck, in which the mask is pushed at three points along its periphery (preferably, equally spaced along its circumference) for its positioning. The mask chuck mechanism comprises two stationary positioning pins and one press-type crank pin. The crank pin is designed to achieve an automatic chuck and automatic release, and also to define a conducting point of voltage application.

It is to be noted that in this illustrated embodiment, the table moving in the left and right direction in FIG. 2 has been designated as the X table and the table moving in the up and down direction has been designated as the Y table in FIG. 2, and without any trouble, the table moving in the left and right direction may be designated as a Y table and the table moving in the up and down direction may be designated as an X table.

loader

The loader 60 comprises a first transport unit 61 of a robot system located within the housing 22 of the mini-environment unit 20, and a second transport unit 63 of a robot system located within the second loading chamber 42.

The first transport unit 61 has a multi-joint arm 612 capable of rotating around an axial line $O_1$—$O_1$ with respect to a driving section 611. The multi-joint arm may employ any arbitrary structure, and in this embodiment, it includes three parts operatively joined so as to be movable rotationally with respect to each other. A first part of the arm 612 of the first transport unit 61, which is one of the three parts located in a closest position to the driving section 611, is attached to a shaft 613 which may be driven to rotate by a driving mechanism of known structure (not shown) arranged in the driving section 611. The arm 612 can rotate around the axial line $O_1$—$O_1$ with aid of the shaft 613, while it can be extended or contracted in a radial direction with respect to the axial line $O_1$—$O_1$ as a whole unit by a relative rotation among the parts. A tip portion of a third part of the arm 612, which is one of those parts located in a farthest position from the shaft 613, is provided with a gripping device 616 for gripping the mask, which is implemented by a mechanical, electrostatic or other type chuck of known structure. The driving section 611 is allowed to move in the up and down direction by an elevating mechanism 615 of known structure.

In this first transport unit 61, the arm 612 is extended toward either one of directions for M1 and for M2 between two cassettes c held in the cassette holder, and one mask accommodated in the cassette c is placed onto the arm or gripped by the chuck (not shown) attached to the tip portion of the arm, so as to be removed from the cassette. After that, the arm is contracted (into the state shown in FIG. 2), and then is rotated and stopped at a position from which it can be extended toward direction M3 of the pre-aligner 25. As it is, the arm is again extended so as to place the mask held by the arm onto the pre-aligner 25. The arm, after having received the mask from the pre-aligner through a course inverse to that described above, is further rotated and stopped at a position (M4 orientation) in which the arm is allowed to be extended toward the second loading chamber 41, where it is extended so as to hand over the mask to a mask receiver 47 within the second loading chamber 41. It is to be noted that in case of gripping the mask mechanically, a circumferential edge region (a range within about 5 mm from the circumferential edge) of the mask should be gripped. This is because the mask is entirely patterned (circuit wiring is formed) only excluding the circumferential edge region, and gripping of the mask in that patterned region could cause a breakage or defective part of this pattern.

Since the second transport unit 63 has basically the same structure as the first transport unit, only excluding that a transfer operation of the mask is performed between the mask rack 47 and the loading surface of the sample table, a detailed description will be omitted.

In the loader 60, the first and the second transport units 61 and 63 perform a transfer operation of the mask, as it is held in a horizontal state, from the cassette held by the cassette holder onto the sample table 50 located within the working chamber 31 and vice versa, wherein up and down motions of the arms of the transport units are limited only to steps where the mask is removed from and inserted into the cassette, where the mask is placed on and removed from the mask rack, and where the mask is placed on and removed from the sample table. Therefore, even transfer of such a large mask having a 30 cm diameter, for example, can be performed smoothly.

Transfer Operation of the Mask

Transfer operations of the mask from the cassette c, carried by the cassette holder, onto the sample table 50 located in the working chamber 31 will now be described sequentially.

As for the cassette holder 10, a suitable structure may be selectively employed therefor, as already set forth, depending on particular cases including one for manual setting of the cassette and another for automatic setting of the cassette. In this embodiment, once the cassette c is set on the elevating table 11 of the cassette holder 10, the elevating table 11 is lowered by the elevating mechanism 12 and the cassette c is aligned with the access port 225.

When the cassette is aligned with the access port 225, the cover (not shown) arranged in the cassette is opened, and at the same time, a cylindrical cover is disposed between the cassette c and the access port 225 of the mini-environment unit so as to block an interior of the cassette and a space inside of the mini-environment unit from an external environment. Since known structures may be used for the cover, a detailed description of these structures and operations will be omitted. It is to be noted that in the case where the shutter system for opening and closing the access port 225 is arranged on the mini-environment unit 20 side, that shutter system should be actuated to open the access port 225.

On one hand, the arm 612 of the transport unit 61 has been stopped as it is oriented to either of direction M1 or M2 (the direction of M1, in this illustration), wherein when the access port 225 is opened, the arm is extended to receive one of the masks accommodated in the cassette by its tip portion. It is to be noted that a positional adjustment between the arm and the mask to be removed from the cassette has been executed by the up and down motions of the driving section 611 and the arm 612 of the first transport unit 61 in this embodiment, and without any trouble, it may be executed by the up and down motions of the elevating table of the cassette holder or by both of them.

Once a receiving operation of the mask by the arm 612 is completed, the arm is contracted and the shutter system is actuated to close the access port (with the shutter system installed therein), and then the arm 612 is rotated around the axial line $O_1$—$O_1$ and is ready to be extended toward the direction M3. As it is, the arm is extended and places the mask loaded on its tip portion, or gripped by the chuck, onto the pre-aligner 25, which in turn determines an orientation of a rotational direction (i.e., a direction around the central axis line orthogonal to the mask plane) of the mask to be set within a specified range. Once this aligning operation has been completed, the transport unit 61, after having received the mask from the pre-aligner 25 onto the tip portion of the arm, contracts its arm and takes a posture ready to extend the arm toward the direction M4. Then, the door 272 of the shutter system 27 is moved to open the access ports 226 and 436, so that the arm 612 is extended and loads the mask into the upper step side or the lower step side of the mask rack 47 within the first loading chamber 41. It is to be noted that as described above, before the shutter system 27 goes into an open position to allow the mask to be transferred to the mask rack 47, the opening 435 defined in the partition wall 434 is closed to be airtight by the door 461 of the shutter system 46.

In the course of a transfer operation of the mask by the first transport unit, as described above, a clean air flows down in a laminar flow (as the down flow) from the gas supply unit 231 arranged in the upper side of the housing of the mini-environment unit so as to prevent dust from adhering to a top surface of the mask during its transfer operation. A portion of the air surrounding the transport unit (in this embodiment, about 20% of the air supplied from the supply unit, mainly a contaminated air) is sucked through the suction duct 241 and exhausted to the outside of the housing. A remaining portion of the air is recovered via the recovery duct 232 disposed in the bottom of the housing and returned back to the gas supply unit 231.

Once the mask has been loaded in the mask rack 47 within the first loading chamber 41 of the loader housing 40 by the first transport unit 61, the shutter system 27 is actuated into the closed position to enclose the loading chamber 41. As it is, the first loading chamber 41 is filled with an inactive gas to purge the air, and after that the inactive gas is also exhausted to bring the interior of the loading chamber 41 into the vacuum atmosphere. The vacuum atmosphere of the first loading chamber may be set at a low vacuum level. Once a certain degree of vacuum has been obtained in the vacuum chamber 41, the shutter system 46 is actuated to open the access port 434, which has been closed to be airtight by the door 461, and the arm 632 of the second transport unit 63 is extended and receives one mask from the mask receiver 47 using the gripping device located in the tip portion thereof (with the mask loaded on the tip portion or gripped by the chuck attached to the tip portion). After this receiving operation of the mask has been completed, the arm is contracted, and the shutter system 47 is again actuated to close the access port 435 by the door 461. It is to be noted that before the shutter system 46 is actuated to open the door 461, the arm 632 takes a posture ready to extend toward the direction N1 of the mask rack 47. Further, as set forth before, prior to the opening operation of the shutter system 46, the access ports 437 and 325 have been closed by the door 452 of the shutter system 45 to block communication between the interior of the second loading chamber 42 and the interior of the working chamber 31 in an airtight condition, and the second loading chamber 42 is vacuum evacuated.

When the shutter system 46 has closed the access port 435, the second loading chamber is again vacuum evacuated and ultimately brought into a vacuum at a higher vacuum level than that in the first loading chamber. During this period, the arm of the second transport unit 63 is rotated to a position in which it is allowed to extend toward the sample table 50 of the working chamber 31. On one hand, in the sample table within the working chamber 31, the Y table 52 is moved in the upward direction in FIG. 2 until centerline $X_0$—$X_0$ of the X table 53 comes into alignment with X-axis line $X_1$—$X_1$ crossing rotational axial line $O_2$—$O_2$ of the second transport unit 63, while at the same time the X table 53 is moved to a position closest to a leftmost position in FIG. 2 and stands by in this state. When the second loading chamber has been brought into the approximately same level of vacuum condition as the working chamber, the door 452 of the shutter system 45 is actuated to open the access ports 437, 325, and the arm is extended so that the tip portion of the arm holding the mask comes near to the sample table of the working chamber 31. Then, the mask is loaded on the loading surface 551 of the sample table 50. When this loading operation of the mask has been completed, the arm is contracted, and the shutter system 45 closes the access ports 437 and 325.

In the above description, the steps of operation to be performed until the mask in the cassette c is successfully transferred onto the sample table has been explained, and in order to return a mask that has been loaded onto the sample table and finished with a process back into the cassette c, the above-described steps should be performed in an inverse sequence for a returning operation. Further, in order to keep a plurality of masks carried in the mask rack 47, during a mask transfer operation between the mask rack and the sample table by the second transport unit, this transfer operation of the masks may be performed between the cassette and the mask rack by the first transport unit, thereby allowing an inspection process to be performed more efficiently.

Specifically, if the mask rack 47 of the second transport unit contains both an already-processed mask "A" and unprocessed mask "B", (1) at first, the unprocessed mask B is transferred to the sample table 50, and processing is started; and (2) during this processing, the processed mask A is transferred from the sample table 50 to the mask rack 47 by the arm, and unprocessed mask C is picked up from the mask rack similarly by the arm, properly aligned by the pre-aligner and then transferred to the mask rack 47 of the loading chamber 41.

Through this operation, during processing of the mask B, the already-processed mask A can be replaced with the unprocessed mask C in the mask rack 47.

Further, depending on application of such an apparatus for providing an inspection and/or an evaluation, a plurality of sample tables 50 may be arranged in parallel, in which a mask is transferred from a single mask rack 47 to each one of the tables, thereby enabling a plurality of masks to be similarly processed in parallel.

Figure 6:
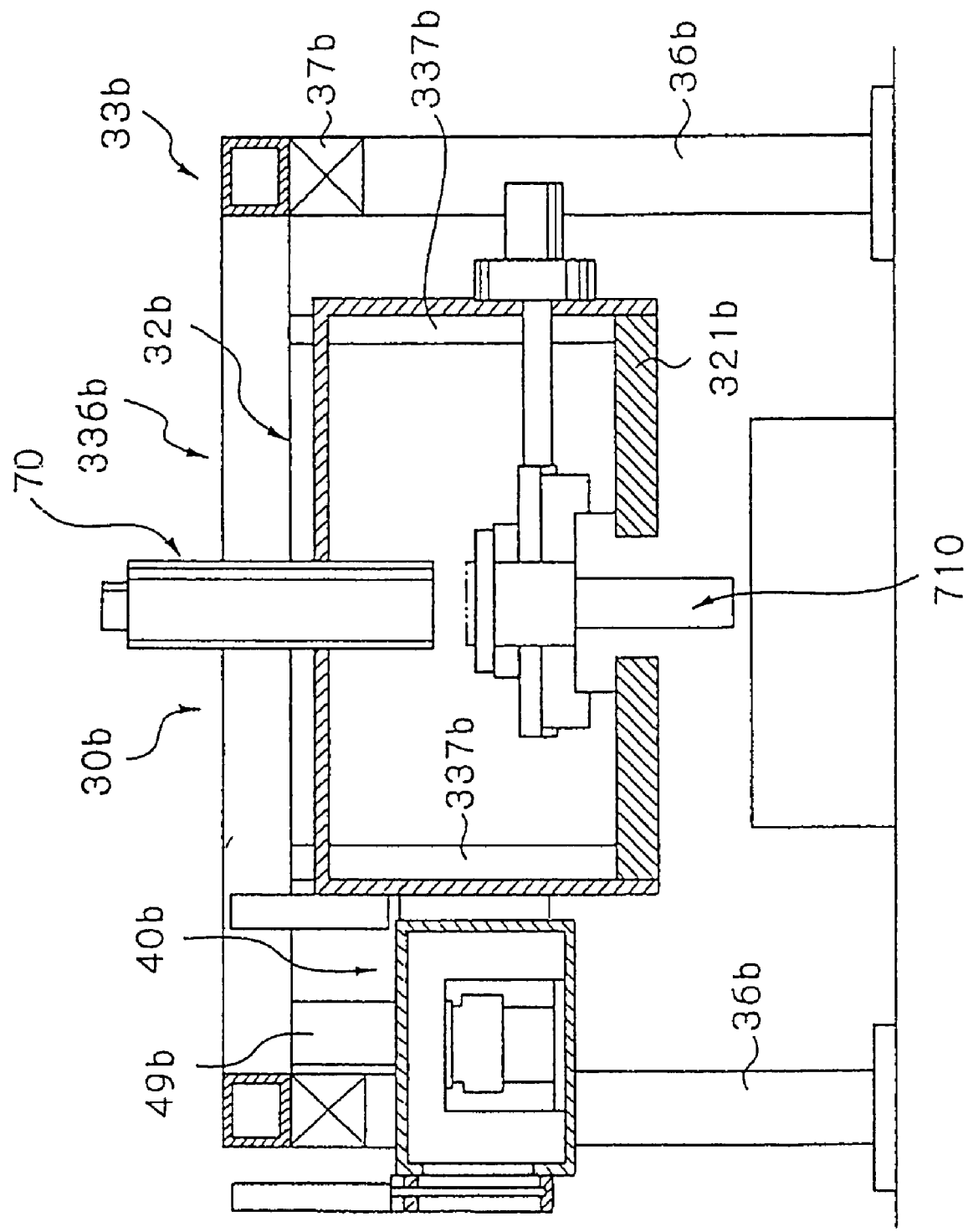
FIG. 6 shows a variation of a method for supporting a main housing.

FIG. 6 shows a variation 30b of a method for supporting a main housing. In the variation illustrated in FIG. 6, a housing main body 32b and a loader housing 40b are suspended from a frame structure 336b of a housing supporting device 33b so as to be supported thereby. Bottom ends of a plurality of vertical frames 337b secured to the frame structure 336b are fixed to four corners of a bottom wall 321b of the housing main body 32b, respectively, so as to support circumferential walls and a top wall by that bottom wall. In addition, a vibration isolation device 37b is disposed between the frame structure 336b and a table frame 36b. Further, the loader housing 40b is also suspended by a suspender member 49b fixed to the frame structure 336b. In the variation of the housing body 32b illustrated in FIG. 6, since components are supported in a suspended manner, a center of gravity of an entire unit including this main housing and many different devices provided therein can be kept low. In the supporting systems for the main housing and the loader housing including the variation, each system is designed to prevent vibration from a floor from being transmitted to the main housing and the loader housing.

According to another variation, though not shown, only the housing main body of the main housing is supported from an under side by the housing supporting device, but the loader housing may be mounted on the floor in the same manner as that used for the mini-environment unit. Further, according to still another variation, though not shown, only the housing main body of the main housing is suspended from the frame structure to be supported thereby, but the loader housing may be mounted on the floor in the same manner as that used for the mini-environment unit.

According to the above embodiments, the following effects could be expected.

(a) An entire configuration of an inspection apparatus for an image projecting method using an electron beam can be obtained, in which a subject to be inspected can be processed with a high throughput.

(b) Since flow of clean air is supplied over the subject to be inspected within the space of the mini-environment unit to prevent dust adhesion, and also since a sensor is provided therein for observing cleanliness of the space, inspection of the subject can be performed while monitoring dust in the space.

(c) Since the loading chamber and the working chamber are supported collectively via the vibration isolation device, supply of the subject onto the sample table and inspection thereof can be performed without any effects from an external environment.

Electron Beam System

Figure 7:
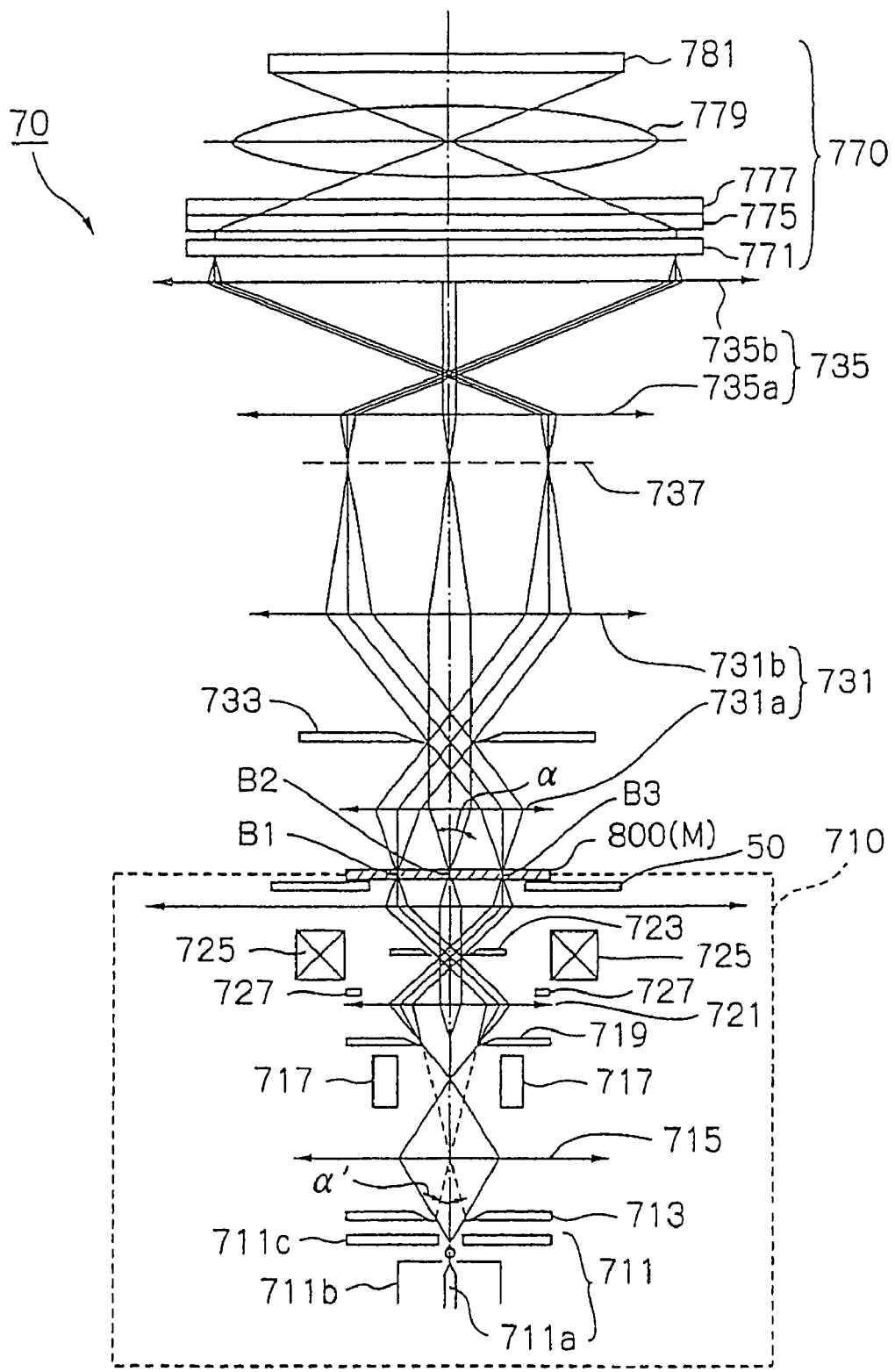
FIG. 7 is a schematic view illustrating a general configuration of an electron beam system (i.e., an electronic optical system) according to the present embodiment.

A detailed embodiment of the electron beam system 70 (see FIGS. 1 and 6) disposed in the main housing 30 or 30b is shown in FIG. 7. Referring to FIG. 7, an irradiating optical system 710 equipped with an electron gun 711 for irradiating a mask M, such as a stencil mask 800, prepared as a sample is arranged in a lower side, and above this irradiating optical system 710 is located the stencil mask 800 loaded on the sample table 50, above which a detector 770 for detecting an electron beam passed through this stencil mask is located. An embodiment, which will be described below, represents an embodiment in which the electron beam is irradiated upward from the electron gun 711 located in the lower portion. It is a matter of course that an alternative embodiment, in which the electron gun is arranged in an upper location and the electron beam is irradiated downward, may also be employed.

As an electron gun is used a thermionic emission type of electron gun 711 which is activated to emit electrons by heating an electron emission material (cathode) 711a. Lanthanum hexaboride ($LaB_6$) is employed as the electron emission material (emitter) serving as the cathode. Any other materials may be used so long as they have a high fusion point (a low vapor pressure at high temperature) as well as a small work function. In this illustrated embodiment, the electron gun 711 comprises a single-crystal $LaB_6$ cathode 711a having a tip of such a small radius of curvature as 15 µmR, which is operative under a space-charge-limited condition, thereby allowing an electron beam having a higher intensity and a lower shot noise to be emitted.

Further, by setting a distance between Wehnelt 711b and an anode 711c to be at least equal to 8 mm, and additionally determining a condition of an electron gun current to achieve a high brightness, the brightness can reach a value greater than Langmuir limit.

In this context, preferably the electron gun 711 in this embodiment comprises the thermionic emission cathode 711a and is operable under the space-charge-limited condition. Alternatively, such an electron gun 711 with a small electron source image having an FE (Field Emitter), a TFE (Thermal Field Emitter) or a Schottky cathode may be used as the electron gun 711. It is to be noted that the "space-charge-limited condition" refers to such a condition that a cathode temperature is increased to be higher than a certain temperature where an emission amount of the electron beam is less susceptible to an effect from the cathode temperature.

A first shaping aperture 713 and a first electron lens 715 are disposed along a direction of irradiation of the electron gun 711 (in the upward direction in FIG. 7). The first electron lens 715 focuses an image of the electron beam that has passed through the first shaping aperture 713 onto a second shaping aperture 719 (which will be described later). A first deflector 717 is arranged at a location above the first electron lens 715 so as to surround an irradiation path of the electron beam. In addition, above the first deflector 717, the second shaping aperture 719, a first condenser lens 721 and a third shaping aperture 723 are disposed in this order, and also a second deflector 725 is arranged surrounding the third shaping aperture 723.

The electron beam emitted from the electron gun 711 forms a variable shaped beam that has been configured into a desired shape by passing through the first shaping aperture 713 and the second shaping aperture 719, which in turn irradiates an area at a certain moment in a region to be inspected on the stencil mask 800. To explain this more specifically, the electron beam that has passed through the first shaping aperture 713 is deflected by the deflector 717, thereby changing an irradiating position to the second shaping aperture 719, thus enabling the electron beam to be formed into the desired shape. Specifically, it is preferable to allow an elongated rectangular shape of an electron beam having a predetermined area to be formed. However, a square shape of the electron beam may also be formed.

Thus in the present embodiment, an irradiation area can be adjusted by tuning the first deflector 717, and alternatively the first and second shaping apertures 713 and 719 may be substituted with a plurality of apertures of different sizes so as to adjust the irradiation area mechanically.

It is to be noted that the Koehler illumination system has been employed in the drawing as a system for illuminating the mask, and without any trouble, a critical illumination system may also be employed therefor.

As described above, preferably the irradiating optical system 710 of the present embodiment comprises at least one shaping aperture 713, 719 and is designed such that an image of the shaping aperture is formed on a surface of the stencil mask 800. Further, it is also preferable that a plurality of such shaping apertures 713, 719 is provided in the vicinity of an optical axis 801, wherein the area of irradiation on the stencil mask 800 prepared as the sample is made variable by changing an overlap of these shaping apertures 713, 719.

The above-described third shaping aperture 723 serves for improving a collimation of the electron beam illuminating the stencil mask 800, and accordingly, a crossover image formed by the electron gun 711 is focused on this third shaping aperture 723. The second deflector 725 serving as a scanning means is a deflector required in such a situation where a main field of view is virtually divided, an illumination area is scanned in a step-and-repeat manner or continuously, and an image field curvature aberration and an astigmatism of the optical system after transmission through the stencil mask 800 should be compensated for in response to a position of scanning. To explain this point in more detail, the second deflector 725 scans a position of the electron beam on the mask in the step-and-repeat manner or continuously. For example, a primary electron beam is controlled to make a scanning motion in the +X direction and −X direction by the second deflector 725. In this case, the sample table 50 carrying the mask 800 is displaced in the +Y direction and −Y direction. By way of this, the mask 800 can be scanned entirely. In order to compensate for a field curvature aberration and astigmatism, a condition of a voltage to be applied to doublet lens 731 (electron lenses 731a, 731 b located downstream of the mask 800) should be changed in response to a position of the electron beam. For example, in order to compensate for the field curvature aberration, when the electron beam is on the optical axis, the voltage to be applied to the lens is increased to make a focal length shorter, and when the electron beam is away from the optical axis, the voltage to be applied to the lens is decreased to make the focal length longer.

The second deflector 725, even if it is not used for applying above compensation, still can be used to scan across the surface of the stencil mask 800 and obtain its SEM image, thus performing registration. For providing such a registration, preferably the detector 727 is provided on the electron gun 711 side of the stencil mask 800, so that secondary electrons which are emanated by impingement of the electron beam (in other words, a primary electron beam) against the stencil mask 800, or back-scattered electrons which are reflected therefrom, can be detected by the detector 727.

It is to be noted that, alternatively, a crossover image of small diameter may be formed on the sample surface of the stencil mask 800 so as to scan it by changing a focal length of either one of the different lenses (715, 721). Still in another alternative way, an overlapped area of the first and the second shaping apertures (713, 719) may be reduced to form an electron beam having a smaller diameter, and a thus formed electron beam may be used to perform scanning as well as registration.

Preferably, the irradiation area of the electron beam irradiating the stencil mask 800 of the sample after having passed through the above described shaping apertures 713 and 719 may be formed in an elongated rectangular shape having long sides and short sides. Herein, the second deflector 725 is involved in displacing the irradiation area in a direction of the long sides, and the sample table 50 is moved in a direction of the short sides to thereby perform a serial displacement of the irradiation area in the direction of short sides. Since inspection is performed while moving the sample table continuously, the inspection can be achieved with high throughput even with a narrow field of view.

The electron beam irradiating the stencil mask 800 (its main beams are represented by B1, B2 and B3 in the drawing) may be controlled to perform a scanning operation in the step-by-step manner or continuously.

The first doublet lens 731 is disposed at a location above, or in other words downstream of the stencil mask 800, wherein the first doublet lens 731 comprises two electron lenses 731a and 731b. An NA aperture 733 is disposed between two lenses of the first doublet lens 731. A second doublet lens 735 is disposed above the first doublet lens 731, and further the detector 770 is disposed downstream of the second doublet lens 735.

The second doublet lens 735 consists of two electron lenses 735a and 735b.

The electron beam having passed through the stencil mask 800 expands at an angle (clarified as code a in the drawing) corresponding to an angular aperture α' of the irradiation and enters the first doublet lens 731. At that time, electrons scattered at a side face of the stencil mask 800 are removed by the NA aperture 733. Further, for inspection of a mask having a pattern formed on a thin membrane, such as an X-ray mask, there is an effect inherent to this NA aperture that can remove an electron beam that has been scattered at a large angle on the membrane. After having passed through the first doublet lens 731, a transmission image of the stencil mask is formed. An area where this transmission image is formed is represented as a transmission image forming area 737. This formed transmission image is further magnified by the second doublet lens 735 and irradiated onto the detector 770.

The detector 770 comprises an MCP (Multi-Channel Plate) 771 and an FOP (Fiber Optical Plate) 775 as an irradiation lens system. The MCP 771 is followed by the FOP 775 along a direction of irradiation of the electron beam (in the upward direction in FIG. 7). The detector 770 further comprises a vacuum window 777 as the irradiation lens system, an optical lens 779 as a relay optical system and a TDI detector 781 as a detection sensor having a plurality of pixels. The transmission image of the stencil mask magnified by the second doublet lens 735 is irradiated to the MCP 771 as magnified by about 1,000 times, and accordingly, this magnified image by about 1,000 times is formed on the MCP 771. This magnified image is multiplied at the MCP 771, and the electron beam forming the image thus multiplied by the MCP 771 is converted into an image of light by a scintillator applied on a sample side surface of the FOP 775. This image is removed from the atmosphere through the vacuum window 777, reduced in scale by an optical lens 779 and formed into an image on the TDI detector 781. It is to be noted that in the form employing the optical lens 779, the FOP may not necessarily be used.

According to the above-described configuration, the present optical system, in which the irradiation beam and the transmission beam do not follow a common optical path, can improve significantly a blur of the transmission beam caused by a space charge effect, as compared to a system in which a primary electron beam is emitted above from a diagonal direction and then deflected by using an E×B separator so as to normally enter the sample, and a secondary electron beam follows an optical path common with an incident optical path of the primary electron beam. Since electrons that have passed through the stencil mask contributes nearly 100% to image forming, a signal having a good S/N ratio can be obtained.

The electron beam system according to the present embodiment can be used to detect a defect in the stencil mask 800 or the sample based on electrons detected by the detector 770.

As described above, in the present embodiment, the electron beam that has passed through the sample is magnified by the electron lens (the doublet lens 731, 735), which is in turn detected by the detector 770 having a plurality of pixels to thereby form the image of the sample. Further, the present embodiment is characterized in that the electron beam irradiating the detector 770 has a good collimation, in which as a specific configuration to achieve this good property, the NA aperture 733 is disposed between the two lenses of the first doublet lens 731 at a location where principle rays B1, B2 and B3 are crossed with one another. Then, the electron beam having passed through this NA aperture 733 is irradiated onto the detector 770.

A preferred embodiment with the NA aperture 733 arranged therein is specified in a form having two stages of doublet lens 731 and 735, and a single shaping aperture (the second shaping aperture 719), wherein main electron beams (B1, B2, B3) exiting from the shaping aperture are irradiated in parallel against the sample (the stencil mask 800). Further, the irradiating optical system 710 has an entrance pupil for the MCP 771 and the vacuum window 775 as the irradiation lens system in the entrance pupil 723, and an electron source image is formed in this entrance pupil 723.

In a preferred embodiment of the present invention, a magnification of the doublet lenses 731 and 735 may be made variable in response to a size of the irradiation area of the electron beam. A specific configuration for making the magnification variable can be implemented in such forms that the doublet lens is exchanged, that in a set of doublet lens, a distance between a front lens and a rear lens is adjusted, or that a distance between a first doublet lens and a second doublet lens is adjusted.

As a detection sensor in the detector 770, a CCD detector (a CCD sensor) may be used, and it is also possible that the size of the image to be created by the scintillator is adjusted by the optical lens 779 and then this adjusted image is formed on a CCD plane in the CCD detector. Advantageously, using the CCD detector enables manufacturing at a low cost.

A preferred configuration of the electron beam system in the present invention will now be described below.

(1) The electron gun 711 is disposed below the sample, while the detector 770 is disposed above the sample.

(2) A plurality of magnifying lenses for magnifying the electron beam is arranged between the electron gun 711 and the detector 770. In the above embodiment, two sets of doublets lens (731, 735) are arranged. Herein, a doublet lens should be used as the lens for magnifying the electron beam having passed through the sample at first. In the above embodiment, the first doublet lens 731 serves as this lens. Because of this arrangement, a transverse chromatic aberration and distortion are compensated for, thereby allowing an image with a reduced blur and distortion to be obtained.

(3) In the detector 770, the MCP 771 and the scintillator formed on the sample side of the FOP 775 are disposed in a vacuum, and behind them, the vacuum window 777, the optical lens 779 as the relay optical system, and the detection sensor (the CCD detector, the TDI detector 781) are arranged in this sequence.

(4) In the detector 770, the relay optical system and the CCD detector, or the relay optical system and the TDI detector are disposed in a vacuum. Further, in the embodiment of the present invention, the entire unit of the electron beam system or the entire unit of the detector 770 may be disposed in a vacuum.

(5) As the detection sensor in the detector 770, the EB-CCD detector or the EB-TDI detector may be employed.

(6) In the electron beam system, since signals are received from a plurality of pixels simultaneously, even if each pixel is controlled to actuate at 100 KHz, an equivalent frequency of the system is greater than 200 MHz as a result of simultaneous reception of the signals from 2000 pixels.

(7) In the one electron beam system, a plurality of irradiation optical systems 700 and a plurality of detectors 770 are provided, with each irradiation system being in association with each detector, so as to detect defects in a sample.

Variation of the Inspection Apparatus

Figure 8:
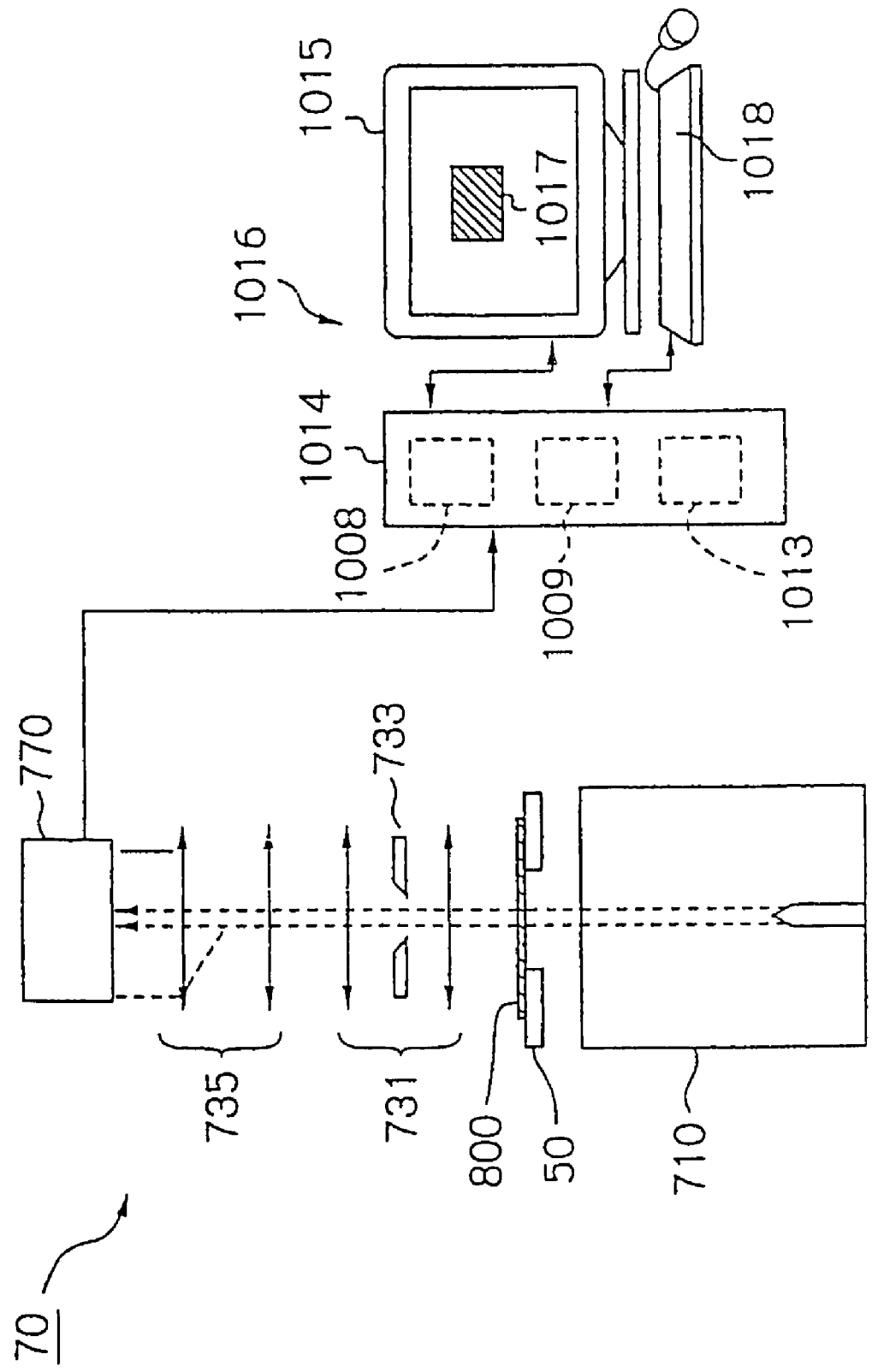
FIG. 8 is a schematic diagram of a defect inspection apparatus according to a variation of the first invention.

FIG. 8 shows a general configuration of a defect inspection apparatus according to a variation of the present invention.

This defect inspection apparatus represents an inspection apparatus using the electron beam system 70 described above (FIG. 7). This inspection apparatus consists of a control section 1016 shown on a right hand side in FIG. 8, and the electron beam system 70 shown on the left hand side in FIG. 8. Similarly to FIG. 7, the electron beam system comprises an irradiation optical system 710 including an electron gun 711 for emitting an electron beam disposed in a lower portion, above which a stencil mask 800 and a sample table 50 for carrying the mask are disposed. The system further comprises doublet lenses 731 and 735 as a magnifying lens for magnifying an emitted electron beam, and also a detector 770 disposed at a top-most location. Herein, this detector 770 is connected to the control section 1016 which controls the system in its entirety, and also executes a process for detecting any defects in the stencil mask 800 based on an electron image detected by the detector 770.

Figure 9:
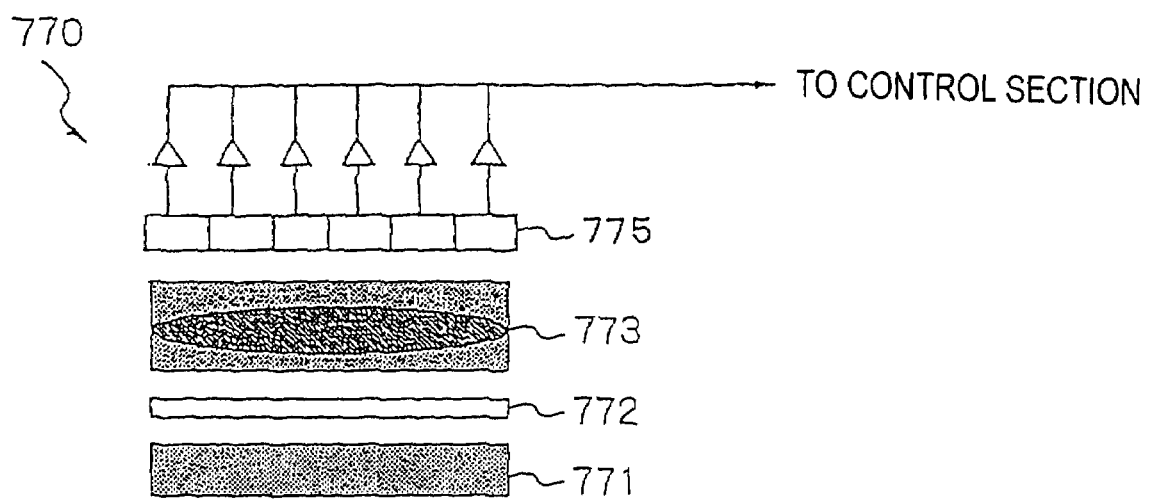
FIG. 9 shows a specific configuration of a detector of the defect inspection apparatus of FIG. 8.

The detector 770 may have any arbitrary configuration so long as it can convert a formed electron image into a signal that can be processed in a subsequent step. For example, as shown in detail in FIG. 9, the detector 770 may consist of a scintillator screen 772, a relay optical system 773, and an image sensor 775 composed of a plurality of CCD elements. The scintillator screen 772 emits light by electrons and thus converts the electrons to light. The relay lens 773 guides this light to the CCD image sensor 775, where the CCD image sensor 775 converts an intensity distribution of electrons on a surface of the stencil mask 800 into an electric signal or digital image data for each element, which is in turn output to the control section 1016.

The control section 1016 may comprise a general purpose personal computer or the like, as shown in FIG. 8 by way of example. This computer comprises a control section main part 1014 for executing a variety of control and arithmetic operations according to a specified program, a CRT 1015 for indicating a result of an operation of the main part 1014, and an input section 1018, such as a key board or a mouse, for an operator to input a command, while without any trouble, the control section 1016 may be composed of hardware dedicated for a defect inspection apparatus or a work station.

The control section main part 1014 may consist of a CPU, a RAM, a ROM, a hard disk, a variety of substrates such as a video substrate and the like. An electronic image storage area 1008 for storing electric signals received from the detector 770, or a digital image data of the electron image that has passed through the stencil mask 800, is allocated on a memory such as the RAM or the hard disk. Further, the hard disk includes a reference image storage section 1013 for storing in advance a reference image data of a normal sample (stencil mask) having no defect. Yet further, on the hard disk, in addition to the control program for controlling the entire defect inspection apparatus, there is stored a defect detection program 1009, which reads out electron image data from the storage area 1008, and based on the image data, automatically detects a defect in the stencil mask 800 according to a specified algorithm. This defect inspection program 1009, as will be described in detail later, has a function for executing a matching operation between a reference image read out of the reference image storage section 1013 and an actually detected electron beam image so as to automatically detect a defective area, wherein if it is determined that a defect is existing, then a warning display is indicated for an operator. In this step, the electron image 1017 may be displayed on a display section of the CRT 1015.

Then, operation of the defect inspection apparatus according to the above embodiment will now be described by taking a flow chart shown in FIGS. 10 to 12 as an example.

Figure 10:
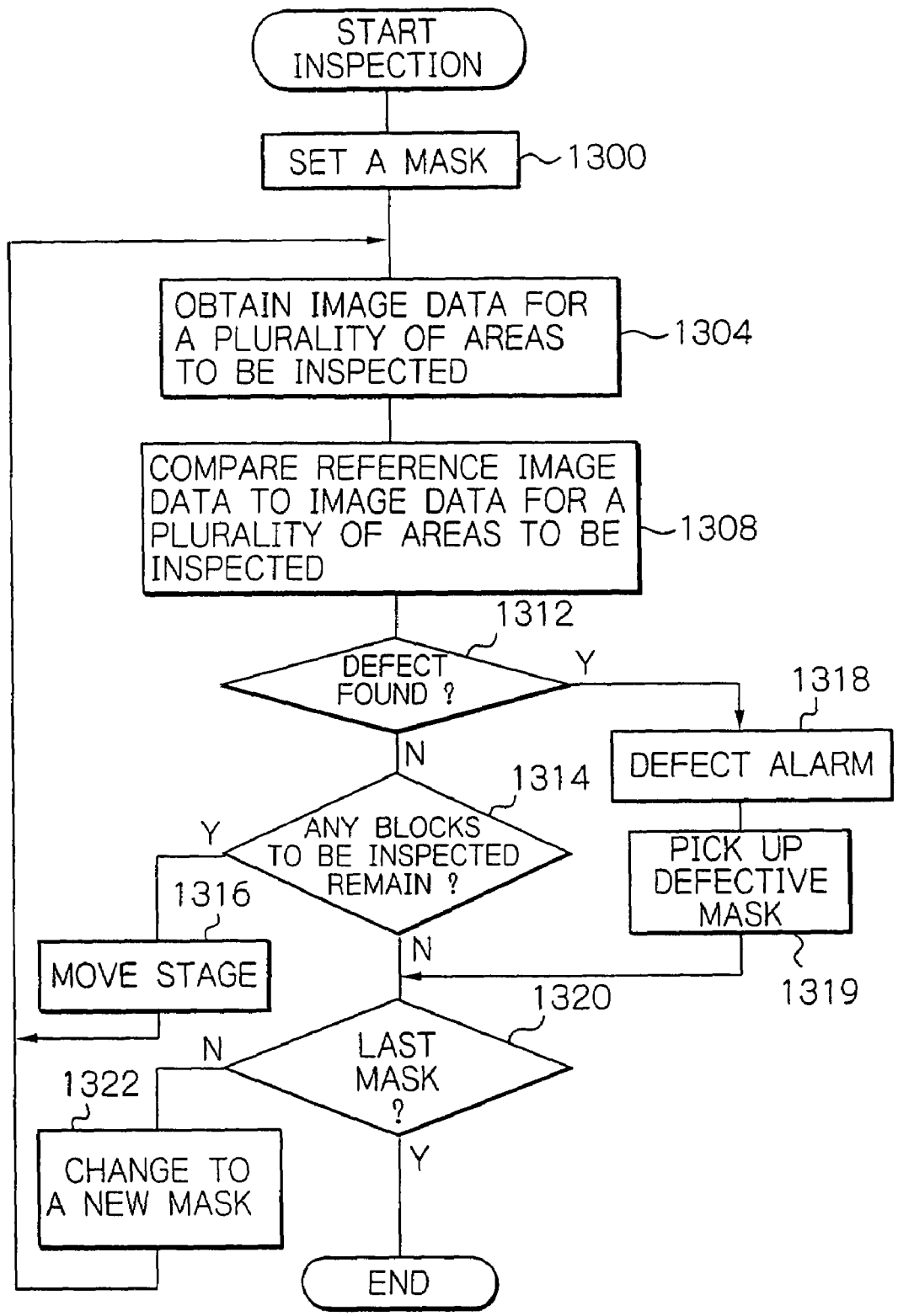
FIG. 10 is a flow chart illustrating flow of a main routine of a mask inspection in the defect inspection apparatus of FIG. 8.

At first, as shown in a main routine of FIG. 10, the stencil mask 800 or a subject of inspection is set on the sample table 50 (Step 1300). This may be performed such that every one of a number of masks stored in the loader is set one by one onto the sample table 50 automatically, as described above.

Figure 13:
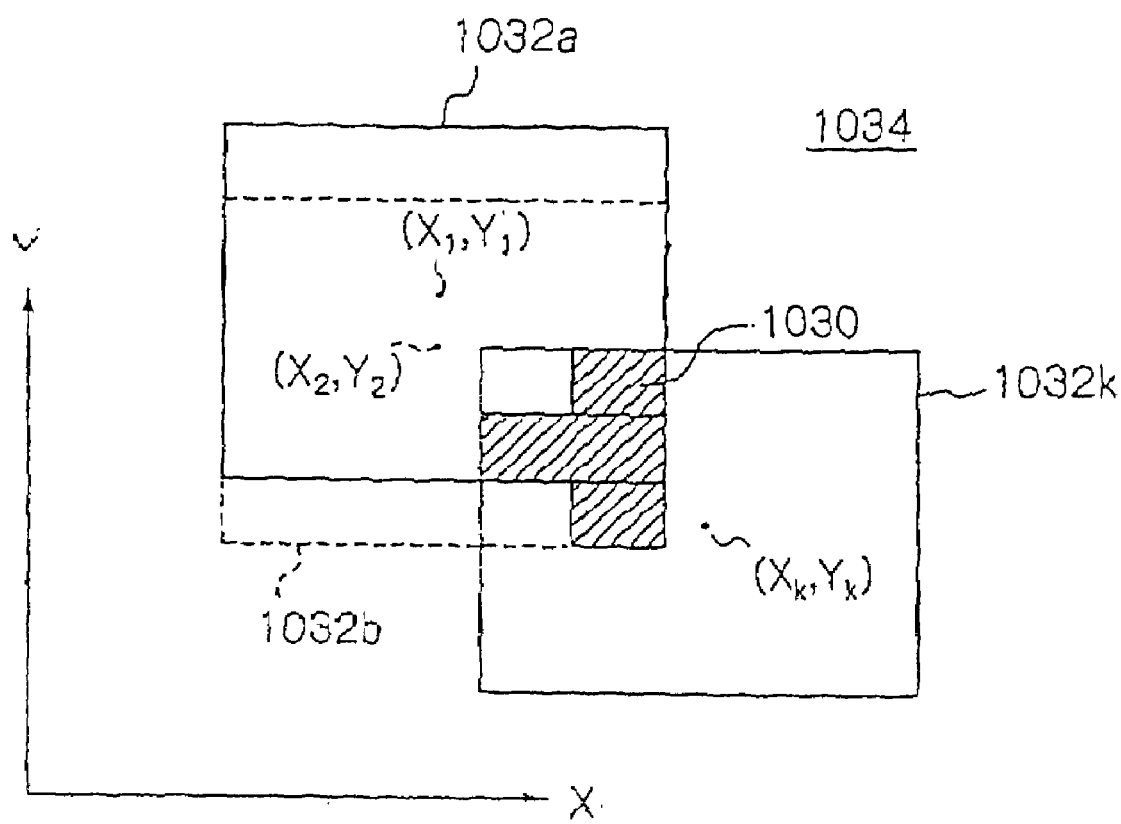
FIG. 13 shows an example of a plurality of images to be inspected, which has been obtained by the defect inspection apparatus of FIG. 8, and a reference image.

Then, a plurality of images of areas to be inspected, which are overlapped partially with one on another while being displaced from one another on the XY plane of the stencil mask 800 surface, is obtained separately (Step 1304). This plurality of areas to be inspected, images of which should be taken, represents, for example, rectangular areas designated by the reference numerals 1032a, 1032b, . . . 1032k, . . . on mask inspection area 1034, as shown in FIG. 13, which are clearly shown to be partially overlapped but displaced from one another around an inspection pattern 1030 of the mask. For example, as shown in FIG. 14, sixteen sets of images 1032 of areas to be inspected (i.e., an inspection subject image) may be obtained. Herein, in the images shown in FIG. 14, a rectangular square box corresponds to one pixel (or possibly a block unit larger than one pixel), and black painted square boxes correspond to an image portion of a pattern on the stencil mask 800. A detailed description of this step 1304 will be provided later with reference to a flow chart of FIG. 11.

Subsequently, a plurality of image data of the areas to be inspected which have been obtained in Step 1304 are compared for matching respectively to reference image data (pattern data) stored in the storage section 1013 (Step 1308 of FIG. 10), thereby determining whether or not a defect is existing on a mask inspection surface encompassed by the plurality of areas to be inspected. In this step, a so-called matching operation between image data is executed, which will be described in detail later with reference to a flow chart of FIG. 12.

If it is determined from a result of Step 1308 that a defect is existing in the mask inspection surface encompassed by the plurality of areas to be inspected (Step 1312 positive determination), an alarm of existence of the defect is given to an operator (Step 1318). As for a method for giving the alarm, for example, a message indicating existence of the defect may be displayed on the display section of the CRT 1015, and additionally an enlarged image of pattern 1017 including the defect may be displayed at the same time. Such a defective mask should be removed from a sample chamber 31 so as to be stored in a different storage from that for masks having no defect (Step 1319).

As a result of the comparing operation in Step 1308, if it is determined that there is no defect in the stencil mask 800 (Step 1312 negative determination), it is further determined whether or not there is still other areas to be inspected on the stencil mask 800 under inspection (Step 1314). If there still remains areas to be inspected (Step 1314 positive determination), then the sample table 50 is driven to displace the stencil mask 800 so that other areas to be inspected are brought into an irradiation area of the electron beam (Step 1316). After that, the process returns back to Step 1302, and similar operations are repeated for those other areas to be inspected.

If there is no area to be inspected remaining on the stencil mask 800 (Step 1314 negative determination) or after removal of a defective mask (Step 1319), it is determined whether or not the stencil mask 800 that is currently under inspection is the last mask, or whether or not there is any un-inspected mask remaining in the loader, though not shown (Step 1320). If this mask is not the last mask (Step 1320 negative determination), then an already inspected mask is stored in a predetermined storage, and a new un-inspected mask is set on the sample table 50 (Step 1322). After that, the process returns back to Step 1302, and similar operations are repeated for that mask. If the mask is the last mask (Step 1320 positive determination), the already inspected mask is stored in the predetermined storage, thus completing an entire course of operations.

Then, process flow of Step 1304 will be described with reference to the flow chart of FIG. 11.

Figure 11:
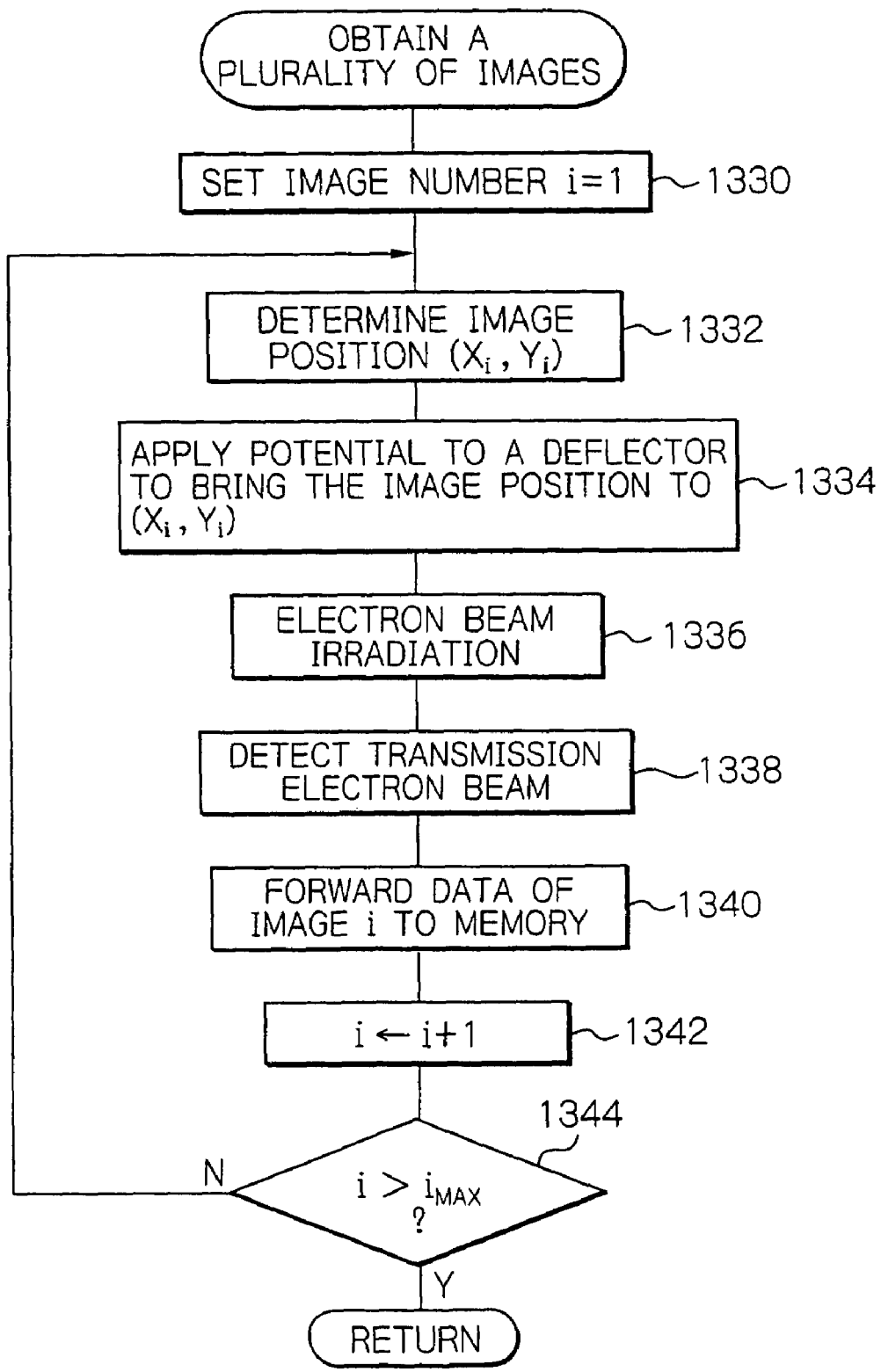
FIG. 11 is a flow chart illustrating a detailed flow of a sub-routine in a step for acquiring a plurality of image data to be inspected (Step 1304) of FIG. 10.
Figure 12:
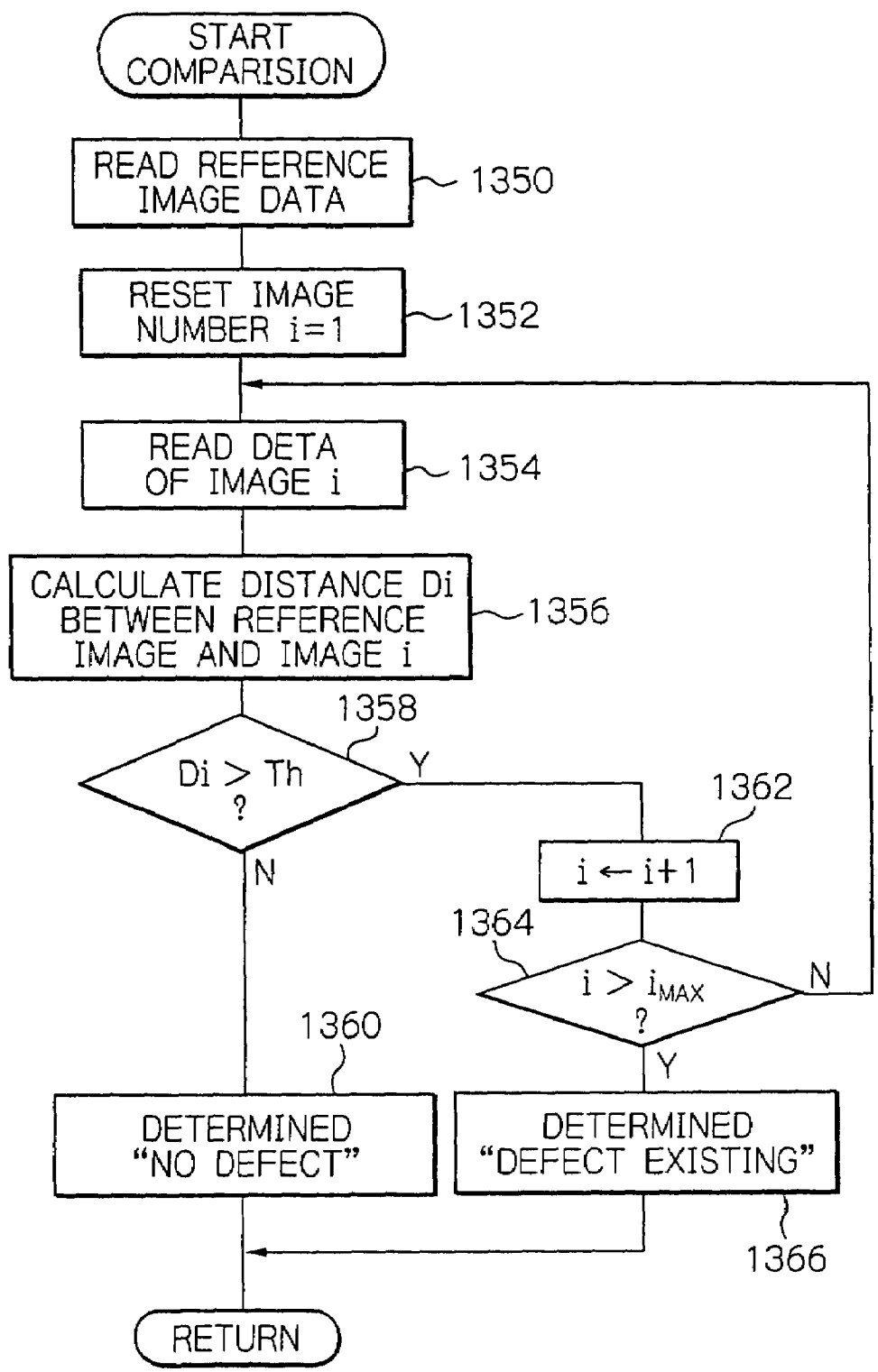
FIG. 12 is a flow chart illustrating a detailed flow of a sub-routine in a comparing step (Step 1308) of FIG. 10.

In FIG. 11, first of all, an image number "i" is set to an initial value 1 (Step 1330). This image number is an identification number that has been given to each one of a plurality of images of areas to be inspected in sequence. Then, an image position $(X_i, Y_i)$ is determined for an area to be inspected of the set image number i (Step 1332). This image position is defined as a specific position within the area for bounding the area to be inspected, for example, as a central location of the area. Currently, i=1, indicating an image position of $(X_1, Y_1)$, corresponds to a central location of an inspection area 1032a, for example, as shown in FIG. 13. All of the image positions for the image areas to be inspected have been determined in advance, for example, stored on the hard disk of the control section 1016 and are read out in Step 1332.

Subsequently, a certain potential is applied to the second deflector 725 so that the electron beam passing through the second deflector 725 (see FIG. 7) of the irradiation optical system 710 of FIG. 8 can be irradiated onto the image area to be inspected at the image position $(X_i, Y_i)$ determined at Step 1332 (Step 1334 of FIG. 11).

Next, the electron beam is emitted from the electron gun 711 and irradiated onto the surface of the set stencil mask 800 (Step 1336). At that time, the electron beam is deflected by an electric field generated by the second deflector 725 and irradiated over an entire image area to be inspected at the image position $(X_i, Y_i)$ on the mask inspection surface 1034. If i=1, the area to be inspected is represented by 1032a.

The electron beam having passed through the stencil mask 800 is formed into an image on the detector 770 with a predetermined magnification by the double lenses 731 and 737. The detector 770 detects this imaged electron beam, converts it into an electric signal or a digital image data for each detector element, and outputs thus converted signal or data (Step 1338). Then, the detected digital image data of the image number i is transferred to the electronic image storage area 1008 (Step 1340).

Subsequently, the image number i is incremented by 1 (Step 1342), and it is determined whether or not this incremented image number (i+1) is greater than a predetermined constant value $i_{MAX}$ (Step 1344). This $i_{MAX}$ represents a number of inspection images to be obtained, which is "16" in the illustrated example of FIG. 14.

If the image number i is not greater than $i_{MAX}$ (Step 1344 negative determination), then the process returns back to Step 1332, and the image position $(X_{i+1}, Y_{i+1})$ is again determined for the incremented image number (i+1). This image position defines a position moved from the image position $(X_i, Y_i)$ determined at a previous routine by predetermined distance $(\Delta X_i, \Delta Y_i)$ in the X direction and/or the Y direction. In the example of FIG. 13, the inspection area corresponding to the incremented image number is located at the position $(X_2, Y_2)$ moved from the inspection area $(X_1, Y_1)$ only in the Y direction, defining a rectangular area 1032b indicated by the broken line. It is to be noted that a value of $(\Delta X_i, \Delta Y_i)$ (i=1, 2, . . . $i_{MAX}$) may have been determined appropriately based on the data indicating empirically how much the pattern 1030 of the mask inspection surface 1034 is actually displaced from a field of view of the detector 770 as well as based on the number and area of the inspection areas.

Accordingly, the operations defined in Step 1332 through Step 1342 are sequentially repeated on the $i_{MAX}$ pieces of the inspection areas. Those inspection areas are displaced in a partially overlapped manner on the inspection surface 1034 of the stencil mask 800 so that the image position after "k" times of displacement $(X_k, Y_k)$ defines the image area to be inspected 1032k, as shown in FIG. 13. In this way, 16 pieces of the image data to be inspected as illustrated in FIG. 14, by way of example, is obtained in the image storage area 1008. A plurality of obtained images of the areas to be inspected 1032 (images to be inspected) are shown to include a part or the entirety of the image 1030a of the pattern 1030 on the mask inspection surface 1034, as exemplarily illustrated in FIG. 14.

If the incremented image number i is greater than $i_{MAX}$ (Step 1344 positive determination), the process exits from this sub-routine and returns back to the comparing step (Step 1308) of the main routine of FIG. 10.

It is to be noted that the image data that has been transferred to the memory in Step 1340 consists of an intensity value of electron for each pixel (so-called raw data) detected by the detector 770, and these data may be processed with a variety of arithmetic operations and stored in the storage area 1008 allowing for a matching operation with the reference image in the subsequent comparing step (Step 1308 of FIG. 10). Such an arithmetic operation includes, for example, a normalizing operation for making the size and/or density of the image data matched to the size and/or density of the reference image data, as well as an operation for removing a group of isolated pixels under a threshold pixel number as noise. Further, the data may be compressed and converted into a feature matrix having features of a detected pattern extracted within an allowable range so as not to degrade precision of detection of a highly sophisticated pattern, rather than being left as simple raw data. Such a feature matrix includes, for example, an m×n feature matrix, in which a two-dimensional area to be inspected consisting of M×N pixels is divided into m×n (m<M, n<N) blocks comprising matrix components each made up of a sum of intensity values of secondary electrons of the pixels included in respective blocks (or a normalized value determined from the sum divided by a total number of pixels in an entire area to be inspected). In this case, the reference image data should also be stored in the same form of representation as that. The image data referred to in the embodiment of the present invention includes not only the simple raw data but also the image data processed with a feature extraction by using a desired algorithm in such a way as described above.

Next, flow of the process of Step 1308 will be described in accordance with the flow chart of FIG. 12.

First of all, the CPU of the control section 1016 reads the reference image data from the reference image storage section 1013 (FIG. 8) onto a working memory such as the RAM (Step 1350). This reference image is indicated by reference numeral 1036 in FIG. 14. Then, the image number i is reset to 1 (Step 1352), and the image data to be inspected for the image number i is read out of the storage area 1008 onto the working memory (Step 1354).

Then, the read-out reference image data is matched with the data for the image i, and distance value $D_i$ between both data is calculated (Step 1356). This distance value $D_i$ represents a similarity between the reference image and the image i to be inspected, wherein a larger distance value indicates a greater difference between the reference image and the image to be inspected. As for this distance value $D_i$, any quantities so far as they can indicate the similarity may be employed. For example, for a case where the image data comprises the M×N of pixels, secondary electron intensity (or a feature quantity) of each pixel may be considered as an each position vector component in an M×N dimensional space, and in that case, Euclidean distance or a correlation coefficient between the reference image vector and the image i vector in this M×N dimensional space may be calculated. It is a matter of course, a distance other than the Euclidean distance, for example, so-called urban area distance may be calculated. Further, from the fact that with a greater number of pixels, a scale of an arithmetic operation will be enormous, it would be rather preferable to calculate the distance between the image data sets represented by the m×n feature vector as mentioned above.

Subsequently, it is determined whether or not the calculated distance value $D_i$ is smaller than the predetermined threshold value "Th" (Step 1358). This threshold value Th may be experimentally determined as a reference for determining a sufficient match between the reference image and the inspected image.

If the distance value $D_i$ is smaller than the threshold value Th (Step 1358 positive determination), it is determined that the inspected area of interest 1034 on the stencil mask 800 has "no defect" (Step 1360), and the process exits from the present sub-routine to return back. Specifically, if at least one image from among the inspected images that is approximately identical with the reference image is encountered, it is determined that there is "no defect". In this way, since there is no need to perform a matching operation for every one of the inspected images, a quick determination will be feasible. In the case of FIG. 14, it is obvious that an inspected image defined at row 3 and column 3 is approximately identical with a reference image without displacement relative to the reference image.

If the distance value $D_i$ is greater than the threshold value Th (Step 1358 negative determination), the image number i is incremented by 1 and the image number (i+1) is defined as new image number i, (Step 1362), and then it is determined whether or not the new image number i is over a certain value $i_{MAX}$ (Step 1364).

If the new image number i is not greater than $i_{MAX}$ (Step 1364 negative determination), the process returns to Step 1354 to read the image data for the new image number i, and similar operations are repeated.

If the image number i is greater than $i_{MAX}$ (Step 1364 positive determination), it is determined that there is "a defect existing" on an inspected area of interest 1034 of the mask (Step 1366), and the process exits from the present sub-routine to return back. That is, if any one of the inspected images is not approximately identical with the reference image, it is determined that there is "a defect existing".

Preferred embodiments of the sample table according to the present invention have been described, and it is to be understood that they are not limited to those described above, but may be modified within the scope and spirit of the present invention.

For example, although the stencil mask has been taken by way of example as a sample to be inspected, the sample to be inspected in the present invention is not limited to this, but any objects, a defect of which can be detected by applying an electron beam, may be selected as the sample to be inspected.

Further, the present invention is also applicable to a device for performing a defect inspection by using a beam of charged particles other than electrons and in addition, to any devices capable of obtaining an image by which a sample can be inspected for a defect.

Further, although in the above embodiment, in performing a matching operation between image data, either one of matching between pixels and matching between feature vectors has been used, both of these may be used in combination. Both of these quick and highly precise operations can be accomplished together through two-steps of processing comprising, for example, a first step for applying a quick matching operation with a feature vector requiring less operational volume, and a second step for applying another matching operation with more detailed image data to a resultant inspection image having higher similarity from the first step.

Further, although in the embodiment of the present invention, displacement of the image to be inspected has been dealt with only by offsetting a position of an irradiation area of an electron beam, such a process of searching for an optimal matching area on the image data before or during the matching operation (for example, by detecting areas having a higher correlation coefficient for matching) may be combined with the present invention. With this combination, since a greater scale of displacement of the inspected image can be dealt with by offsetting the irradiation area of the primary electron beam according to the present invention, and a relatively smaller scale of the displacement can be absorbed by a subsequent step of digital image processing, precision of a defect inspection can be improved.

Also, flow of the flowchart of FIG. 10 is not limited to the illustrated one. For example, although once having been determined that a sample has a defect in Step 1312, further defect inspection for other areas on that sample is not applied thereto, flow of process may be modified such that an entire area on the sample may be inspected for a defect. Further, if the irradiation area of the electron beam may be expanded so as to cover substantially the entire area to be inspected on the sample by one-time irradiation, Step 1314 and Step 1316 may be omitted.

As having described above in detail, according to the defect inspection apparatus of the present embodiment, since the sample can be inspected for any defect by obtaining each of a plurality of images of areas to be inspected which are overlapped partially with one another while being displaced from one another on the sample, and then comparing those images of the area to be inspected with a reference image, such an excellent effect is obtained that degradation of precision in defect inspection otherwise caused by an offset between the image to be inspected and the reference image can be prevented.

Further, according to a device manufacturing method of the present invention, since the defect inspection apparatus as described above is used to provide a defect inspection of a mask, such an excellent effect can be obtained that yield of products can be improved and any defective products can be prevented from being shipped.

Embodiment of an Electron Beam System

Figure 15A:
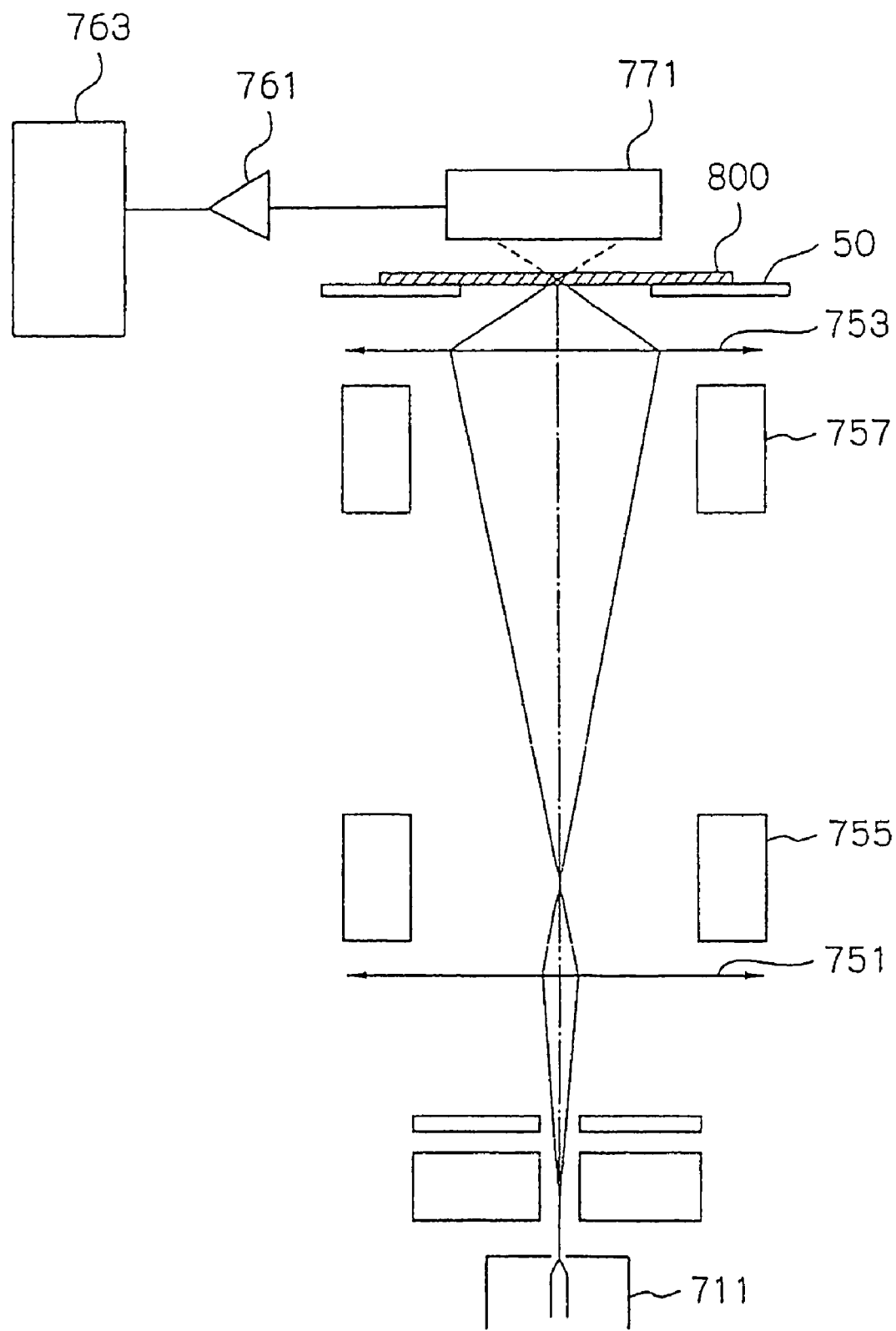
FIG. 15A is a schematic diagram illustrating an electron beam system according to another embodiment of the first invention.

FIG. 15A shows an embodiment of a stencil mask inspection apparatus of single beam type. An electron beam emitted from an electron gun 711 is converged by a condenser lens 751 and an objective lens 753 and focused on a stencil mask 800, wherein deflectors 755 and 757 control the electron beam to make a two-dimensional scanning motion over the stencil mask 800. The electron beam having passed through an aperture of the stencil mask 800 is detected by an MCP 771, amplified and A/D converted by an amplifier 761 and formed into image data in an image forming circuit 763. This image data is compared with design data generated by a CAD, and a coordinate with a different data is output.

In this embodiment, for example, the deflectors 755 and 757 control a single beam to perform a scanning motion in the X-direction, and a sample table 50 is moved in the Y-direction. It is a matter of course that the deflectors 755 and 757 may be used for a scanning motion of the single beam in the Y-direction, while the sample table 50 may be moved in the X direction.

Figure 15B:
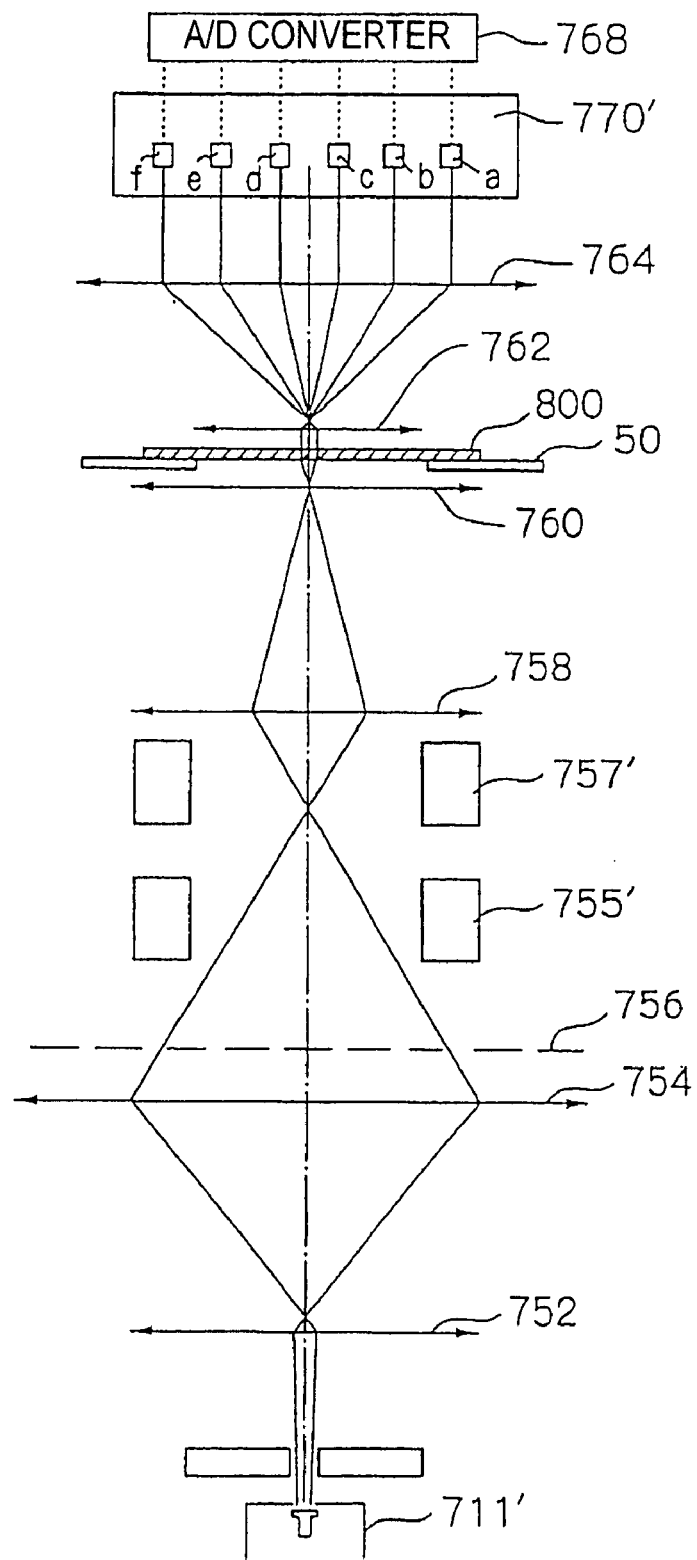
FIG. 15B is a schematic plan view illustrating an aspect of scanning of a sample by using a plurality of primary electron beams generated by the embodiment shown in FIG. 15A.

FIG. 15B shows an embodiment different from that shown in FIG. 15A in that the former employs a plurality of electron beams. Electron beams emitted from an electron gun 711' comprising an $L_aB_6$ cathode are magnified in a direction of emission by a condenser lens 752 so as to be irradiated to a multi-aperture 756 arranged above a second condenser lens 754. The electron beams shaped by the multi-aperture 756 are focused on a stencil mask 800 with aid of a reduction lens 758 and an objective lens 760. The electron beams having passed through the stencil mask 800 are magnified by magnifying lenses 762 and 764, detected by a plurality of detectors (respective detectors are designated by codes a~f, collectively by 770'), and converted into digital signals by A/D converters 768 associated with respective detectors to thereby provide a defect inspection process. With a plurality of optical axes for forming a multi-beam, an aberration may be reduced and each beam can be finely focused.

In the present embodiment, deflectors 755' and 757' are arranged between the second condenser lens 754 and a reduction lens 758. The deflectors 755' and 757' control the plurality of electron beams focused on the stencil mask 800 so as to scan the stencil mask 800 two-dimensionally. Also in the present embodiment, for example, the deflectors 755' and 757' control the plurality of electron beams to perform a scanning motion in the X-direction, and the sample table 50 is moved in the Y-direction. As a matter of course, the deflectors 755' and 757' may control the plurality of electron beams to perform a scanning motion in the Y-direction, while the sample table 50 may be moved in the X-direction.

A cross section of each of the plurality of electron beams may be circular or rectangular. However, in the case of the plurality of electron beams being used for X-direction scanning, preferably each of the electron beams may be spaced equally from others in the X-direction.

According to the above embodiment, the following effects could be obtained.

1. Since the irradiating electron beams are controlled to be good at collimation, that is, an angular aperture α is made smaller, an aberration of a magnifying optical system will be smaller to thereby obtain an image of high resolution.

2. Since the irradiation optical system comprises a two-stage arrangement of lenses but constructs a telecentric optical system, the optical system may be made simple and further advantageously provides a great allowance for variation in a Z-directional position of a sample. In addition, since an angular aperture $\alpha$ is small, a long focal depth may be provided.

3. Since inspection is performed while moving the sample table continuously, a higher throughput of the inspection can be achieved even with a narrow main field of view.

4. With a scanning motion within the main field of view in a stepping or serial manner to thereby apply a dynamic aberration compensation, a low aberration can be achieved even with a larger $\alpha$ and a higher beam current.

5. Since magnification for focusing a scintillator image on a CCD is tuned by an optical lens, there will be no need to adjust magnification of a primary optical system precisely.

6. With use of an $L_aB_6$ electron gun under high brightness condition or an FE electron gun, high resolution as well as high throughput may be achieved. An equivalent frequency per pixel over 800 MHz is also possible.

7. With an arrangement disposing an electron gun in a lower location and a detector in a high location, a position of a mask is made lower to thereby improve a resistance against vibration.

8. With an arrangement employing a doublet lens as a first-stage lens, chromatic aberration caused by magnification and distortion can be compensated for, and accordingly, less blurred image with smaller distortion may be obtained.

9. Since the magnification of a magnifying lens system is made variable, inspections for all types of character masks, including a one-to-one magnification mask, a ¼ magnification (reduction) mask, a ¹⁄₁₀ magnification (reduction) mask, can be performed efficiently.

10. With a TDI detector placed outside of an atmosphere, a high speed signal can be handled easily.

11. Since changing lens conditions of an illumination system can provide a small beam with a reduced crossover, registration may be performed with high precision.

12. Using an electron beam allows for inspection with higher intensity than using light. Owing to this, such a problem to produce defective products may be reduced.

13. Since image data is compared with pattern data, it can be inspected as to whether or not compensation has been applied properly as a result of proximity effect compensation.

Device Manufacturing Method

An embodiment of a semiconductor device manufacturing method according to the present invention will now be described with reference to FIGS. 16 and 17A.

Figure 16:
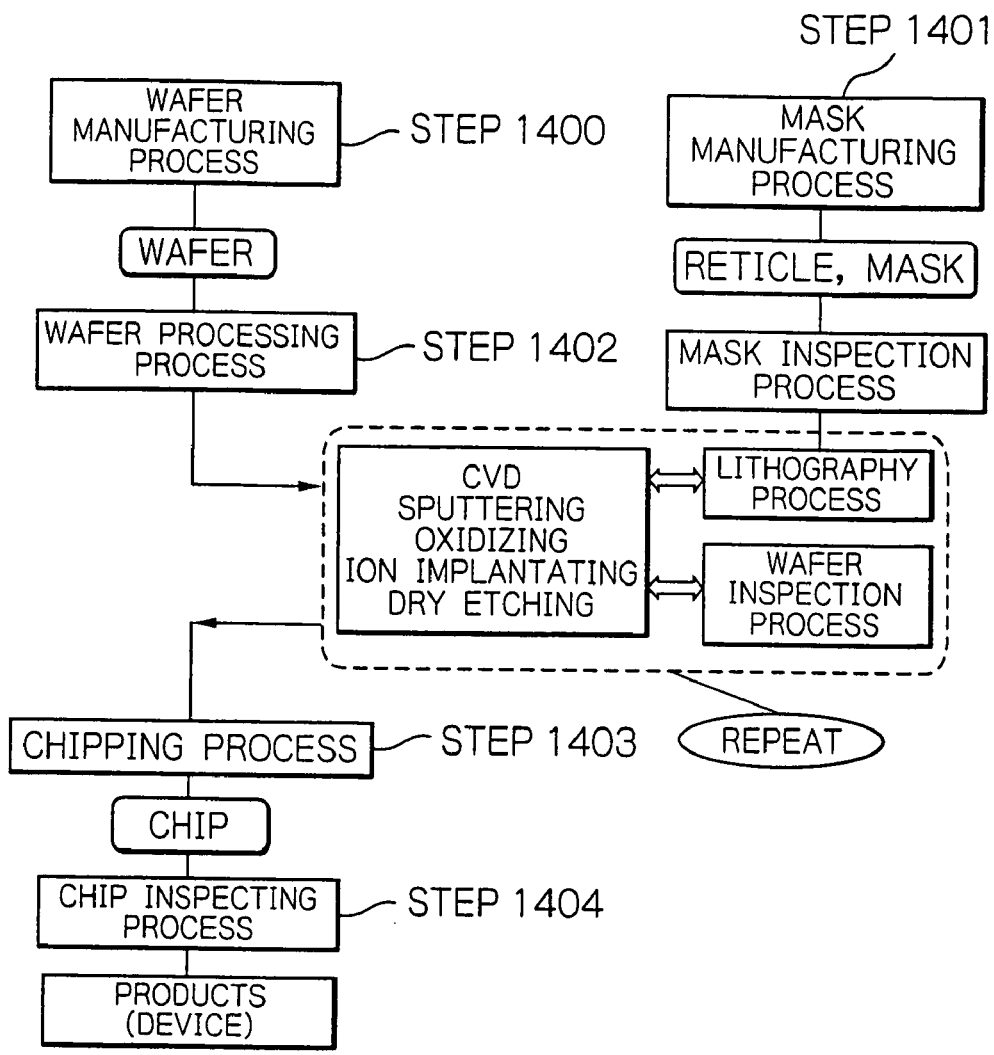
FIG. 16 is a flow chart illustrating an embodiment of a manufacturing method of a semiconductor device according to the first invention.

FIG. 16 is a flow chart illustrating one embodiment of the semiconductor device manufacturing method according to the present invention. The manufacturing process in this embodiment includes the following main processes.

(1) A wafer manufacturing process for manufacturing a wafer (or wafer preparing process for preparing a wafer) (Step 1400).

(2) A mask manufacturing process for fabricating a mask to be used during exposure (or a mask preparing process) (Step 1401).

(2') An inspection process of a fabricated mask (this step uses an inspection apparatus equipped with an electron beam system described above).

(3) A wafer processing process for performing any processing treatments necessary for the wafer (Step 1402).

(4) A chip assembling process for cutting out those chips formed on the wafer one by one to make them operative (Step 1403).

(5) A chip inspection process for inspecting an assembled chip (Step 1404).

It is to be appreciated that each of these processes further comprises several sub-processes.

Among those main processes, one main process that gives a critical affection to performance of the semiconductor device is (3) A wafer processing process. In this wafer processing process, designed circuit patterns are deposited on the wafer one on another, thus to form many chips, which will function as memories or MPUs. This wafer processing process includes the following sub-processes.

(A) A thin film deposition process for forming a dielectric thin film to be used as an insulation layer, a metallic thin film to be formed into a wiring section or an electrode section, and the like (by using CVD process or sputtering).

(B) An oxidizing process for oxidizing a thus formed thin film and/or a wafer substrate.

(C) A lithography process for forming a resist pattern by using a mask (reticle) in order to selectively process the thin film layer and/or the wafer substrate.

As for the mask used in this lithography process, those masks that have been inspected with the inspection apparatus as described above may be used.

(D) An etching process for processing the thin film layer and/or the wafer substrate in accordance with the resist pattern (by using, for example, dry etching technology).

(E) An ions/impurities implant and diffusion process.

(F) A resist stripping process.

(G) An inspection process for inspecting a processed wafer.

It should be noted that the wafer processing process must be performed repeatedly as desired depending on a number of layers contained in the wafer, thus to manufacture a semiconductor device that will be able to operate as designed.

Figure 17A:
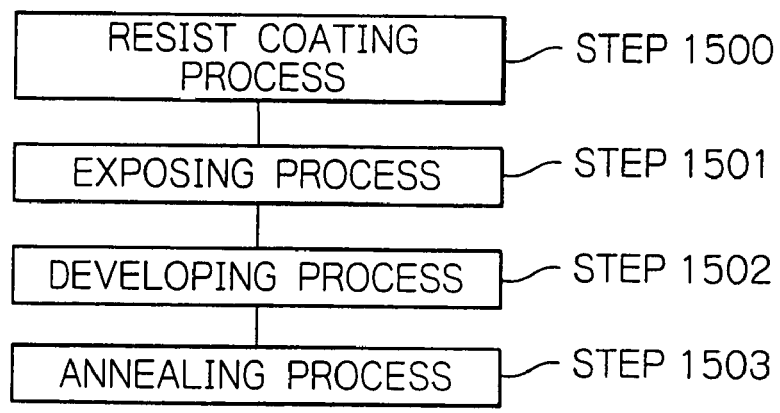
FIG. 17A is a flow chart illustrating a lithography process representing a core step in a wafer processing process shown in FIG. 16.

FIG. 17A is a flow chart illustrating the lithography process included as a core process in the wafer processing process of FIG. 16. The lithography process comprises the respective processes as described below.

(a) A resist coating process for coating the wafer, having a circuit pattern formed thereon in a preceding, stage with a resist (Step 1500).

(b) An exposing process for exposing the resist (Step 1501).

(c) A developing process for developing the exposed resist to obtain the pattern of the resist (Step 1502).

(d) An annealing process for stabilizing the developed resist pattern (Step 1503).

Known procedures may be applied to all of the processes described above including the semiconductor device manufacturing process, the wafer processing process and the lithography process, and any further explanation about those will not be given.

When a defect inspection method, and a defect inspection apparatus according to the present invention is used in the inspection process of (2)–(2') and the lithography process described above, even a stencil mask having a fine pattern can be inspected with high throughput, so that a total inspection can be employed to make it possible to prevent any defective products from being produced.

Inspection Procedure

An inspection procedure in the above-described inspection process of (2)–(2') will be described.

In general, since an inspection apparatus using an electron beam is expensive and a throughput thereof is rather low as compared to other processing devices, in the current circumstances the inspection apparatus is used after an important process (for example, after process of etching, film deposition, CMP (Chemical-mechanical polishing) planarization or the like) where it is considered that inspection is required most.

Figure 17B:
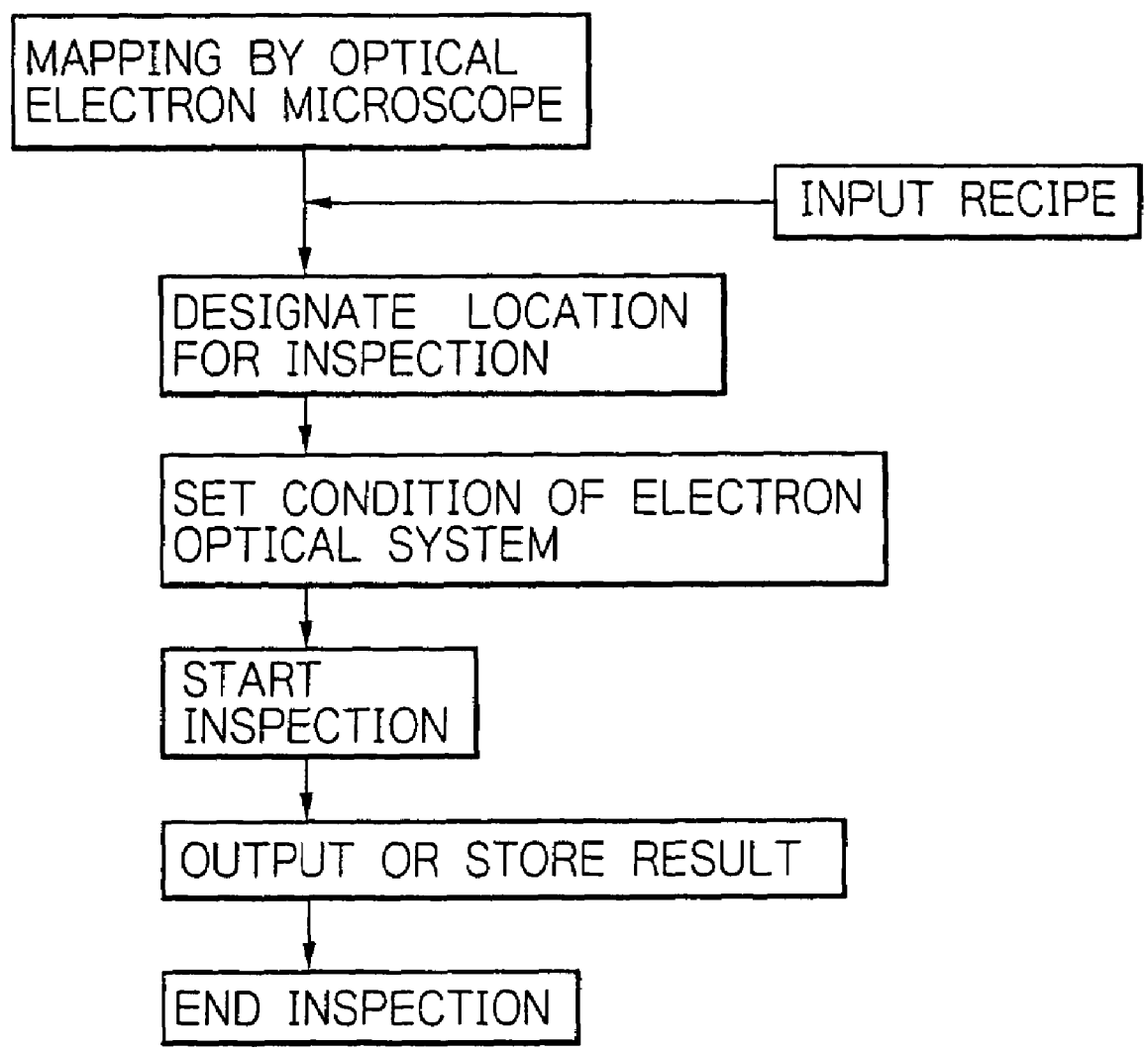
FIG. 17B is a flow chart illustrating a procedure of a defect inspection of a mask.

A mask to be inspected is, after having been positioned on an ultra-precise X-Y stage through an atmospheric conveying system and a vacuum conveying system, secured by an electrostatic chuck mechanism or the like, on which a defect inspection and the like may be subsequently performed in accordance with the procedure (shown in FIG. 17B). First of all, by using an optical microscope, a positional check of each die and/or a height detection of each location may be performed appropriately as needed and those results may be stored. In addition to those operations, the optical microscope is used also to acquire an optical microscopic image for a desired location, such as a defective location, which will be used for a comparison with an electron beam image. In a next step, information of a recipe corresponding to the type of a mask (i.e., after which step the mask is currently, and what the mask size is, 20 cm or 30 cm, and so on) is input to the device, and after a series of operations including a designation of an inspection place, a setting of the electronic optical system and a setting of the inspection condition, defect inspection is applied typically at real time while performing acquisition of images. Comparison among cells and comparison among dies are performed by a high speed information processing system loaded with an algorithm thus to perform the inspection, and results are output to the CRT and the like or stored in the memory as needed. A defect includes a particle defect, an abnormal shape (pattern defect) and an electric defect (break or bad conduction of wirings or vias), which may be distinguished from one another and/or classified according to size of the defect or a degree of defect including whether it is a killer defect (a fetal defect leading to a disabled chip) or not, automatically at real time. The detection of the electric defect can be achieved by detecting an abnormal contrast. For example, since the location of bad conduction is usually charged to be positive through the electron beam irradiation (on the order of 500 eV) indicating degraded contrast, it can be distinguished from a normal location. A means for the electron beam irradiation in this case is an electron beam generation means (generation means for thermion or UV/photoelectron) of low potential (energy) arranged separately from the electron beam irradiation means used for a regular inspection, in order to enhance contrast caused by potential difference. Prior to the irradiation of the electron beam for inspection onto the area to be inspected, this electron beam of low potential (energy) is generated and irradiated. For a case of an image projection system in which positive charging is generated by irradiating the electron beam for inspection in itself, the additional electron beam generation means of low potential is not required to be arranged separately, depending on specifications. Further, applying to a sample, such as a mask, a positive or a negative potential relative to a reference potential also makes it possible to perform the defect detection based on the difference in contrast (caused by the fact that flowability is different depending on a forward direction or an inverse direction of elements). This may be applicable to a line width measuring device and also to an alignment precision measurement.

As described above, according to the embodiment of the first invention, in which the electron beam is employed to form the image of the mask, more minute defects can be inspected for as compared to a related defect inspection apparatus typically using light.

Further, since an electron beam having passed through the mask is used to form the image of the sample, which means that an irradiation beam and a transmission beam would not follow a common path, an out-of-focus of the transmission beam otherwise caused by the space charge effect can be improved significantly as compared to the related device guiding the irradiation beam and the transmission beam to follow a common path, and consequently a signal having a good S/N ratio can be obtained and also a defect of the sample can be detected in a short time.

An embodiment according to a second invention will be described.

An embodiment of the second invention relates to an apparatus for performing a semiconductor processing process including steps of lithography, film deposition (CVD, sputtering, plating), oxidation, impurities doping, etching, flattening, cleaning and drying of a sample such as a wafer or a stencil mask, and also for performing a feature observation or a defect inspection of a high-density pattern in the sample such as the wafer or the stencil mask, which has been fabricated through the above process, with high precision and high reliability, and further to a semiconductor device manufacturing method for performing pattern inspection in the course of a device manufacturing process by using the apparatus.

The second invention further relates to an apparatus for performing a defect inspection of a mask used for semiconductor device manufacturing.

Conventionally, respective units in a semiconductor manufacturing apparatus and a feature observation apparatus or a defect inspection apparatus have been respectively fabricated as separate and independent units (stand-alone units) and disposed separately in a line. Because of this arrangement, it has been required that a sample such as a wafer which has been finished with one of semiconductor processing processes should be placed in a cassette and transferred by some transport means from one unit of the semiconductor manufacturing apparatus to the inspection apparatus directly or via a cleaning/drying unit.

Further, in a related art system where an electron beam is used to inspect a stencil mask with high precision, a narrow electron beam is emitted from a reverse side of the mask to scan it, and transmission electrons having passed through the sample are detected to thereby provide inspection.

If the respective units (including devices) are arranged as described above, the sample transport means is required between respective units, and additionally each unit needs a loader means and unloader means for taking the sample in and out of the cassette. Consequently, there arises a problem including an extended area for installing the apparatus, an increase in a total cost of the apparatus and also an increase in a probability of contamination of the sample such as a wafer.

Besides, there has been another problem in that throughput will be extremely small, because a narrow electron beam is used in the above inspection of the mask.

The embodiment according to the second invention has been made to solve the above problems, and an object thereof is to provide a semiconductor manufacturing apparatus that can reduce an area required for installing the apparatus, reduce a total cost of the apparatus and further reduce a probability of contamination of the sample to thereby improve yield of the process by eliminating the transport means from among respective units and sharing the loader means and unloader means among the respective units, and also to provide a device and method for performing defect inspection of a stencil mask with high throughput.

Now, a summary of a semiconductor manufacturing apparatus according to the second invention will be described.

This semiconductor manufacturing apparatus is prepared for a sample such as a wafer and is characterized in incorporating a defect inspection apparatus.

Owing to a configuration of the semiconductor manufacturing apparatus integrated with the defect inspection apparatus therein, a sample, such as a wafer or a stencil mask, that has been taken in by the load section is transferred into the defect inspection apparatus within the apparatus after completion of one manufacturing process, and then removed from the unload section after inspection in the defect inspection apparatus. Accordingly, a number of pairs of the load section and the unload section corresponding to the number of units have been required so far, but according to this semiconductor manufacturing apparatus, the number of the pairs of load and unload sections will be made to be only one. Further, a transport unit of the sample such as a wafer conventionally required between the semiconductor manufacturing apparatus and the defect inspection apparatus can be eliminated. Therefore, a floor area for installing the apparatus can be reduced, a total cost of apparatuses can be reduced, and further probability of contamination of a sample such as a wafer can be reduced to thereby improve yield of the process.

In the semiconductor manufacturing apparatus, the defect inspection apparatus may be an apparatus using an energy beam, and may be integrated with the semiconductor manufacturing apparatus.

In the semiconductor manufacturing apparatus, the apparatus may comprise an etching (pattern forming) section, a cleaning section, a drying section, an inspection section having the inspection apparatus, and the load and unload sections, wherein the inspection section may be disposed in the proximity of either one, two, or three of the etching section, the drying section and the unload section.

According to this arrangement, the floor area for installing the apparatus in its entirety can be reduced, and also four functions of pattern forming processing, cleaning, drying and inspection can be handled within one unit, and further since main components are disposed closely to one another, advantageously efficiency will be increased and the floor area for installing the apparatus will be reduced.

In an alternative semiconductor manufacturing apparatus, the apparatus may comprise a plating section, a cleaning section, a drying section, an inspection section having the defect inspection apparatus, and load and unload sections, wherein the inspection section is disposed in the proximity of either one, two, or three of the plating section, the drying section and the unload section. According to this arrangement, the same effect can be obtained even in the plating unit as that obtainable in the CMP.

In the semiconductor manufacturing apparatus, the defect inspection apparatus may be an electron beam inspection apparatus, and the cleaning unit and the drying unit may be incorporated in the semiconductor manufacturing apparatus.

According to this arrangement, a sample such as a stencil mask can be inspected with higher resolution by the defect inspection apparatus, which means that an inspection of a clear defect and an opaque defect may be feasible. Further, owing to incorporation of the cleaning unit and the drying unit inside the apparatus, the load and unload sections in association with the cleaning and drying unit that have been conventionally installed as a stand-alone unit can be eliminated and also the sample transport unit can be eliminated, therefore the floor area for installing the apparatus can be reduced, also the total cost of the apparatus can be reduced, and further the probability of contamination of the sample such as a stencil mask can be reduced, thereby improving yield of the process.

Alternatively, the above defect inspection apparatus may be a defect inspection apparatus using an energy beam, and the defect inspection apparatus may be integrated with the semiconductor manufacturing apparatus. The concept of an energy particle beam or the energy beam includes an electron beam, an X-ray, an X-ray laser, an ultra-violet ray, an ultra-violet ray laser, photoelectrons and light. Besides, the defect inspection apparatus using the energy particle beam or energy beam may comprise at least an energy particle irradiation section, an energy particle detection section, an information processing section, an X-Y stage and a sample loading table.

In the semiconductor manufacturing apparatus, the electron beam defect inspection apparatus may comprise a differential exhausting system.

According to this configuration, there is no need to vacuum exhaust a space around a sample stage of the electron beam system, and accordingly a load-lock mechanism to be disposed upstream and downstream of that stage space can be eliminated, thereby allowing for the sample such as a wafer to be transferred without any restriction.

In the semiconductor manufacturing apparatus, an electron beam irradiation area on a surface of the sample can be evacuated by the differential exhausting system.

According to this configuration, a more efficient exhausting system can be constructed by exclusively exhausting the electron beam irradiation area on the sample surface.

In the semiconductor manufacturing apparatus, the defect inspection unit may be an electron beam defect inspection apparatus of a scanning-type electron microscope (SEM) system.

Further, in the semiconductor manufacturing apparatus, a primary electron beam used in the electron beam defect inspection apparatus may consist of a plurality of electron beams, in which secondary electrons from the sample are deflected from an optical axis of primary electron beams by an E×B filter (Wien filter) so as to be detected by a plurality of detectors.

In the semiconductor manufacturing apparatus, the defect inspection apparatus may be an electron beam defect inspection apparatus of an image projection-type electron microscope system.

In the semiconductor manufacturing apparatus, the primary electron beam used in the electron beam defect inspection apparatus may consist of a plurality of electron beams, in which a plurality of electron beams are operatively irradiated onto the sample so as to scan the surface thereof, and secondary electrons from the sample are deflected from the optical axis of the primary electron beam by the E×B separator (Wien filter) so as to be detected by a two-dimensional or line image sensor.

With this configuration, a dosage of the electron beam and a resolution of a secondary optical system can be improved, and thereby throughput thereof may also be improved.

Such an electron beam system representing the defect inspection apparatus can be provided, in which the electron beam emitted from an $LaB_6$ electron gun is shaped properly and irradiated to the sample, and the electron beam emanated from the sample is formed into an image by an optical system of an image projection-type electron microscope system, wherein the electron beam system may comprise a load-lock chamber for loading/unloading, and the $LaB_6$ electron gun may be operable in a space-charge-limited condition.

In the electron beam system, the electron beam emanated from the sample may be back-scattered electrons or transmission electrons.

In the electron beam system, an image-projected sample image may be converted to an optical image by a scintillator screen, and the optical image may be formed on a TDI detector by an FOP or lens system.

In the electron beam system, the image-projected sample image may be formed on the TDI detector having sensibility to the electron beam.

In the electron beam system, the sample may be secured on a sample table by an electrostatic chuck, a laser interferometer for measuring a position of the sample table may be provided, and the sample may also be secured within a load-lock chamber by the electrostatic chuck.

The defect inspection apparatus may be used to inspect the wafer in the course of processing. This may help improve yield of processing significantly.

An improved device manufacturing method can be provided, in which a defect inspection and defect analysis of a wafer, or a mask that has been finished with one of the manufacturing processes, is performed and results will be fed back to a flow of processes.

This will now be described in detail with reference to the attached drawings.

FIG. 18 is a schematic diagram illustrating a configuration of a stencil mask forming (etching) apparatus 100" with an inspection unit incorporated therein, which represents an example of the semiconductor manufacturing apparatus of the second invention. The apparatus comprises as main components a load section 1" equipped with a load unit 21", an etching section 2" equipped with a pattern forming unit 22", a cleaning section 3" equipped with a cleaning unit 23", a drying section 4" equipped with a drying unit 24", an inspection section 5" equipped with an inspection unit 25" and an unload section 6" equipped with an unload unit 26", all of which are arranged functionally so as to make up an integrated unit. That is, FIG. 18 shows one example of the second invention comprising respective sections that have been disposed functionally. In addition, though not shown, transport mechanisms and/or alignment mechanisms for a sample such as a stencil mask may be disposed in functionally desired spots, respectively. The load section 1" and the unload section 6" are equipped with mini-environment mechanisms (a mechanism for circulating air or a gas such as nitrogen that has been cleaned by a cleaning unit in a down flow to thereby prevent contamination of the sample such as a wafer), respectively, though not shown. The sample transport mechanism is equipped with a vacuum chuck mechanism, an electrostatic chuck mechanism or a mechanical sample clamping mechanism, which are typically required for fixedly securing the sample, while for simplicity such a component is omitted from FIG. 18. There is no need to provide the load section 1" and the unload section 6" independently, but they may be collectively provided in the form of a single unit of a transport mechanism with single-chamber. Generally, it is preferred that the load section 1", the unload section 6" and a control panel (not shown) may be arranged as illustrated in FIG. 18 so that they can be accessed (manipulated) from one direction, thus achieving a through-the-wall system (in which the sample loading/unloading mechanism and the control section are exclusively located in a chamber having higher cleanliness, while the unit main body that is more apt to produce dust is located in a place of lower cleanliness, with a partition wall disposed in space therebetween to define an interface, thereby reducing a load to the chamber having the higher cleanliness).

Figure 19:
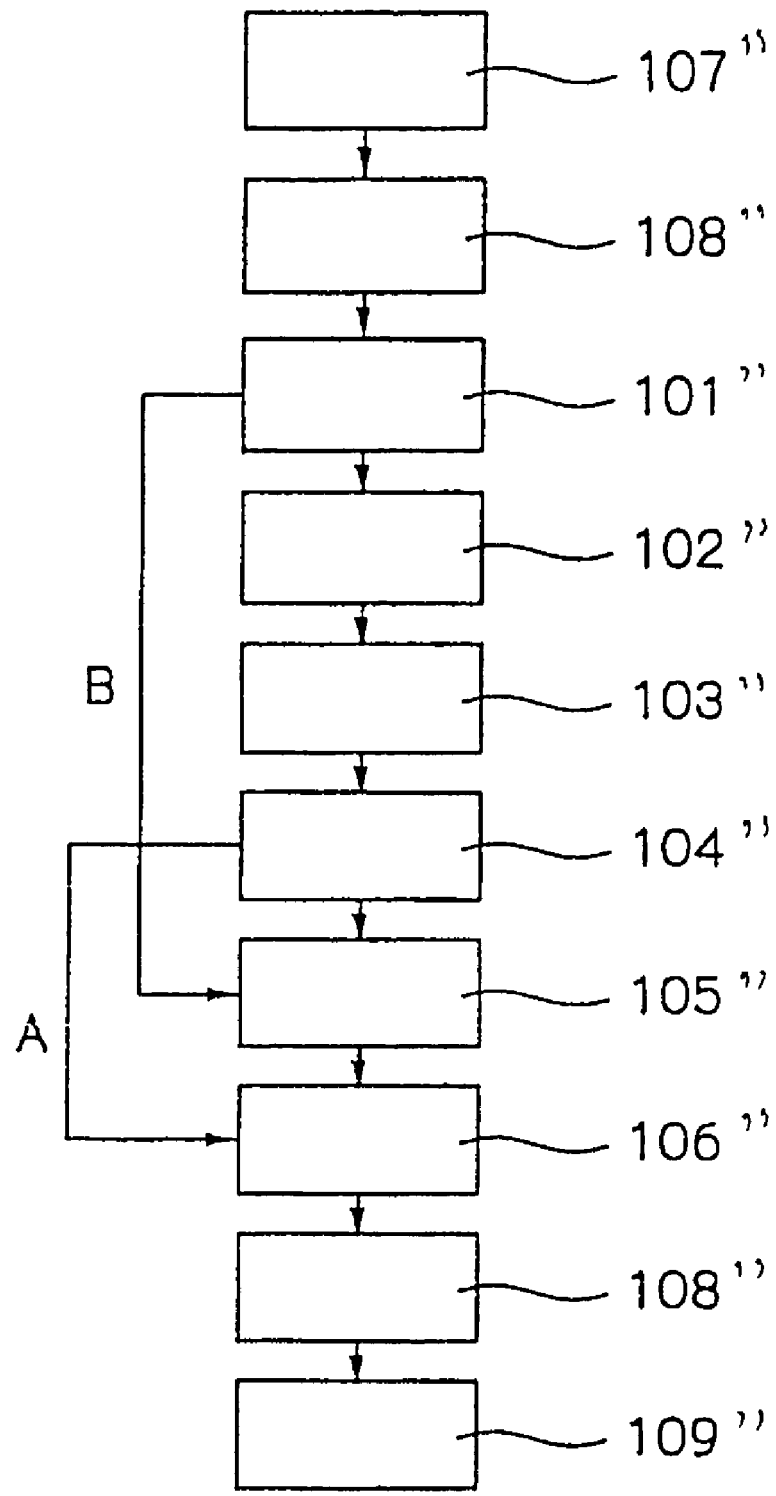
FIG. 19 a block diagram illustrating an exemplary flow of steps of the second invention.

FIG. 19 shows an exemplary process flow of the second invention. The sample such as a wafer or a stencil mask is, as typically accommodated in the cassette, conveyed from preceding step 107" to sample transport step 108", removed from the cassette in the load section 1" and inserted into the etching section 2" (the sample load step 101"), where pattern forming processing is applied thereto (the etching step 102"), and then further transferred through cleaning step 103" in the cleaning section 3" and a drying step 104" in the drying section 4" to the inspection section 5". The sample is subjected to a feature inspection and/or a defect inspection in the inspection section 5" (inspection step 105"), and transferred via the unload section 6" into the cassette (sample unload step 106"), and after that the sample is sent, as carried in the cassette, via sample transport step 108" to a subsequent step 109", for example, a step of an exposing process.

In the process flow of FIG. 19, a sample that does not need the inspection process 105" is directly sent to the unload step 106" after the cleaning and the drying steps without passing through the inspection step 105", as indicated by line A. Besides, similarly, the sample can skip the etching step 102", the cleaning step 103" and the drying step 104", as indicated by line B.

Figure 20:
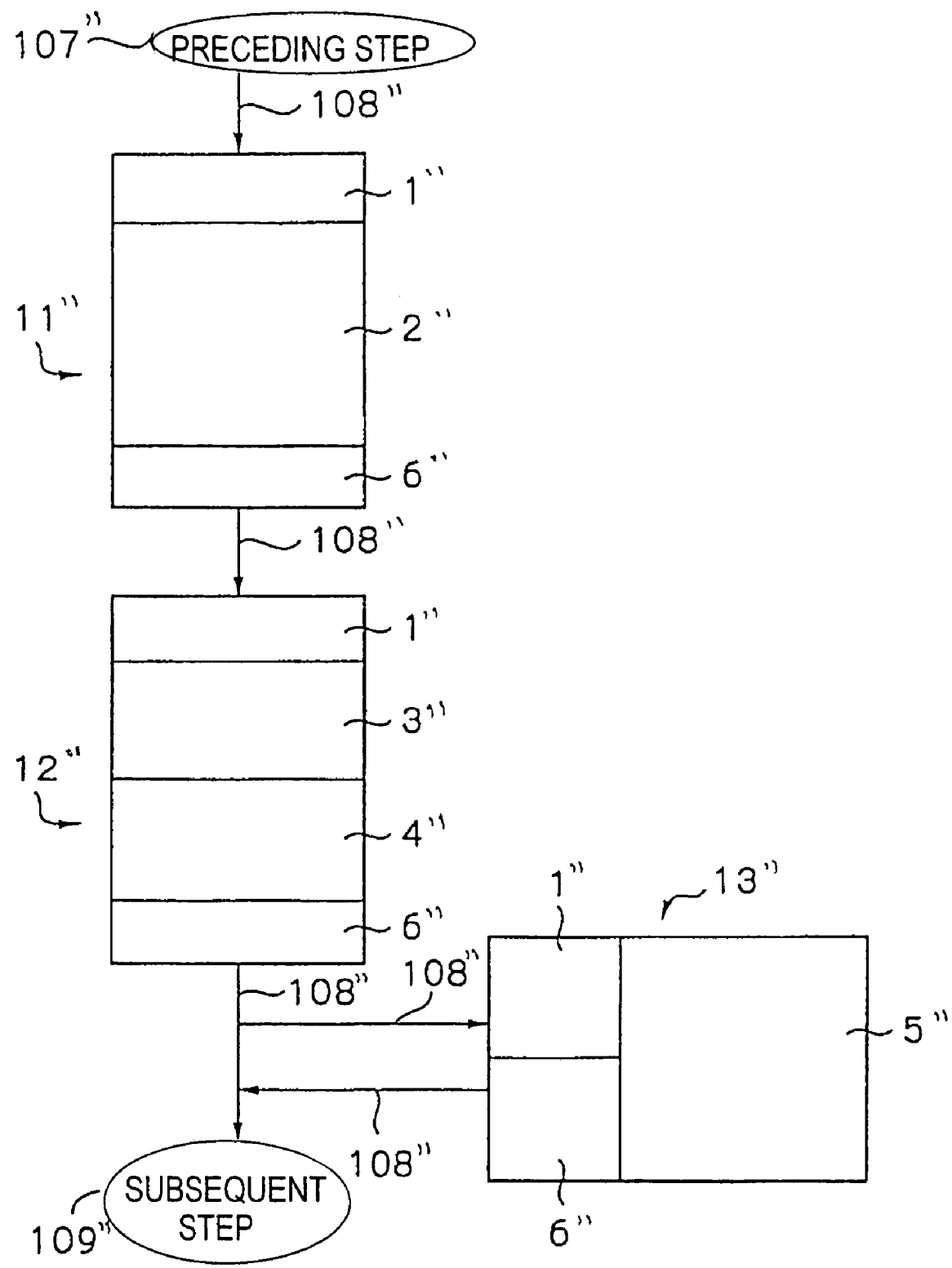
FIG. 20 is a schematic diagram illustrating a related system involved in the second invention.

In a related wafer processing process (shown in FIG. 20), the pattern forming step by etching, the cleaning and the drying steps, and the inspection step have been performed respectively by each independent (stand-alone) etching unit 11", cleaning and drying unit 12" and inspection unit 13" (shown in FIG. 20). Since each one of those units is equipped with the load section 1" and the unload section 6", three pairs of load section and unload section are arranged in total. Further, a unit 108" for transporting samples has been installed between respective units.

Figure 21:
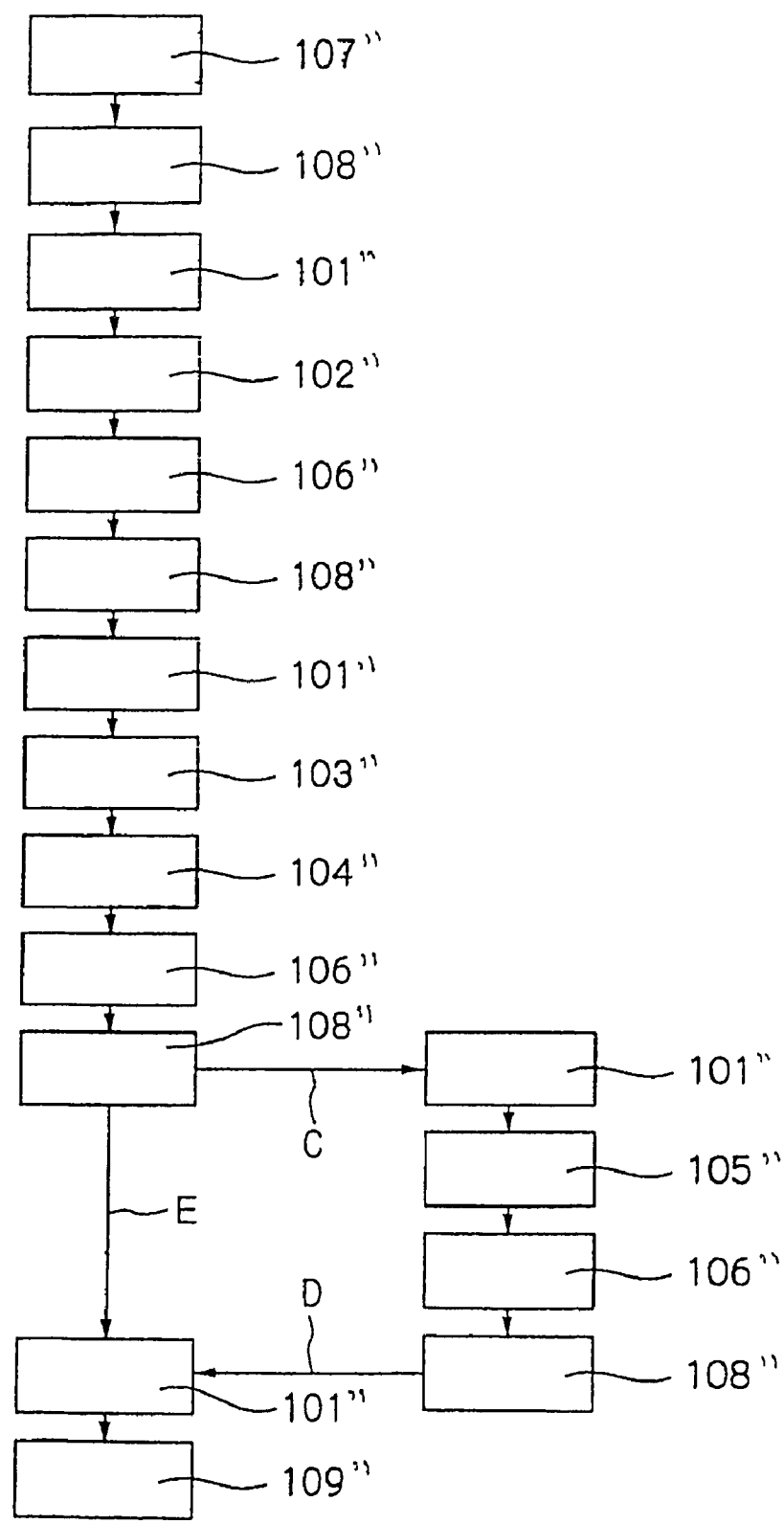
FIG. 21 is a block diagram illustrating an exemplary flow of steps of the related system involved in the second invention.

FIG. 21 shows a wafer processing process according to related art. A sample such as a wafer is, as typically accommodated in a cassette, conveyed from preceding step 107" to sample transport step 108", passed through load section 1" and inserted into etching section 2" (sample load step 101"), where a flattening process is applied thereto (etching step 102"), and then transferred through sample unload step 106", sample transport step 108" and sample load step 101", and after cleaning step 103" and drying step 104", further transferred through sample unload step 106" and sample transport step 108" into inspection apparatus 13" (line C). The sample is passed through the load section 1" (load step 101") to inspection section 13", where feature inspection and/or defect inspection are applied thereto (inspection step 105"). After that, the sample is further transferred through unload section 6" of the inspection apparatus 13" into the cassette (the sample unload step 106"), and subsequently the sample is, as in the cassette, transferred by the sample transport step 108" to a subsequent processing step 109", for example, a step of an exposing process (line D). Typically, since an inspection process takes long time, not all of the wafers after the processes of etching, cleaning and drying are inspected, but a sampling inspection is applied. That is, most of the wafers follow the line indicated by E of FIG. 21.

As is obvious from a comparison of FIG. 19 and FIG. 21, in the embodiment according to the second invention, the number of steps could be reduced into ⅔ of that according to the related method, and resultantly overall processing time could be reduced by 10% and an area required for installing the apparatus could be reduced by 20%. A manufacturing cost of the apparatus could also be reduced by 15%.

The etching unit with the defect inspection apparatus incorporated therein has been described as an exemplary unit in the semiconductor manufacturing apparatus of the second invention, and without any trouble, other units in the semiconductor manufacturing apparatuses for performing lithography, film deposition (CVD, sputtering, plating), oxidation, impurities doping and so on may also be configured similarly so as to incorporate the defect inspection apparatus.

Figure 22:
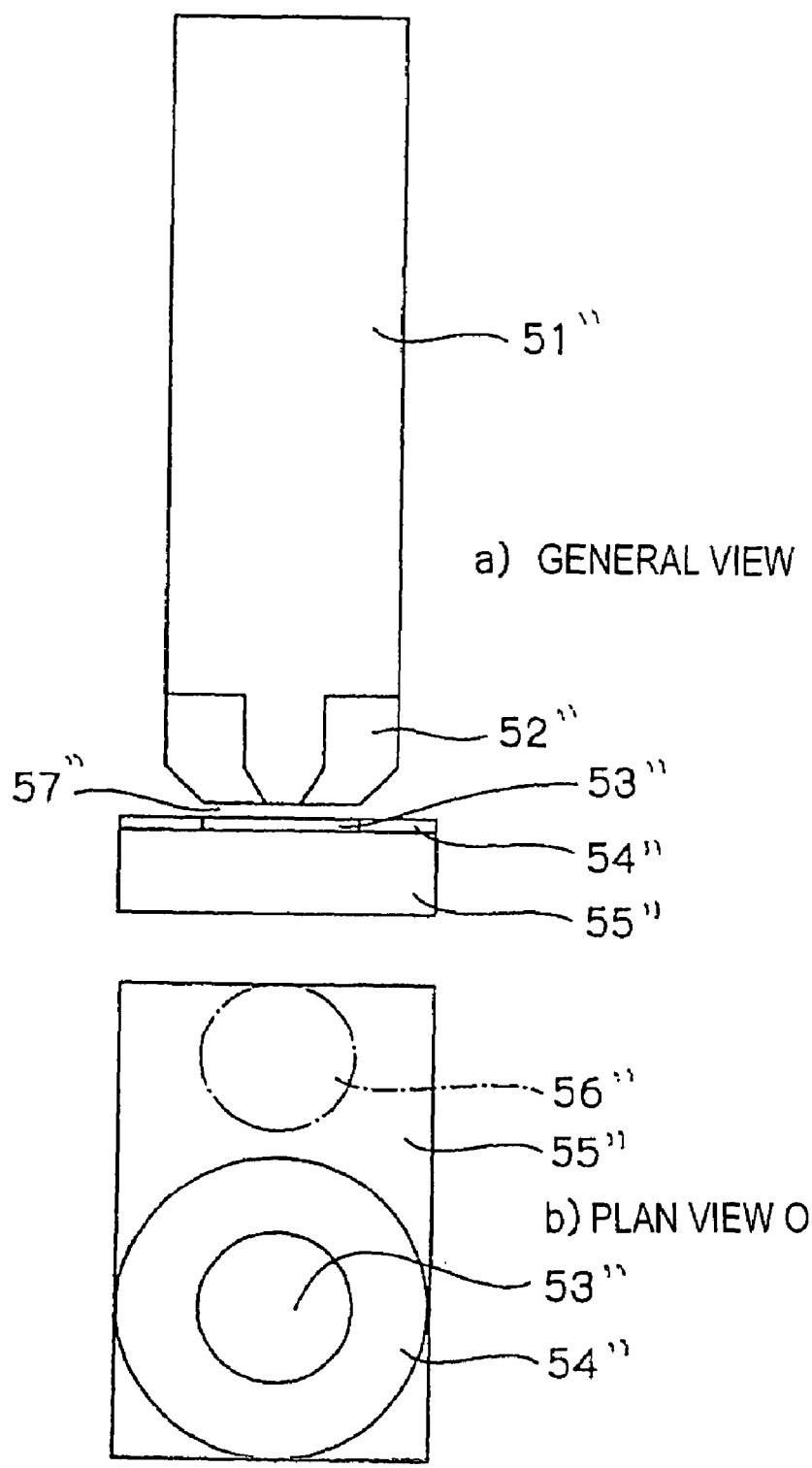
FIG. 22 is a schematic diagram illustrating a second embodiment of the second invention.

FIG. 22 is a schematic diagram illustrating a defect inspection apparatus of an electron beam system equipped with a differential exhausting mechanism, which is included in the semiconductor manufacturing apparatus according to the second embodiment of the second invention. In this figure, only main components including an optical column 51" of the electron beam defect inspection apparatus, a differential exhausting section 52", a guard ring 54" and a moving stage 55" are shown, but other components including a control system, a power system, an exhausting system and so on are omitted. A wafer 53" to be treated as a sample is fixed on the moving stage 55" as surrounded by the guard ring 54". The guard ring 54" is made to have the same height (thickness) as that of the wafer 53", thereby allowing for a minute clearance 57" between a tip of the differential exhausting section 52" and the wafer 53" as well as the guard ring 54" not to vary even during a moving operation of the stage. An area on the moving stage 55" other than an area occupied by the guard ring 54" and the wafer 53" is also made flush with the wafer. A loading/unloading operation of the wafer is performed at a position where a center of a wafer exchange position 56" on the stage 55" matches with a center of the inspection apparatus. According to a procedure in a method for unloading the wafer, the wafer is lifted up by three pins capable of moving up and down of the moving stage 55", and a hand of a transfer robot is inserted under the wafer and lifted up to catch the wafer, and then the wafer is transferred. A loading operation of the wafer can be performed in an inverse sequence to that for unloading the wafer.

Figure 23:
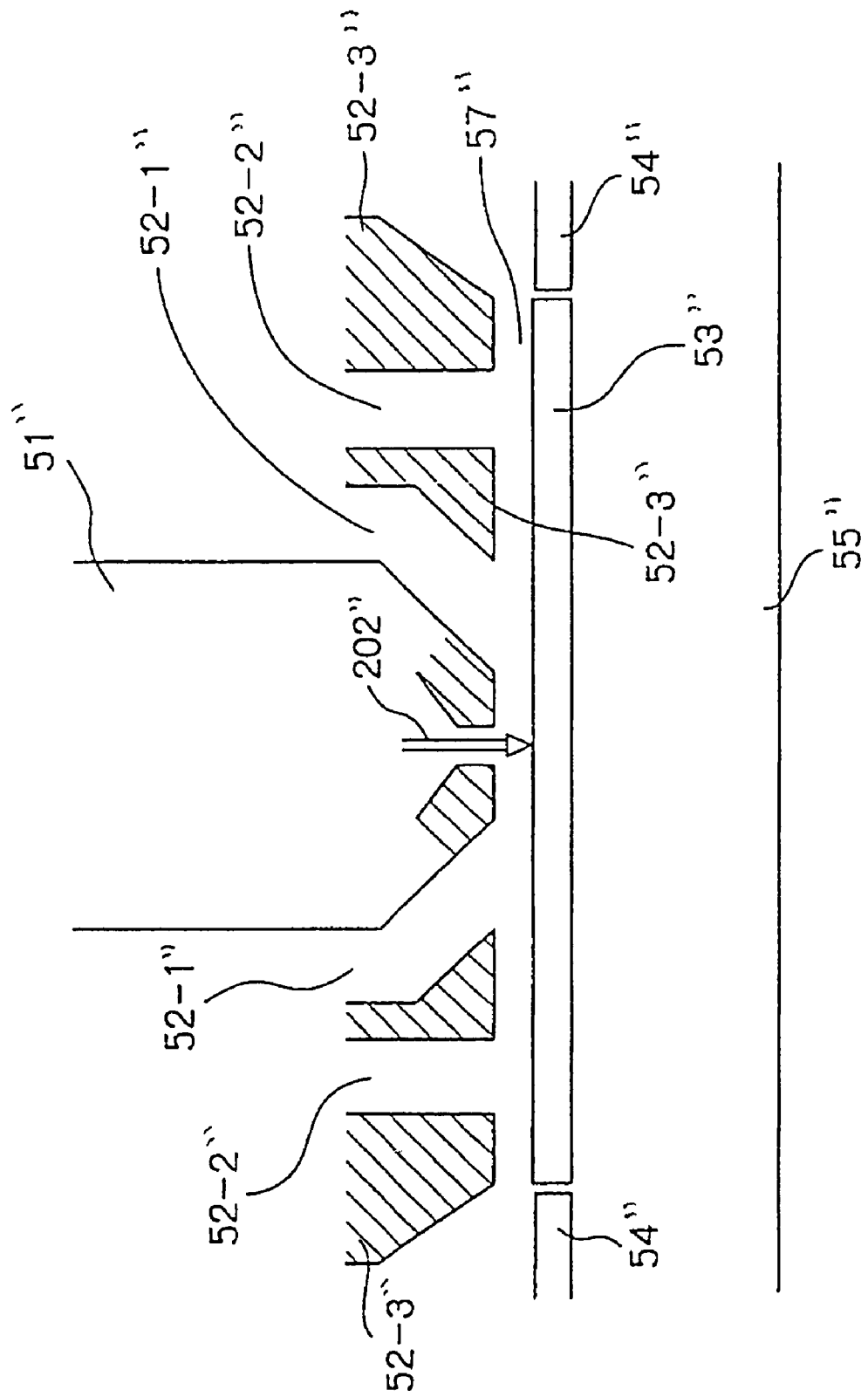
FIG. 23 is a schematic diagram illustrating a differential exhausting section.

FIG. 23 is a schematic diagram illustrating the differential exhausting section 52" of FIG. 22. A differential exhausting body (52–3") of the differential exhausting section 52" is provided with an exhaust port II (52-1") and an exhaust port II (52-2"), which are arranged concentrically, wherein the exhaust port I is exhausted by a broad band turbo-molecular pump and the exhaust port II is exhausted by a dry pump. Though not shown in this figure, an exit of electron beam 202" (an entrance for secondary electrons) is configured to be a bore of φ1 mm×1 mm long, thereby accomplishing a small conductance. The minute clearance 57" is maintained to be typically at most 0.05 mm (preferably at most 0.01 mm) by controlling the height of the stage 55". As a result of an exhausting operation by coupling the differential exhausting section with a dry pump having an exhausting rate of 1000 litter/min and a turbo-molecular pump having an exhausting rate of 1000 litter/sec, a pressure of $10^{-3}$ Pa and a pressure of $10^{-4}$ Pa were obtained in the electron beam irradiation section and in the vicinity of the electron beam exit within the optical column, respectively.

Figure 24:
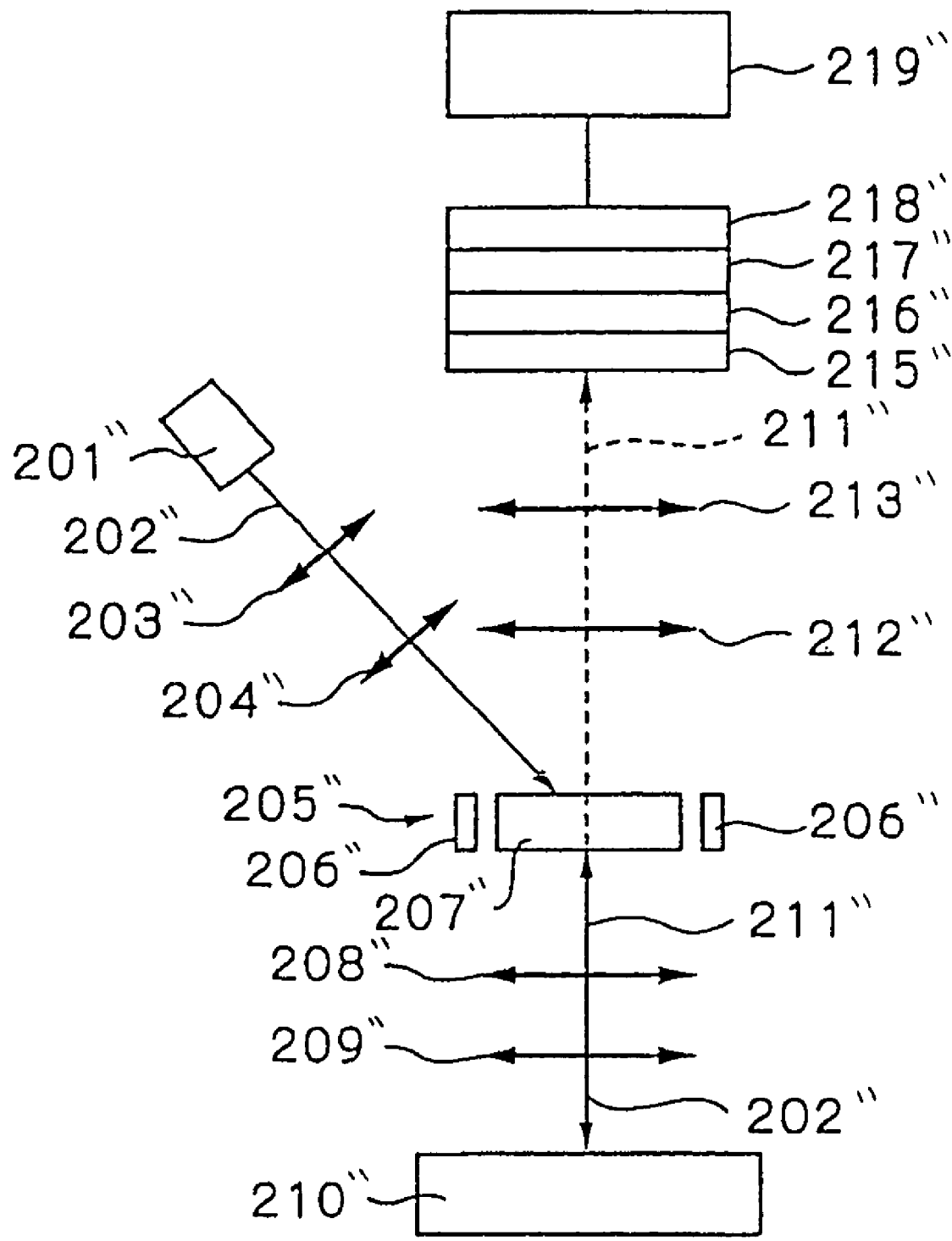
FIG. 24 is a schematic diagram illustrating a third embodiment of the second invention.

FIG. 24 is a schematic diagram illustrating a third embodiment. This is an embodiment in which an image projection-type electron beam inspection apparatus is used as an electron beam defect inspection apparatus. It is to be noted that a differential exhausting section is omitted in this figure. A primary electron beam 202" emitted from an electron gun 201" is shaped properly in a rectangular aperture and formed into an image of a 0.5 mm×0.125 mm rectangle on a deflection central plane of an E×B filter 205" with aid of a two-stage arrangement of lenses 203" and 204". The E×B filter 205", which is also called the Wien filter, comprises an electrode 206" and a magnet 207" arranged to have a structure in which an electric field and a magnetic field are crossed at a right angle, and thus functions to deflect the primary electron beam 202" by an angle of 35° toward a direction of sample 210" (a direction vertical to the sample), while allowing for a secondary electron beam from the sample to pass through straight ahead. The primary electron beam 202" deflected by the E×B filter 205" is contracted to be ⅔ in its size by lenses 208" and 209", and then projected onto the sample 210". Secondary electrons 211" emanated from the sample 210", which contain information of a pattern image, are after having been magnified by the lenses 209" and 208", advanced straight through the E×B filter 205", magnified by lenses 212" and 213", intensified by 10,000 times by an MCP (Micro Channel Plate) and converted into light by a scintillator screen 216", and thus converted light passes through a relay optical system 217" and enters a TDI-CCD 218" where the light is converted into an electric signal synchronized with a scanning rate of the sample, which is in turn captured by an image display 219" as a series of images. Further, the series of images are compared on time to a plurality of cell images as well as a plurality of die images to thereby detect a defective portion on a surface of the sample (e.g., wafer). Further, a feature such as a shape, a position coordinate and a number of detected defects are recorded and output onto a CRT, for example. On one hand, for various kinds of sample substrates, a defect may be detected in such a way that an appropriate condition is selected for each different sample substrate depending on a difference in a surface structure, such as an oxide film or a nitride film or a difference in a preceding step of processing, and then the electron beam is irradiated in accordance with this selected condition, wherein after irradiation provided under an optimal irradiation condition, an image by the electron beam is obtained so as to detect the defect.

Figure 25:
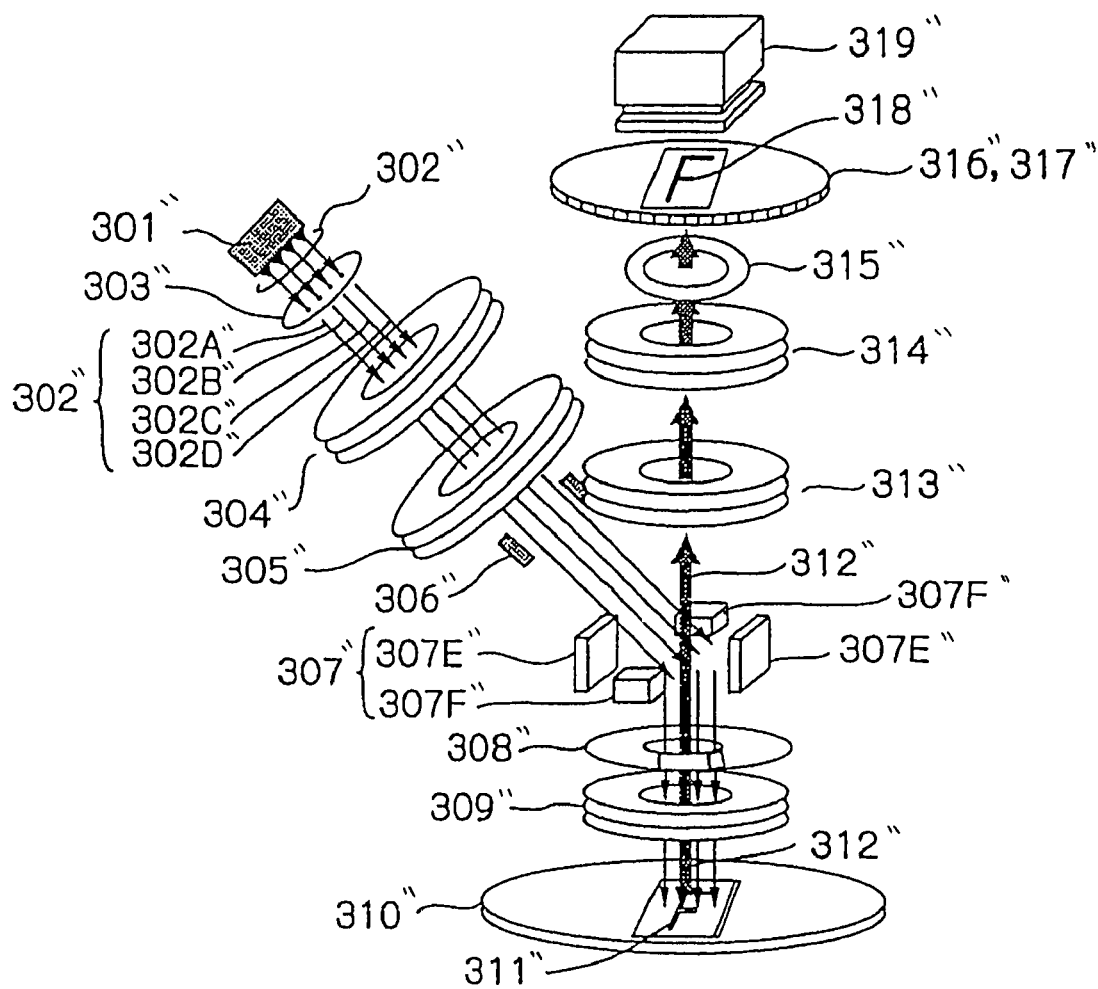
FIG. 25 is a schematic diagram illustrating a fourth embodiment of the second invention.

FIG. 25 is a schematic diagram illustrating a configuration of a fourth embodiment according to the second invention.

Four primary electron beams 302" (302A", 302B", 302C" and 302D") emitted from an electron gun 301" are shaped properly by an aperture 303" and formed into respective images each having a 10 μm×12 μm elliptical shape on a deflection central plane of an E×B filter 307" by a two-stage arrangement of lenses 304" and 305", wherein these electron beams are controlled by a deflector 306" to perform a raster scanning motion along a direction vertical to a sheet surface of the figure so that they may be irradiated as a whole to cover a rectangular area of 1 mm×0.25 mm uniformly. Herein the four primary electron beams 302" deflected by the E×B filter 307" are formed into a crossover in an NA aperture 308", contracted to ⅕ in its size by a lens 309" and irradiated/projected onto a sample (wafer) 310" to cover an area of 200 μm×50 μm in a direction substantially vertical to the sample. Four secondary electron beams 312" emitted from the sample 310", which contain information of a pattern image (sample image 311"), are magnified by lenses 309", 313" and 314", applied with an angle compensation for a direction of serial movement of the sample and a direction of integration row of TDI-CCD 319" by a magnetic lens 315", and formed into a rectangular image (magnified projection image 318") resultant from these synthesized four secondary electron beams 312" as a whole onto an MCP 316". This magnified projection image 318" is intensified on the order of 10,000 times by the MCP 316", converted into light by a scintillator screen 317", further converted into an electric signal synchronized with a serially moving rate of the sample by the TDI-CCD 319", captured as a series of images by an image display section (not shown) and then output onto a CRT, for example, or stored in a memory device. From this image, a defect may be detected through cell comparison or die comparison, and the position coordinate, size or type thereof may be classified for further storing, displaying and outputting operations.

Figure 26:
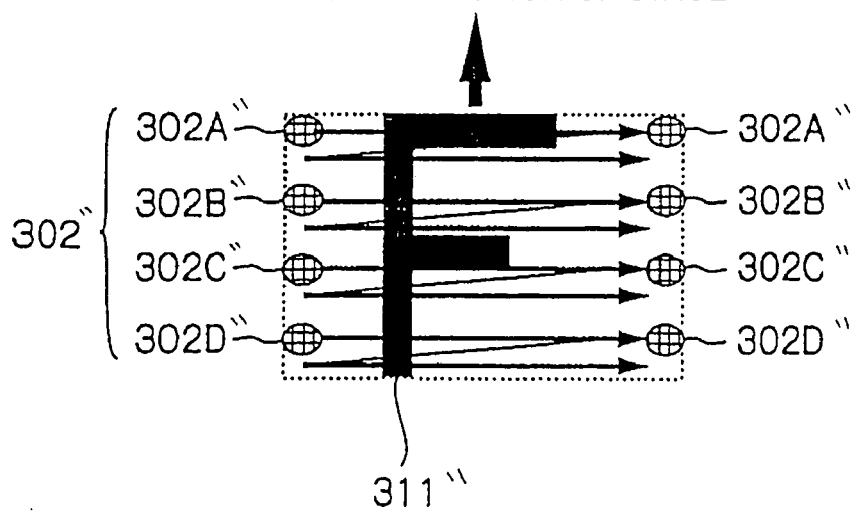
FIG. 26 is a schematic diagram illustrating an electron beam irradiation method of FIG. 25.

FIG. 26 shows a method for irradiating a primary electron beam according to the present embodiment. The primary electron beam 302" consists of the four electron beams 302A", 302B", 302C" and 302D", each beam assuming a 10 μm×12 μm elliptical shape. Each one of these beams can raster-scan a rectangular area of 200 μm×12.5 μm, and thus collectively cover a rectangular irradiation area of 200 μm×50 μm without overlapping one another. In the present embodiment, with unevenness in irradiation on the order of ±3% for the primary electron beams, and a irradiation current of 250 μA per each electron beam, a total irradiation current of 1000 μA by the four electron beams could be obtained as a whole on a surface of the sample. By increasing a number of electron beams, the current can be increased more and thereby a higher throughput will be obtained.

Though not shown in FIG. 26, the present apparatus further comprises in addition to the lenses, a limited field stop, a deflector (aligner) having four or more poles for aligning a trajectory of the electron beams, an astigmatism compensator (stigmeter) and a plurality of quadrupole lens (four-pole lens) for shaping the beams properly, and so on, which are units required for illumination and image formation of the electron beams.

It is required that the electron beam irradiation section irradiates the sample surface with the electron beams in a rectangular or an elliptical shape as uniformly as possible with reduced unevenness of irradiation, and it is also requested to provide the electron beam irradiation to the irradiation area with a higher current in order to increase throughput. A related electron beam irradiation system has such high irradiation unevenness as ±10%, and an electron beam irradiation current of about 500 nA, in the irradiation area. In addition, the related system has suffered from a problem in that it is susceptible to a failure of image formation due to charge-up which is caused by applying the electron beam irradiation all at once over a large image observation area, as compared to a scanning-type electron beam microscope (SEM) system, but the method according to the present invention in which a plurality of electron beams is used to scan and irradiate the sample could have reduced irradiation unevenness on the order of ⅓ of that of the related system. As for the total irradiation current on the sample surface, two or more times as high a current value could be obtained by using the four electron beams. By increasing the number of electron beams, for example, up to sixteen, which may be reached easily, a further high current can be achieved to thus obtain a higher throughput. Further, since a raster scanning operation by relatively narrow beams helps release charges on the sample surface, a charge-up could be reduced to at most 1/10 as compared to block irradiation.

The example of the electron beam defect inspection apparatus of an image-projection system has been described as with this embodiment, and without any trouble, the defect inspection apparatus of a scanning-type electron microscope system (SEM system) may be used also.

Figure 27:
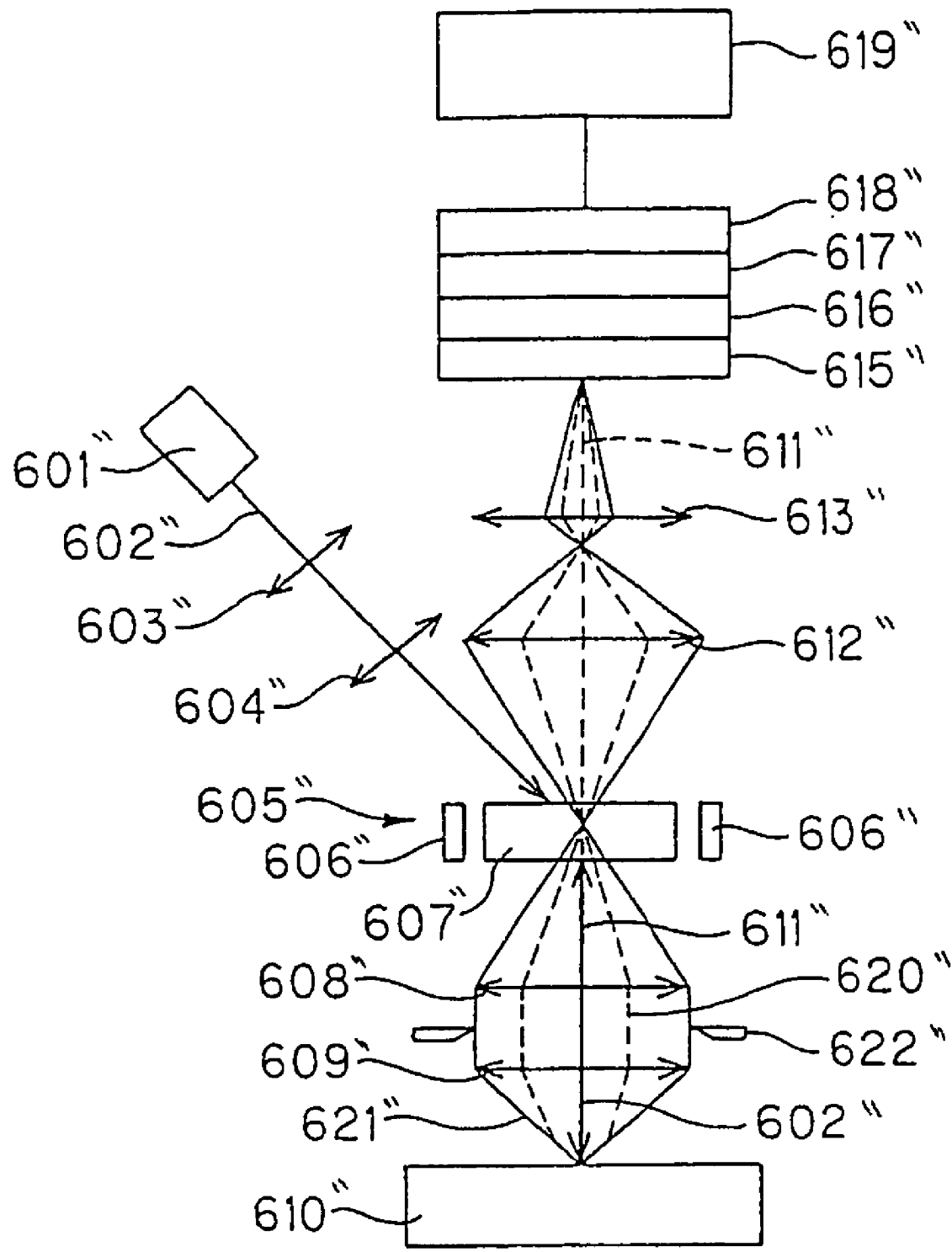
FIG. 27 is a schematic diagram illustrating an optical system of an electron microscope of image projection type using back-scattered electrons.
Figure 28:
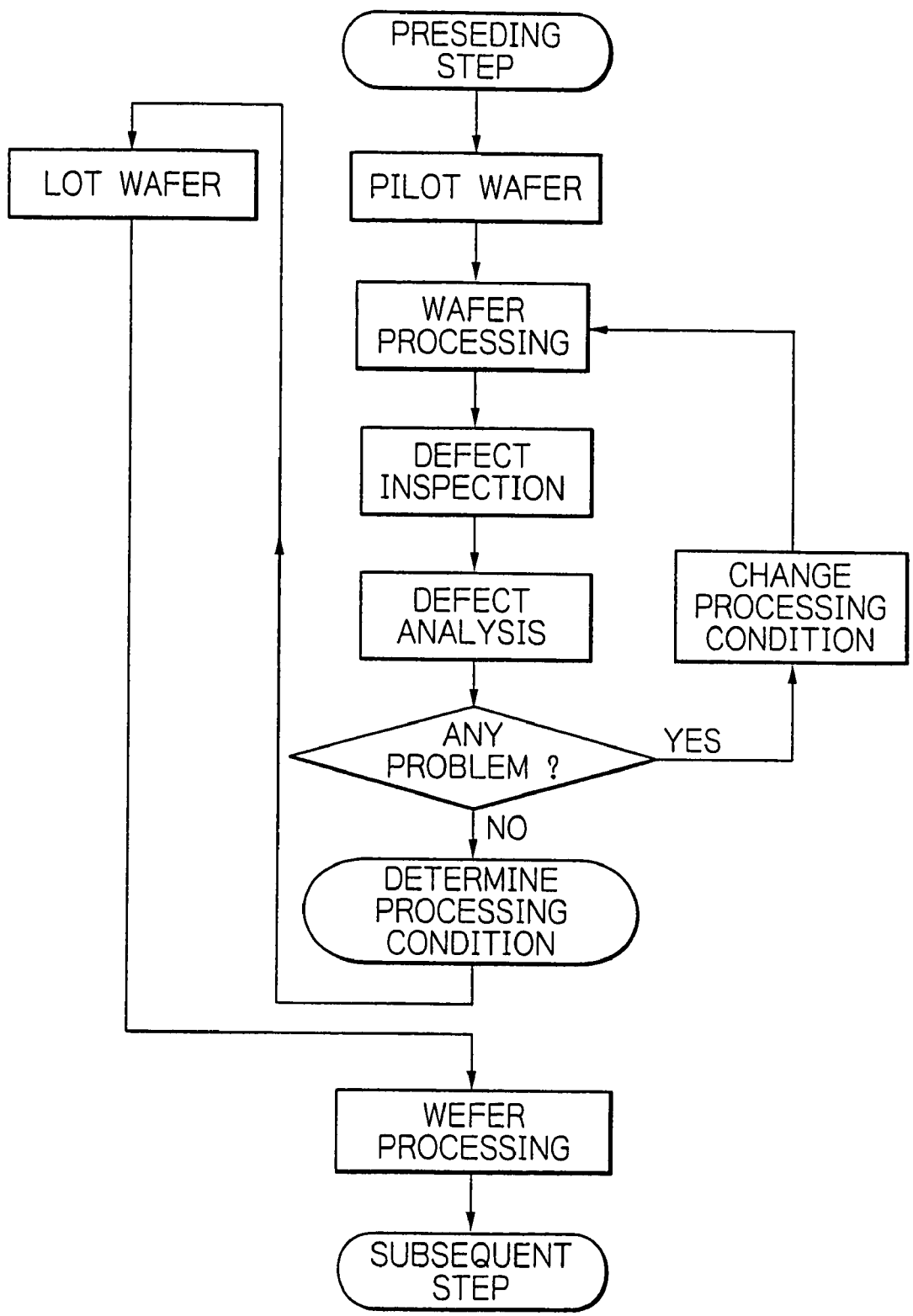
FIG. 28 is a flow chart illustrating an embodiment of a method of processing by using a system according to an embodiment of the second invention.

FIG. 27 shows a defect inspection apparatus employing an image projection optical system according to a fifth embodiment of the second invention. This embodiment uses back-scattered electrons.

All of the components including electron gun 601" to image display section 619" are the same as those in FIG. 24, and accordingly those components designated by reference numerals 201" to 219" in FIG. 24 are indicated by 601" to 619" respectively in FIG. 27. The embodiment of FIG. 27 is different from the embodiment of FIG. 24 only in an orbit of electron beams, wherein orbit 620" of secondary electron beams is, as shown in dotted lines, emitted at a large emission angle from sample 610" and accelerated in an accelerating electric field produced by objective lens 609", and thereby converged into a small beam bundle to enter the objective lens 609". On the other hand, since back-scattered electrons 621" advance substantially straight ahead in a direction of emission, an aperture diameter of an aperture 622" for limiting the beam has been made larger so as to obtain a signal having a sufficient S/N ratio. Since the back-scattered electrons have a relatively smaller energy width of the beam, $\Delta V$, as compared to the secondary electrons, even with a somehow larger diameter of the aperture 622", an aberration can be reduced satisfactorily.

An electron beam system according to an embodiment of a third invention and a device manufacturing method using such a system will now be described.

The embodiment of the third invention relates to an electron beam system for providing an evaluation of a sample having a pattern with a minimum line width equal to at most 0.1 μm with high throughput and high reliability, and further to a device manufacturing method using such a system.

Conventionally, in a defect inspection process of a variety of masks such as a stencil mask or a photo mask process, inspection has been performed in such a manner that a primary electron beam is directed to a sample, and secondary electrons emanated from the sample are magnified as an image, which is in turn detected by a CCD detector or a TDI detector so as to perform an inspecting operation (optical type inspection). Further, such an electron beam system has been known. The preceding patent applications are listed below:

Japanese Patent Laid-open Publication No. Hei 11-132975

Japanese Patent Laid-open Publication No. Hei 7-249393

Japanese Patent Application No. 2000-193104

Japanese Patent Application No. 2000-229101

In an electron beam system according to this related art, since transmissivity of a secondary electron in a secondary optical system is rather low, a large quantity of a primary electron beam has to be applied in order to obtain an image having a necessary S/N ratio, which causes a problem in that a sample surface is charged. Besides, there has been another problem in conjunction with an effort to improve transmissivity in that the beam is seriously unfocused and contrast of the image is deteriorated.

The embodiment according to the third invention is directed to provide an electron beam system that can solve the above problems.

First of all, an outline of the electron beam system according to the embodiment of the third invention will be described.

Figure 30:
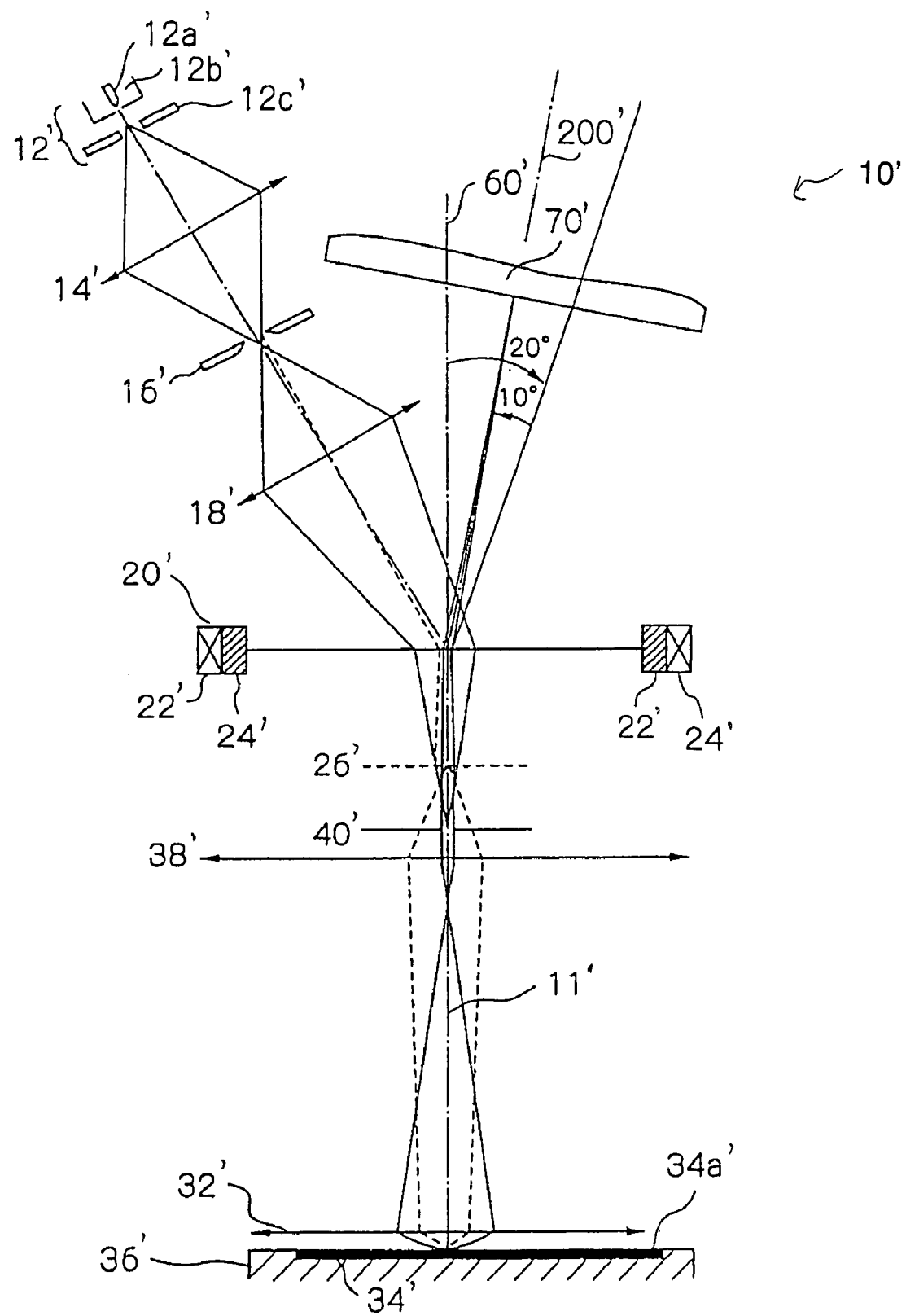
FIG. 30 is a detail view illustrating a part of the electron beam system according to the first embodiment of the third invention.

[1] (FIG. 30: conjugate relationship: crossover produced by an electron gun 12'-NA aperture 40'-principle plane of an objective lens 32')

The present embodiment is an electron beam system, in which a primary electron beam emitted from an electron gun is directed to a surface of a sample prepared as an object to be inspected, and an electron image formed by secondary electrons emanated from the sample is magnified and detected. The system further comprises an NA aperture disposed on a common path to both of the primary and secondary electron beams, and an electron lens in the vicinity of the sample surface, wherein a crossover produced by the electron gun and a principle plane of the electron lens and the NA aperture are in a conjugate relationship with respect to one another.

[2] Preferably, an NA aperture image may be formed on or in the vicinity of the principle plane of the electron lens by an electron lens 38' disposed on the electron lens side of the NA aperture.

[3] Further, a shaping aperture is arranged in a path of the primary electron beam, wherein the shaping aperture and the sample surface are conjugate surfaces, and the crossover of the electron gun by the primary electron beam is formed in the NA aperture and on the objective lens principle plane. Since this helps make aberration low, allowing for a larger NA aperture with the same level of aberration and thus a higher transmissivity of secondary electrons, an image having a satisfactory S/N ratio can be obtained even with a small quantity of the primary electron beam.

According to the present embodiment, the crossover image, the NA aperture and the objective lens principle plane are conjugate, and the shaping aperture and the sample surface are conjugate.

[4/5] (Beam shape and its intensity)

Figure 31:
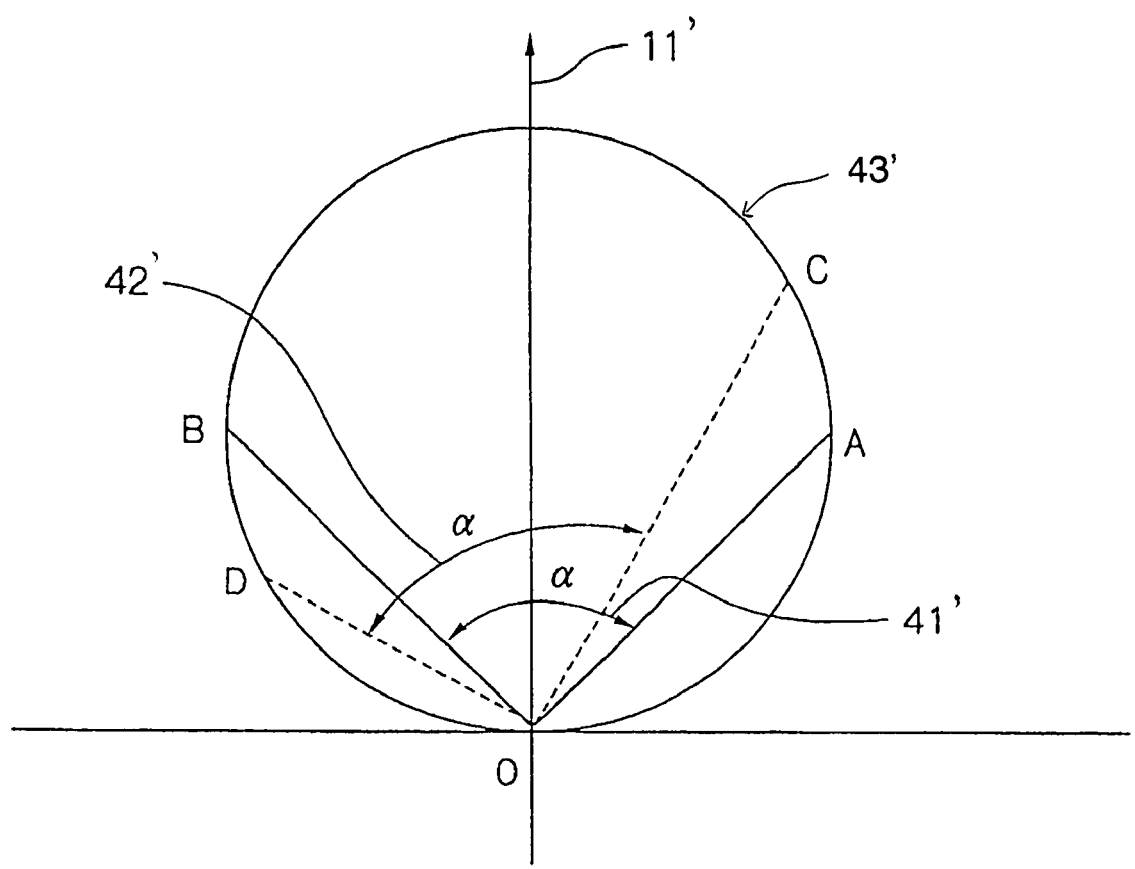
FIG. 31 is an explanatory diagram for a cosine law.

As described above, the present embodiment is configured such that the image of the NA aperture is formed in the vicinity of the principle plane of the electron lens disposed closely to the sample surface. FIG. 30 shows its configuration. In FIG. 30, the electron lens is designated by reference numeral 32', which is hereafter referred to as an objective lens 32'. With the configuration described above, the secondary electrons emanated from the sample surface 34a' and passing through the NA aperture 40' are exclusively guided into a secondary optical system and detected therein. FIG. 31 shows that illustratively.

The secondary electrons from the sample are emanated in accordance with the cosine law as indicated by reference numeral 43'. Specifically, intensity of the secondary electrons emanated in a direction at an arbitrary angle from point of emanation "O" is proportional to a distance from the point of emanation O to an intersection point with a circumference indicated by reference numeral 43'. Accordingly, a quantity of secondary electrons which can be received by the secondary optical system among those secondary electrons emanated from a center of the field of view of the sample is proportional to a volume surrounded by an inverse cone indicated by reference numeral 41' and a spherical shape defined by the cosine law (one section of which is indicated by circumference 43'). On one hand, the secondary electrons which can be received by the secondary optical system among those secondary electrons emanated from the right end of the field of view are within a range of an inverse cone indicated by reference numeral 42'.

The cone 41' and the cone 42' have the same apex angle α, but the volume of the cone 41' is larger than that of the cone 42'. Cone 41' includes a circular arc "AB", while cone 42" includes a circular arc "CD". From a comparison of these two cones (41', 42'), the secondary electrons emanated from the right end are less than those emanated from the center (on optical axis 11') of the sample 34'. Consequently, the secondary electron beam on the optical axis 11' tends to be brighter, while those off from the optical axis 11' tends to be darker.

In light of the above fact, the present embodiment provides an electron beam system in which a primary electron beam is irradiated to a sample surface, and secondary electrons emanated from the sample are magnified and detected, wherein a beam configuration of the primary electron beam entering the sample surface is controlled to have such a distribution that its intensity is low in the vicinity of the optical axis and high in a location away from the optical axis. Similarly, in the present embodiment, the electron beam system is characterized in that the beam configuration of the primary electron beam entering the sample surface is controlled to have such a distribution that its intensity is low in the vicinity of the optical axis and high in the location away from the optical axis. With this configuration, distribution of the secondary electrons that can be received by the secondary optical system is no longer dependent on the distance from the optical axis but is uniform, and therefore detection signal intensity will be also uniform without depending on the distance from the optical axis.

[6/7] (Position of E×B separator)

Further, the present embodiment provides an electron beam system in which, in order to reduce distortion aberration of an image to be detected, a primary electron beam is directed to a sample surface vertically with aid of an E×B separator, secondary electrons emanated from the sample surface are magnified by using at least a two-stage arrangement of electron lenses as an image to be detected, wherein the E×B separator is disposed between an electron lens in a location most downstream in a path of the secondary electron beam and a detector. Similarly, in the present embodiment, the electron beam system is characterized in that at least a two-stage arrangement of electron lenses are disposed in the path of the secondary electrons, wherein the E×B separator is disposed between the electron lens located on a downstream side of the two-stage arrangement of electron lenses and the detector.

[8/9] (Deflection by magnetic field is two times as much as that by an electric field)

The E×B separator has a function for deflecting an electron beam passing therethrough into an arbitrary direction. However, a degree of this deflection is subtly different in dependence on energy of the electron beam. Generally, an electron beam having lower energy tends to be deflected to a greater degree.

Herein, the present embodiment provides an electron beam system, in which a primary electron beam is directed to a sample surface vertically with aid of an E×B separator, and secondary electrons emanated from the sample surface are magnified as an image to be detected, wherein the E×B separator defines an amount of deflection caused by a magnetic field to be about two times as much as that by an electric field. With this configuration, even if the energy of the electron beam passing through the E×B separator varies, the electron beam may be deflected in the same direction within a range of approximation. Resultantly, the detector can obtain a secondary electron beam of better resolution.

[10] According to a specific configuration of the illustrated embodiment, the electron beam system is characterized in that the E×B separator has been set to deflect the secondary electrons with a potential as high as about 4000 ev, and also to deflect the secondary electron beam at an angle of 7° to 15° relative to the optical axis of the secondary electron beam.

Figure 34:
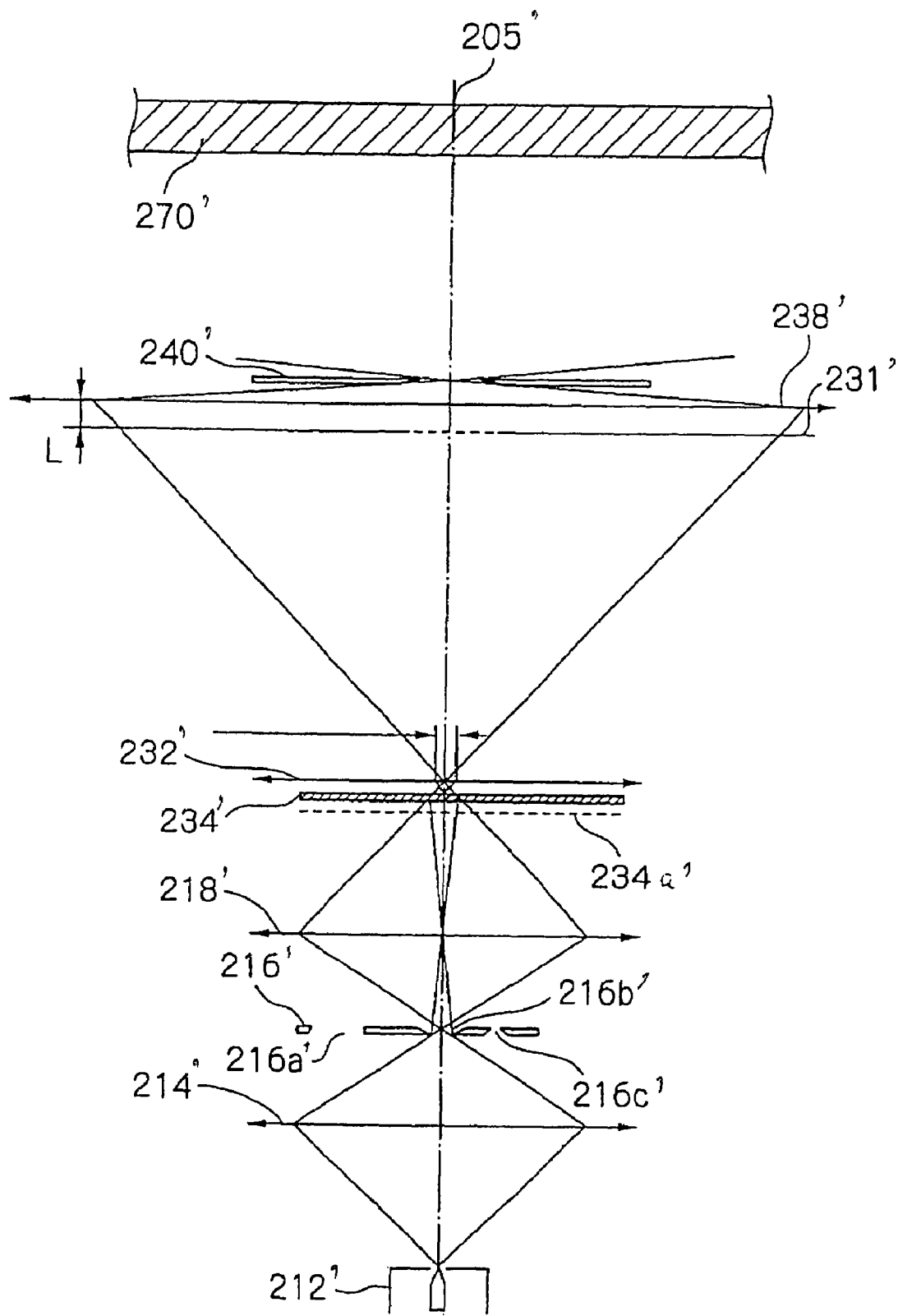
FIG. 34 is a detail view illustrating a part of an electron beam system of a second embodiment of the third invention.

[11] (FIG. 34: Conjugate relationship, crossover produced by electron gun 212'-objective lens 232'—NA aperture 240')

Further, the present embodiment may be implemented as an electron beam system applicable to inspection of a mask. The present embodiment provides an electron beam system, in which a primary electron beam emitted from an electron gun is transmitted through a sample prepared as an object to be inspected, and an electron image formed by a transmission electron beam having passed through the sample is magnified and detected, wherein an NA aperture is disposed in a path of the transmission electron beam, an electron lens is disposed in the vicinity of the sample, and a crossover produced by the electron gun and the electron lens and the NA aperture are in conjugate relationships relative to one another with respect to the primary electron beam and the transmission electron beam.

[12] Preferably, the electron beam system is characterized in that a crossover image of the electron gun by the transmission electron beam is formed on or in the vicinity of a principle plane of the electron lens.

[13] (Another conjugate relationship: shaping aperture 216'—sample 234')

Further, the electron beam system is characterized in that a shaping aperture is disposed in the path of the primary electron beam, and the shaping aperture and the sample are positioned in a conjugate relationship with respect to the primary electron beam, wherein an image of the shaping aperture by the primary optical system is formed on the sample surface.

With this configuration, since the electron beam is irradiated exclusively to a necessary and sufficient area, a temperature increase and damage by radiation in the sample can be limited to a minimal level. This makes it possible to obtain an image having a sufficient S/N ratio even with a small quantity of the primary electron beam.

[14/15](Magnified image formed before two-stage of lenses)

Further, there is provided an electron beam system in which secondary electrons emanated from a sample surface or an image of electrons having passed through the sample is magnified by at least a two-stage arrangement of electron lenses and detected, wherein a distortion aberration or a transverse chromatic aberration can be reduced by adjusting a position of the magnified image produced by the electron lens of the first stage so as to match with a certain position upstream of the electron lens of the second stage. Similarly, the electron beam system is characterized in that at least a two-stage arrangement of electron lenses is disposed in the path of the transmission electron beam, wherein a position of the magnified image produced by the electron lens of the first stage is matched with a certain position upstream of the electron lens of the second stage. With this configuration, distortion aberration of the detected image may be reduced.

[16/17] (Compensation parameter optimization)

There is provided an electron beam system in which a primary electron beam is irradiated to a sample and an image of secondary electrons emanated from the sample, or an image of transmission electrons having passed through the sample, is magnified as an image to be detected, or an electron beam system as described above, wherein the system is characterized in that a distortion aberration of the image is simulated by calculation so as to determine a difference in distortion aberration between absolute values of a third and a fifth order thereof, with a compensation parameter being optimized such that the difference may be minimized or the absolute value of the fifth order may be greater than that of the third order by 5–15%, and in response to this optimized compensation parameter, a position of the magnified image produced by the electron lens of the first stage may be set.

[18/19] (Tuning of magnification, displacement of sample position)

Currently, two different types of a stencil mask may be considered. One is a mask used in a projection system for reducing an image of the mask to a quarter image on a wafer, while the other is a mask used in a 1:1 projection lithography. The former does not require such a high resolution, but a mask area is as large as 25 mm×40 mm×16=16000 mm$^2$. In contrast, the latter has a mask area as small as 25 mm×40 mm=1000 mm$^2$, but a high resolution is required.

In order to inspect two different types of stencil masks described above, it is important to make variable a magnification of an image of transmission electrons having passed through the stencil mask. For changing the magnification without degrading aberration, it has become apparent from simulation that preferably a distance between a stencil mask 28' and an objective lens 29' serving as a magnifying lens, or a working distance 31', should be changed.

In this regard, the present embodiment provides an electron beam system in which electrons having passed through a sample are magnified, as a transmission electron image, by an electron lens disposed close to the sample so as to be detected by either one of a CCD, a TDI or an EBCCD, wherein when magnification for magnifying the transmission electron image is to be changed, a distance between the sample and the objective lens is changed. Similarly, the electron beam system is characterized in that an adjusting means for changing a distance between the electron lens disposed close to the sample and the sample is provided to cope with a case where one sample is to be changed to another sample having a different resolution. With this configuration, the magnification of the transmission electron image may be made variable without deteriorating aberration.

[20] (Magnetic lens, gap on the sample side)

For producing a magnified image of secondary electrons or transmission electrons, once a transverse chromatic aberration has been compensated for satisfactorily, an axial chromatic aberration determines an ultimate aberration. Especially, in order to improve transmissivity of the secondary electrons, it is important to reduce the axial chromatic aberration. To this end, the electron beam system is further characterized in that the electron lens disposed in the vicinity of the sample surface includes an electromagnetic lens having a gap of a core located on the sample side. With this configuration, an axial magnetic field distribution may form a maximum value in a location defined on the sample side with respect to location of the gap, which reduces an axial chromatic aberration coefficient.

[21] (Semiconductor device manufacturing method: Checking of wafer)

There is provided a manufacturing method of a semiconductor device, in which the electron beam system described above is used to inspect for any defect of a semiconductor wafer or a sample to be inspected.

A specific example of this manufacturing method of a semiconductor device comprises respective steps as set forth below:

(1) A wafer manufacturing process for manufacturing a wafer (or a wafer preparing process for preparing a wafer).

(2) A mask manufacturing process for fabricating a mask to be used during exposure (or a mask preparing process for preparing a mask).

(3) A chipping process for cutting out chips formed on the wafer one by one to make them operative.

(4) An inspection process for inspecting a finished chip by using the electron beam system.

[22] (Semiconductor device manufacturing method: Checking of the mask)

There is provided a manufacturing method of a semiconductor device, in which a mask that has been inspected for any defect by using the electron beam system described above is used.

A specific example of this manufacturing method of a semiconductor device comprises respective steps as set forth below:

(1) A process for fabricating a mask.

(2) A process for performing an inspection of the fabricated mask by using the electron beam system.

(3) A process for manufacturing a variety of chips by using the mask that has been inspected.

Further, the electron beam system is also applicable to a lithography process in a wafer processing process. In that case, a mask that has been inspected by using the electron beam system is used to form a resist pattern in order to process selectively a thin film layer or a wafer substrate.

Figure 29:
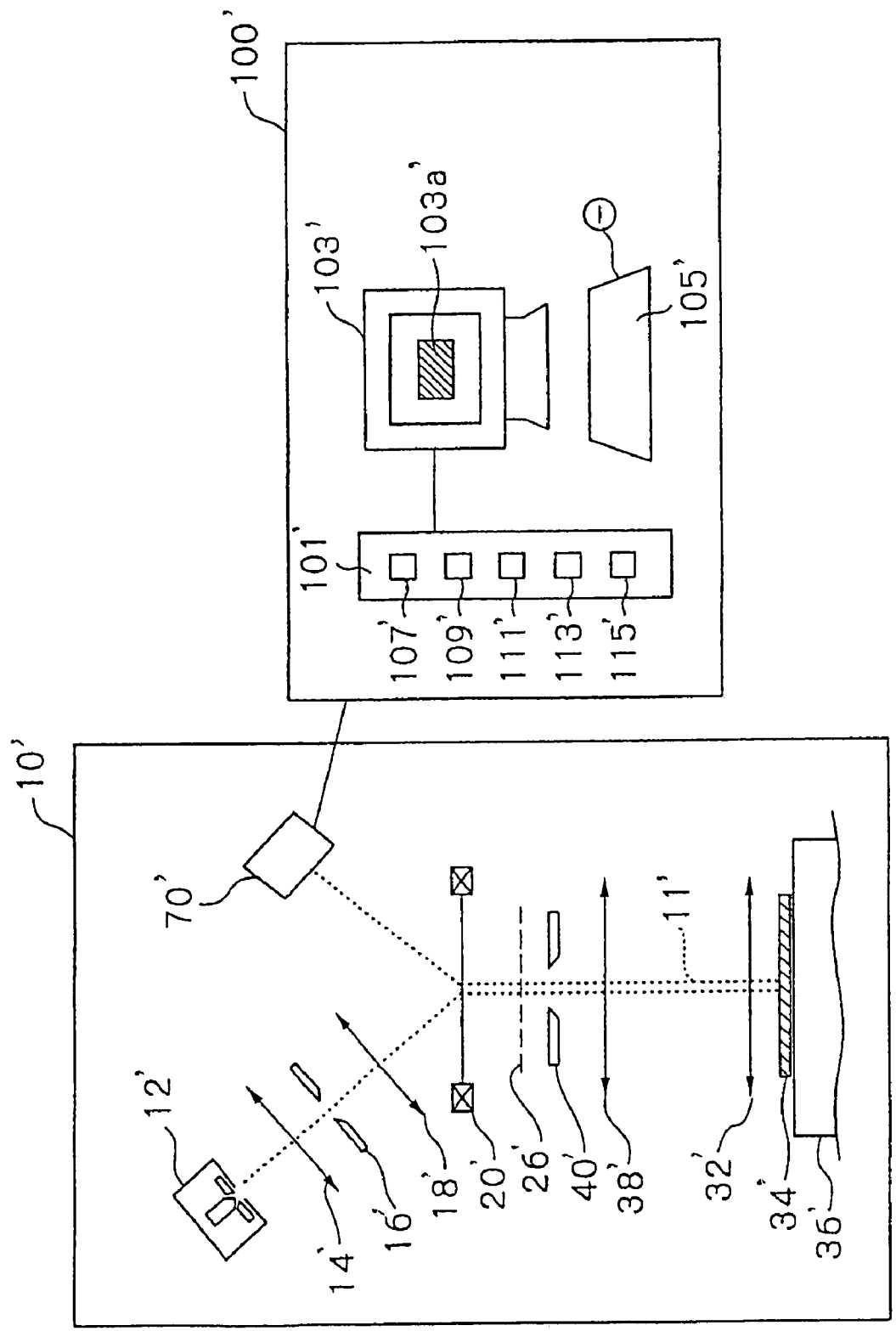
FIG. 29 is a general view of an electron beam system according to a first embodiment of a third invention.

A preferred embodiment of a third invention will now be described in detail with reference to the attached drawings. FIG. 29 shows an electron beam system according to the third invention and an inspection apparatus using the same electron beam system, wherein an electron beam system 10' is shown on the left hand side and a control section 100' is shown on the right hand side of this figure. FIG. 30 shows a detailed configuration of the electron beam system 10'.

(Electron Beam System 10')

The electron beam system 10' comprises, as main components thereof, an electron gun 12', for emitting an electron beam, and other components disposed on a downstream side of the electron gun 12', including: a shaping aperture 16' for shaping the electron beam into a desired rectangular shape; an E×B separator 20' for separating a secondary electron beam from a primary electron beam; an electron lens (a magnifying lens 38') having a function for magnifying a focused electron beam; a sample 34' and a sample table 36' carrying the sample 34'; and an electron lens (objective lens 32') disposed in the vicinity of a sample surface 34a' of the sample. Further, an NA aperture 40' is disposed in a primary path and also in a secondary path, and a detector 70' is disposed in the secondary path.

A thermal electron emission type electron gun 12' is employed, which emits electrons by heating a cathode 12a'. An electron cathode (emitter) serving as the cathode has employed lanthanum hexaboride ($LaB_6$). Any other materials may be used therefor so long as they have a high fusion point (i.e., a low vapor pressure at high temperature) as well as a small work function. In the present embodiment, the electron gun 12' comprises a single-crystal $LaB_6$ cathode 12a' having a tip of such a small radius of curvature as 30 μmR, which is operative under a space-charge-limited condition, thereby allowing an electron beam having a higher intensity and a lower shot noise to be emitted. Further, by setting a distance between Wehnelt 12b' and an anode 12c' to be equal to or longer than 8 mm, and additionally determining a condition of an electron gun current to achieve a high brightness, the brightness can reach a value greater than Langmuir limit.

In this context, preferably the electron gun 12' in the present embodiment comprises the thermionic cathode 12a' and is operable under the space-charge-limited condition. Alternatively, such an electron gun with a small electron source image having an FE (Field Emitter), a TFE (Thermal Field Emitter) or a Schottky cathode may be used as the electron gun 12'. It is to be noted that the "space-charge-limited condition" refers to such a condition that a cathode temperature is increased higher than a certain temperature where an emission amount of the electron beam is less susceptible to an effect from the cathode temperature.

A first electron lens, which is defined as a condenser lens 14', is disposed in a direction of emission of the electron gun 12' (a lower right direction in FIG. 30). Further, the shaping aperture 16' and a second electron lens are disposed downstream in the path of the primary electron beam. This second electron lens is defined as an irradiation lens 18'. The primary electron beam emitted from the electron gun 12' is converged by the condenser lens 14' to illuminate the shaping aperture 16'. The primary electron beam is formed, by passing though the shaping aperture 16', into a shaped beam having a desired shape, and is deflected arbitrarily by a deflector (omitted from FIG. 30) to thereby irradiate an area in an inspected region on the sample 34' at a certain moment.

In this embodiment, it is also possible to employ an alternative configuration in which two shaping apertures are disposed along an optical path with a deflector interposed therebetween so as to make a shaped beam variable thus to adjust the irradiation area, wherein a system in which the shaping aperture 16' is substituted with a plurality of apertures of different sizes to adjust the irradiation area mechanically can bring about a merit that can reduce an optical pass.

This embodiment is configured such that the primary electron beam is deflected by one or more deflectors so as to scan the entire sample in cooperation with a moving operation of the stage, and alternatively, a focal length of either one of the respective lenses (14', 18') may be changed to thereby form a crossover image having a small diameter so as to scan the sample surface 34a'. Further alternatively, a plurality of shaping apertures may be provided to form an electron beam having a small diameter by reducing an overlapped area of the apertures, and a thus formed electron beam may be used for registration through its scanning operation.

Preferably, the irradiation area of the electron beam that passes through the shaping aperture 16' and irradiates the sample 34' may be specified as a rectangular shape having long sides and short sides. In this case, image formations in long side directions of the irradiation area are performed simultaneously, wherein by moving the sample table 36' in a short side direction, a continuous movement of the irradiation area in the short side direction is performed. Since inspection is performed while moving the sample table 36' continuously, the inspection can be achieved with a high throughput even with a narrow width of a main field of view.

The E×B separator 20' is disposed in a location downstream of the irradiation lens 18'. The electron beam that has been irradiated diagonally relative to the sample surface 34' is deflected by the E×B separator 20' to be vertical to the sample surface 34a'. An angle of deflection may be appropriately determined, which is within a range of 5° to 30° in this embodiment.

In a location downstream of the E×B separator 20', the NA aperture 40', having a function for reducing an aberration of the secondary optical system, and a doublet lens (a paired electron lens) are arranged. In the doublet lens, for convenience, the one close to the sample 34 is defined as a first stage lens, which is represented by the objective lens 32'. The other one close to the E×B separator 20' is defined as a second stage lens, which is represented by the magnifying lens 38'. Interposed between the E×B separator 20' and the sample 34' are the NA aperture 40', the magnifying lens 38', the objective lens 32' and the sample 34', which are arranged in this sequence.

Once the electron beam is irradiated on the sample surface 34a', secondary electrons are emanated therefrom, and those secondary electrons pass through the doublet lens (32', 38') and the NA aperture 40'. The aberration of the secondary electrons is reduced by the NA aperture 40'. After that, the secondary electron beam is deflected by a predetermined angle with the E×B separator 20'. In this embodiment, the angle of deflection is within a range of 5° to 20° (in FIG. 29, the secondary electron beam is deflected by 10° toward a direction opposite to the electron gun 12'). The detector 70' is arranged to be vertical relative to the direction of the deflected secondary electron beam. The secondary electron beam is irradiated onto the detector 70' vertically.

(Detector 70')

The detector 70' may comprise an MCP (Multi Channel Plate) for multiplying electrons without deteriorating a quality of image and an FOP (Fiber Optical Plate). The MCP and the FOP are arranged in this sequence along the direction of the irradiation of the electron beam. The detector 70' further comprises a vacuum window, an optical lens serving as a relay optical system and a TDI detector serving as a detection sensor having a plurality of pixels.

It is to be noted that the configuration of this detector 70' is not limited to that specified above, and the detector 70' may not comprise the MCP or otherwise it may be configured to include a CCD using elements sensitive to the electron beam (EBCCD).

(Control Section 100')

The control section 100' may be composed of a general-purpose personal computer and the like as illustrated in FIG. 29. This computer comprises a control section main body 101' for performing a variety of control and arithmetic operations according to a predetermined program, a CRT 103' for displaying results of operations of the control section main body 101', and an input section 105' such as a keyboard and/or a mouse to allow an operator to input commands. It is a matter of course that the configuration may employ hardware dedicated for an inspection apparatus or a workstation to serve as the control section 100'.

The control section main body 101' may comprise a CPU, a RAM, a ROM, a hard disk, a variety types of control substrates such as a video substrate and so on, though not shown. An electron image storage area 107' has been allocated on a memory such as the RAM or the hard disk for storing electric signals received from the detector 70', or digital image data of an image by the secondary electron beam emanated from the sample 34'. In addition, a reference image storage section 109' for storing previously a reference image containing no defect therein resides on the hard disk. Further, in addition to the control program for controlling the entire defect inspection apparatus, a defect inspection program 111' has been stored on the hard disk for reading the electron image data from the storage area 107' and detecting automatically a defect of the sample 34' based on the image data according to a predetermined algorithm. This defect inspection program 111' has a function of performing a matching operation of the reference image read out of the reference image storage section 109' with an actually detected electron beam image so as to detect a defective portion automatically, and indicating an alarm to the operator in case of determination that there is a defect existing. Further, this program can perform a matching operation between electron images detected in the identical locations of adjacent chips or between detected images in identical cells at different locations within the same chip. At that time, a display of the electron image 103a' may be indicated on the display section of the CRT 103'.

FEATURE OF THE PRESENT EMBODIMENT (1) Image formation of an NA aperture image

In an electron beam system according to the present embodiment, the NA aperture 40' is disposed in the path common to both of the primary and secondary electron beams. Further, the objective lens 32' is disposed in the vicinity of the sample 34'. Herein, a crossover produced by the electron gun 12', a principle plane of the objective lens 32' and the NA aperture are arranged so as to form a conjugate relationships relative to each other with respect to the primary electron beam. With this arrangement, an electron source image produced by the electron gun 12' is formed into an image in the NA aperture 40', and the image of the NA aperture 40' is further formed into an image on or in the vicinity of the principle plane of the objective lens 32'. Owing to this, the primary electron beam is converged around an optical axis on or in the vicinity of the principle plane of the objective lens 32', thus making a beam flux smaller and thereby reducing aberration.

Further, in this embodiment, the shaping aperture 16' and the sample surface 34a' are designed to be conjugate planes. Besides, a crossover image of the electron gun 12' is formed in the NA aperture 40'. This embodiment, due to the above-specified configuration, satisfies a condition that the electron source image is formed in the NA aperture 40' and the aperture image of the shaping aperture 16' is formed on the sample surface, and it also meets the Koehler illumination condition. With the above configuration, since the image of the NA aperture is formed on the objective lens, a beam flux in the objective lens is made small, thereby achieving a low aberration.

Further, in this embodiment, the primary electron beam satisfies the Koehler illumination condition, and a two-stage arrangement of electron lenses (the objective lens 32', the magnifying lens 38') is constructed. With this configuration, a primary optical system defining a short optical length may be provided.

As described above, the present embodiment employs such a layout that the image by the NA aperture is formed on or in the vicinity of the principle plane of the objective lens 32' serving as the electron lens disposed close to the sample surface. With this configuration, since those secondary electrons directed toward a center of the objective lens 32, including those emanated from a center and also from an edge of the field of view, are exclusively received by the secondary electron system, the beam flux in the objective lens is made small, thereby achieving a low aberration.

A reason why an intensity distribution of the secondary electron is uneven will now be explained based on the cosine law illustrated in FIG. 31.

Secondary electrons from the sample are emanated in accordance with the cosine law as indicated by reference numeral 43'. Specifically, intensity of the secondary electrons emanated in a direction at an arbitrary angle from point of emanation "O" is proportional to a distance from the point of emanation O to an intersection point with a circumference indicated by reference numeral 43'. Accordingly, a quantity of secondary electrons which can be received by the secondary optical system from among those secondary electrons emanated from the center of the field of view of the sample is proportional to a volume surrounded by an inverse cone indicated by reference numeral 41' and a spherical shape defined by the cosine law (one section of which is indicated by the circumference 43'). On one hand, the secondary electrons which can be received by the secondary optical system from among those secondary electrons emanated from the right end of the field of view are within a range of an inverse cone indicated by reference numeral 42'.

The cone 41' and the cone 42' have the same apex angle α, but the volume of the cone 41' is larger than that of the cone 42'. The cone 41' includes a circular arc "AB", while the cone 42' includes a circular arc "CD". From a comparison of those two cones (41', 42'), the secondary electrons emanated from the right end are less than those emanated from the center (on the optical axis 11') of the sample 34'. Consequently, the secondary electron beam on the optical axis 11' tends to be brighter, while those off from the optical axis 11' tends to be darker.

Figure 32:
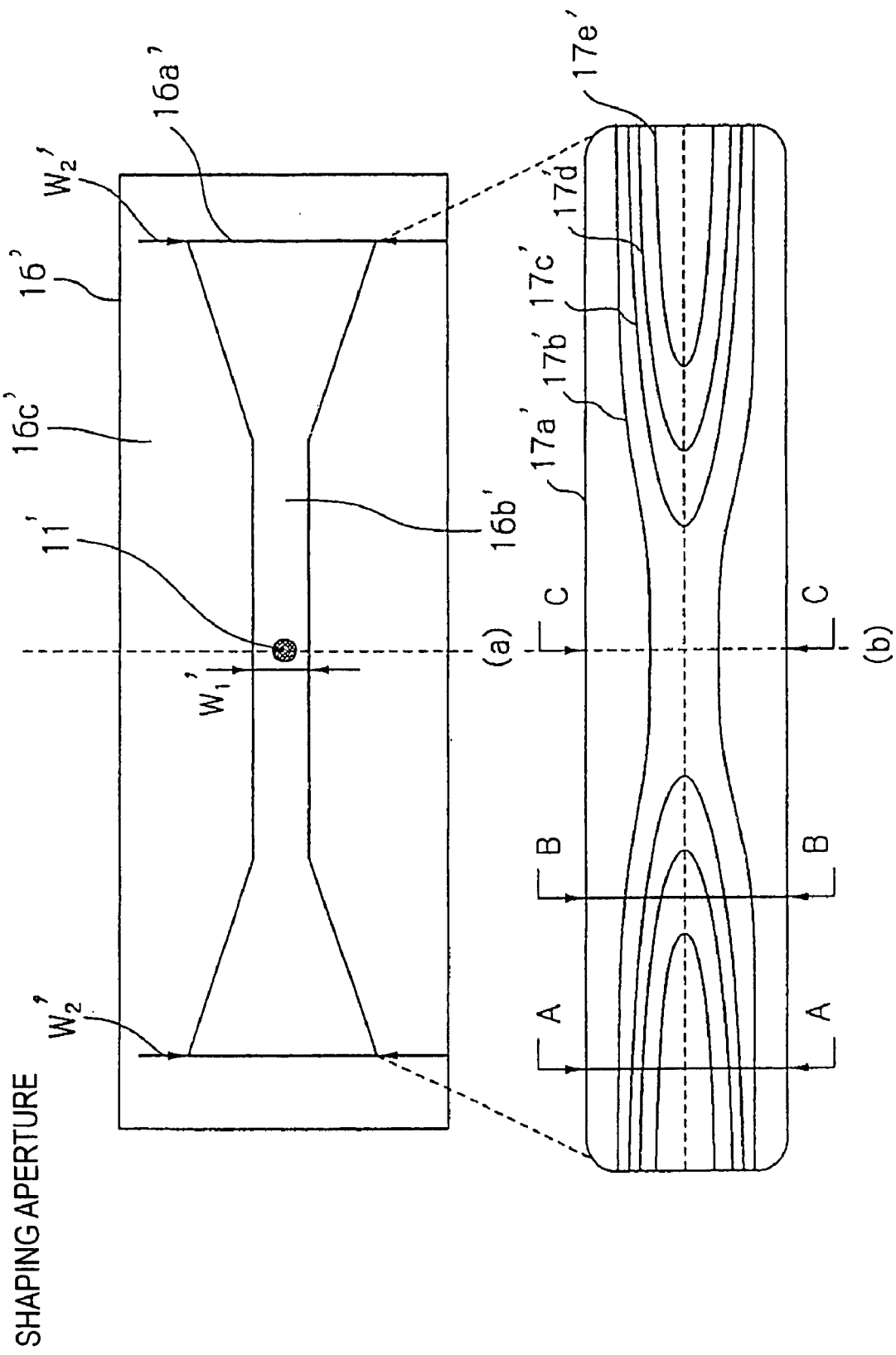
FIG. 32(a) is a plan view of a shaping aperture.
FIG. 32(b) is an intensity distribution map of an image of a primary electron beam irradiated onto a sample through the shaping aperture.

In the electron beam system according to this embodiment, an arrangement of the lenses is not telecentric (in a telecentric system, a primary electron beam is irradiated vertically relative to a sample surface both in an optical axis and in a location off from the optical axis). With this arrangement, the primary electron beam is, on or in the vicinity of the optical axis, irradiated to the sample surface in a vertical direction, but it tends to be irradiated more diagonally as it is farther from the optical axis, thereby resulting in a weak intensity of the primary electron beam in an edge region off from the optical axis and thus a weak intensity of the secondary electron beam to be emanated. In light of the above fact, the shaping aperture is configured to have shapes as illustrated in FIG. 32(a) and FIG. 32(b) so as to increase a quantity of the primary electron beam passing through an edge of the shaping aperture, thereby increasing intensity, as measured on the sample surface, of the primary electron beam in the edge portion off from the optical axis, so that even if the primary electron beam is irradiated diagonally relative to the sample surface at an edge region thereof, resultant intensity of the secondary electron beam to be emanated can be made as high as that from the optical axis portion as measured on the sample surface.

That is, the present embodiment provides an electron beam system in which a primary electron beam is irradiated on the sample surface, and secondary electrons emanated from the sample are magnified as an image to be detected, wherein a beam shape of the primary electron beam to be irradiated onto the sample surface is controlled to have such an intensity distribution that is low around the optical axis and high in a location away from the optical axis, so that a distribution of the secondary electrons received by the secondary optical system may be independent from a distance from the optical axis and uniform, and accordingly, distribution of a detection signal intensity may be uniform without depending on the distance from the optical axis.

In this regard, a detailed explanation will be given below.

(2) Shaping Aperture Image

As described above, the NA aperture image is formed on or in the vicinity of the principle plane of the objective lens 32'. In this case, there arises a problem in that a quantity of the emanated secondary electrons is high around the optical axis, which becomes lower in a location more distant from the optical axis. To solve this problem, the shaping aperture 16' in the present embodiment is designed to have a configuration as shown in FIG. 32(a). This figure shows the opening of the shaping aperture 16' defined from an upstream side to a downstream side with respect to the optical axis 11'. In this figure, an inside region surrounded by a line of reference numeral 16a' (opening shape) represents an opening 16b', through which the primary electron beam passes. An outside region of the line of reference numeral 16a' defines an opening frame 16c', which blocks the primary electron beam.

As shown in FIG. 32(a), an opening width W1' of the opening 16b' defined around a center thereof (around the optical axis 11) is constant. Starting from certain points away from a central region by a predetermined distance toward both edges, the opening width is gradually expanded wider finally to a width indicated as opening width W2' defined at either edge. The width of the opening W2' is determined to be narrower than that defined by a blur of the beam of the primary optical system. A ratio of the opening width W1' to the opening width W2' is determined such that the secondary electron beam has its intensity of the same level both around the optical axis 11' and in other regions. In the present embodiment, the opening width W2' is 1.5 to 4 times as large as that of the opening width W1'.

FIG. 32(b) shows an irradiation intensity distribution of primary electron beams that have passed through the opening 16n' of the shaping aperture and reached the sample surface 34a'. A primary electron beam having passed through the opening 16b' increases in dependence on a distance from the optical axis. As shown in FIG. 32(b), contour 17a' of the primary electron beam that has passed through the opening 16b' and formed into an image on the sample 34' by the lenses 38' and 32' is approximately a rectangular shape.

Curves defined on an inner side of the contour 17a' are contour lines 17b' to 17e' indicating magnitudes of the primary electron beam. A quantity increases from the contour line 17b' toward the contour line 17e'. A reason why the quantity increases toward either edge is that the shape of the opening 16b' gets wider toward either edge, and accordingly, a larger quantity of electron beam passes through the opening 16b' at both edges (opening width W2'>opening width W1').

Figure 33:
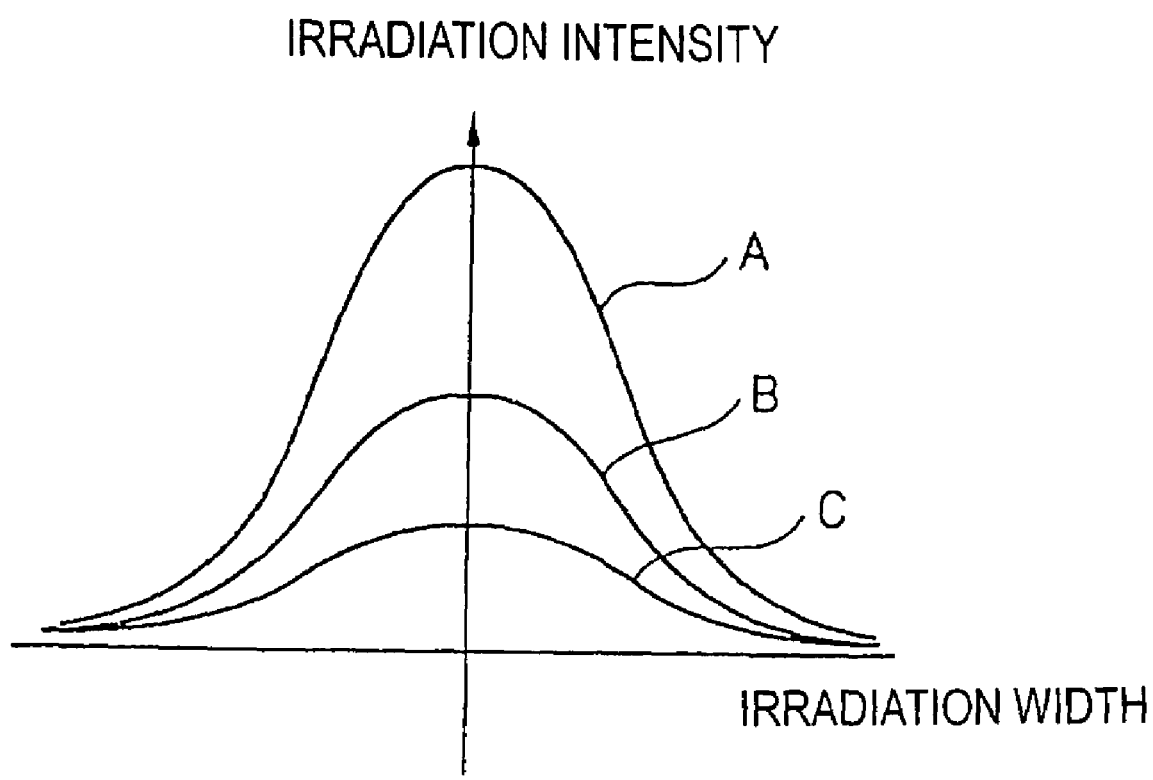
FIG. 33 is an intensity distribution diagram of the primary electron beam in respective sectional planes of FIG. 32(b)

The greatest irradiation intensity is observed in the section defined by line A—A in FIG. 32(b), and its intensity distribution is indicated by "A" in FIG. 33. FIG. 33 shows an irradiation intensity distribution by taking an irradiation width on x-axis and irradiation intensity on y-axis. The intensity distribution in the section defined by line B—B is indicated by "B" and that in the section defined by line C—C (central region) is indicated by "C". As shown in FIG. 33, lateral widths of respective sections are all the same. In contrast, from a point that they have different heights, it is seen that electron beams that have the same width are still different from one another in their intensity depending on a distance from the optical axis 11. The irradiation intensity is greatest in the A—A section, and becomes lower in sequence of the B—B section and then the C—C section. If the primary electron beam having such intensity distribution is irradiated on the sample surface 34a', secondary electrons to be received by the secondary optical system are not dependent on the distance from the optical axis 11' but will be constant. Further, the intensity of the secondary electrons can be made uniform by adjusting the opening shape 16a' appropriately. Again, the present embodiment is not representative of telecentric illumination, as stated above.

(3) (E×B Separator 20)

The function of the E×B separator will now be described. As shown in FIG. 30, the E×B separator 20' consists of an electromagnetic deflector 22' and an electrostatic deflector 24'. The electrostatic deflector 24' is located on an inner side of the electromagnetic deflector 22'. These deflectors are designed such that a ratio of deflection produced by the electrostatic deflector 24' to that produced by the electromagnetic deflector 22' is 1:2. An optical axis direction of secondary electrons emanated from the sample surface 34' is indicated as a reference line 60'. Since the electrostatic deflector 24' and the electromagnetic deflector 22' are configured to provide the deflection ratio of 1:2, when the secondary electrons pass through magnifying lens 38', which is a second stage magnifying lens, and enter the E×B separator 20', the secondary electrons are deflected by the electromagnetic deflector 22' toward the right by 20 degrees from the reference line 60', while at the same time, these electrons are deflected by the electrostatic deflector 24' toward the left by 10 degrees. As a result, the optical axis of the secondary electrons is deflected toward the right hand side by 10 degrees on balance relative to the reference line 60'. The detector 70' is arranged at a right angle with respect to axis 200' that is tilted to the right by 10 degrees from the reference line 60'. The detector 70' is disposed so as to be spaced from the E×B separator 20' by a predetermined distance. As described above, in this embodiment, the secondary electrons are deflected by both of an electric field and a magnetic field. As for its deflection sensitivity, deflection produced by the magnetic field is designed to be 20° toward the right, while deflection produced by the electric field is designed to be 10° toward the left; that is, the deflection by the magnetic field is in an inverse direction to and two times as large as that by the electric field.

In the E×B separator 20' that has been set to deflect the secondary electrons having an energy of 4502 eV by 20° toward the right by the electromagnetic deflector 22' and by 10° toward the left by the electrostatic deflector 24', a deflection angle of the secondary electrons of 4501 eV will be defined as follows.

At first, the secondary electrons are deflected by the deflection angle $(4502/4501)^{1/2} \times 20°$ toward the right by the electromagnetic deflector 22'. Second, the secondary electrons are deflected by the deflection angle $(4502/4501) \times 10°$ toward the left by the electrostatic deflector 24'. Then, a difference is determined by the equation below:

$$\left(\frac{4502}{4501}\right) \times 10 - \sqrt{\frac{4501}{4501}} \times 20 = \quad \text{(Eq. 1)}$$

$$10 \times \left(1 + \frac{1}{4501}\right) - 20 \times \left(1 + \frac{1}{4501}\right)^{1/2}$$

where, since the figures in the parentheses of the first and the second terms can be approximated by 1, the result will be ≈10×(1)−20×(1)=−10 (deflected toward the right by 10°).

Thus, the difference in deflection between the electrostatic deflector 24' and the electromagnetic deflector 22' is about −10°, which shows that the electron beam of 4501 eV is also deflected to the right by 10° similarly to the electron beam of 4502 eV. This means that according to this embodiment, even secondary electrons having different energy can be deflected by the same angle by the E×B separator 20'. This can help reduce deflection chromatic aberration. Preferably, the deflection angle is on the order of 7° to 15°. Further, there is no need to limit energy of the electron beam to be deflected to 4500 eV, and energy on the order of 4500 eV or in a range of 4000 eV to 5000 eV is feasible.

Further, the two-stage arrangement of lenses (the objective lens 32' and the magnifying lens 38') are disposed in a path of the secondary electrons, and the E×B separator 20' is disposed in a location downstream of the magnifying lens 38' arranged most downstream in the secondary electron beam path; that is, between the magnifying lens 38' and the detector 70'. Furthermore, in the present embodiment, the location of the E×B separator 20' is defined on the detector 70' side with respect to the magnifying lens 38'.

Owing to this arrangement, even if the deflection amount ratio of the electrostatic deflector 24' to the electromagnetic deflector 22' is slightly out of the ratio of 1:2, a difference in deflection chromatic aberration may, if any, fall in a range of submicron order on the detector 70' because of the short distance between the E×B separator 20' and the detector 70'. Further, since a pixel size is magnified on the detector 70' (in one example, assuming 640 times for a 50 nm pixel, resulting in a 32 µm pixel size), the quantity of difference in aberration would not cause any problem at all in the inspection precision of the semiconductor device. Especially in this embodiment, the arrangement of the E×B separator 20' defined on the detector 70' side with respect to the magnifying lens 38' may reduce the degree of aberration to be further low.

As for a configuration of the E×B separator 20' for deflecting a secondary electron beam, the number of windings of a coil of the electromagnetic deflector 22' may be increased or decreased and/or voltage or current to be applied thereto may be increased or decreased. Alternatively, a space between electrodes of the electrostatic deflector, or a gap, may be adjusted in order to deflect secondary electrons by a predetermined degree of angle.

Further alternatively, the secondary electron beam is not limited to the secondary electrons but may be back-scattering electrons.

Embodiment 2

FIG. 34 shows an electron beam system according to a second embodiment of the third invention. FIG. 34 represents an electron beam system that employs a stencil mask as a sample and performs an inspection of the stencil mask. In this embodiment, an electron beam (a primary electron beam) emitted from an electron gun 212' having an $LaB_6$ cathode is irradiated onto a condenser lens 214' and a shaping aperture 216' having a rectangular opening, and the electron beam having passed through the shaping aperture 216' is transmitted through an irradiation lens 218' so as to be irradiated to a stencil mask 234' prepared as the sample.

On a downstream side of the stencil mask, a first electron lens (an objective lens 232'), and in a location further downstream, a second electron lens (a magnifying lens 238') are disposed as magnifying lenses. An electron beam transmitted through the stencil mask 234' (a transmission electron beam) is magnified in two stages by the objective lens 232' and the magnifying lens 238' to form a magnified image on a detector 270'. An NA aperture 240' is disposed on a path of the transmission electron beam on a downstream side of the two-stage arrangement of lenses. The NA aperture 240' is disposed in the vicinity of the magnifying lens 238' on the detector side thereof. The detector 70' is disposed downstream of the NA aperture 240'. In this embodiment, the detector 270' employs an EBCCD using an element sensitive to the electron beam. The image detected by the detector is sent to a control section 100', as is the case of the electron beam system 10' shown in FIG. 29, where a specified analysis and inspection process is applied thereto.

In this embodiment, a crossover produced by the electron gun 212', the objective lens 232' and the NA aperture 240' are in a conjugate relationship relative to each other. Further, the shaping aperture 216' is arranged in a path of the primary electron beam so as to establish a conjugate relationship between this shaping aperture 216' and the sample 234' (sample surface). With this arrangement, the image produced by the shaping aperture 216' is formed on the sample 234' (the sample surface). Further, the crossover image produced by the electron gun 212' is formed on or in the vicinity of a principle plane of the objective lens 232'.

According to the configuration described above, since the electron beam contributing the aperture image is allowed to pass close to optical axis 205' in proximity to the objective lens 232', aberration can be reduced to low in an image to be detected. Further, the Koehler illumination condition can be satisfied.

(Position Of A Magnified Image)

It has been made apparent from simulation that distortion aberration of an image detected when the image (magnified image) of the stencil mask 234' by objective lens 232', serving as the first stage electron lens, is formed on certain point 231' defined in near side or upstream of the second stage magnifying lens (corresponding to the second stage electron lens) 238' can be minimal. In this regard, the point on which this magnified image is established will now be described. It is to be noted that as a compensation parameter in this simulation, evaluation is made on, in addition to a distance "L" between the magnified image 231' and the magnifying lens 238', a third order of distortion proportional to the third power of a distance from the optical axis 205', and a fifth order of distortion proportional to the fifth power of the distance from the optical axis 205'.

Figure 35:
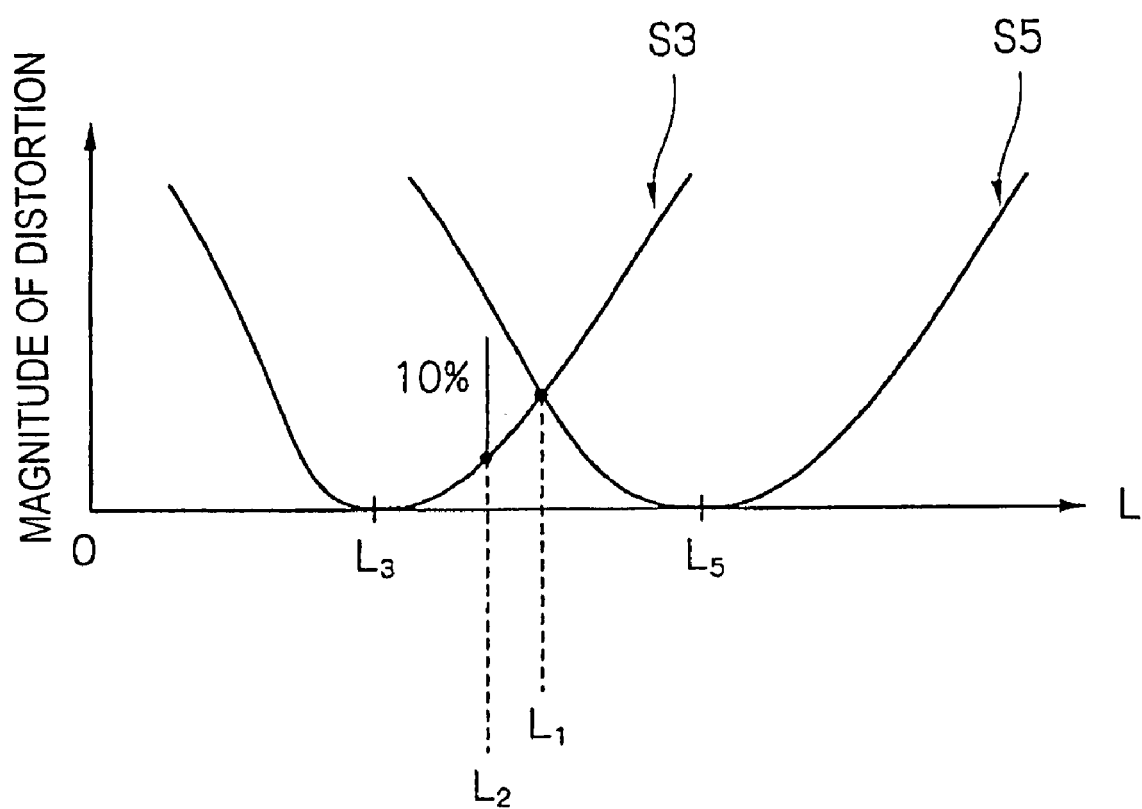
FIG. 35 is an explanatory diagram illustrating a variation of distortion as a function of different distance L between a position on which a magnified image is formed and a magnifying lens.

FIG. 35 shows distortion as a function of the distance L between the point on which magnified imager 231'is formed and the magnifying lens 238'. In FIG. 35, the horizontal axis indicates the distance L, and the vertical axis indicates a magnitude of the distortion determined from a calculation. Herein, the left curve is the third order of distortion S3 and the right curve is the fifth order of distortion S5. It is to be noted that since the third order of distortion S3 is represented by positive values, while the fifth order of distortion S5 is represented by negative values, FIG. 35 indicates absolute values for both values.

As shown in FIG. 35, it has been determined from a result of the simulation that the distances L where one of the distortions (S3, S5) becomes 0 does not coincide with that of the other. The distortion 0 for S3 is observed on the distance L3, while the distortion 0 for S5 is on the distance L5. That is, the distortions for S3 and S5 would not fall on 0 at the same time. Based on this finding, the present embodiment employs such a distance L that makes the absolute values for both distortions substantially equal as an appropriate distance L1. This distance L1 defines a value where the absolute values of the third order and the fifth order of distortion aberrations are minimal.

Figure 36:
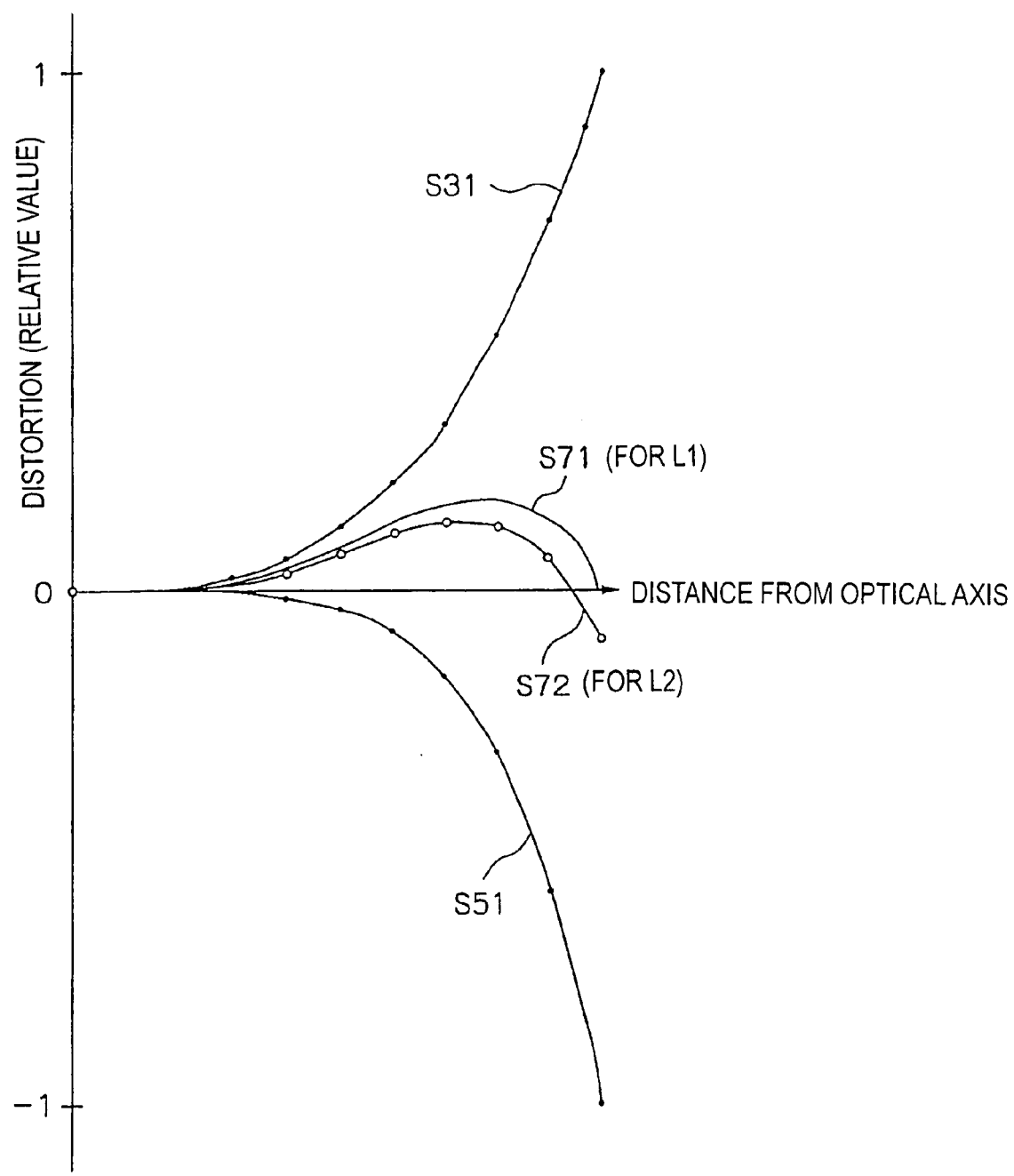
FIG. 36 is an explanatory diagram for a third and a fifth order of distortion.

FIG. 36 shows the third order of distortion S3 and the fifth order of distortion S5 for the distance of L1. In FIG. 36, the horizontal axis represents a distance from the optical axis 205, while the vertical axis represents a magnitude of distortion. Since the distortion appears symmetrical in a lateral direction with respect to the optical axis 205, FIG. 36 shows the distortion exclusively on the right hand side. In this figure, a rising curve represents the third order of distortion S31 and a dropping curve represent the fifth order of distortion S51. A difference between these distortions is represented by reference numeral S71. As shown in FIG. 36, the distortion has been successfully reduced by 20% by optimizing a compensation parameter. This can help further reduce distortion aberration of an image to be detected as well as transverse chromatic aberration.

Further, in the present embodiment, the distance L may be set not only to a distance where the absolute value of the third order and the fifth order of distortion aberrations is minimized, but also to a distance where the absolute value of the fifth order distortion (distortion aberration) is greater than the absolute value of the third order of distortion (distortion aberration) by 5% to 15%. The distance L where the fifth order of distortion S5 is greater than the third order of distortion S3 by 10% is indicated as L2 (see FIG. 35). The third order of distortion and the fifth order of distortion are determined respectively when the distance is set to L2, and a difference therebetween is indicated as reference numeral S72 in FIG. 36. The difference of distortion S72 is shown to be reduced further than the difference of distortion S71 by 13%.

The configuration of the simulation for setting the point of the magnified image to be produced by the first stage of electron lens (the objective lens 232', or the objective lens 32' in the embodiment 1) in response to that compensation parameter will now be described with reference to FIG. 29 used in conjunction with the embodiment 1. A program 113 for calculating the values for the third order and the fifth order of distortion aberrations through the simulation and determining those absolute values is installed. In addition, such a program 115' is installed that may set the point of the magnified image to be produced by the first stage electron lens (magnifying lens) such that an absolute value of the sum of those values calculated by the program 113' is minimum, or that the absolute value of the fifth order of distortion is greater than that of the third order of distortion by about 5 to 15%. The point of the magnified image is set by adjusting an intensity of the electric field in the objective lens 232'.

(Displacement of Z-Position of the Sample)

Currently, two different types of stencil mask may be considered. One is a mask used in a projection system for reducing an image of the mask to a quarter image on a wafer, while the other is a mask used in a 1:1 projection lithography (LEEPL). The former does not require such a high resolution, but a mask area is as large as 25 mm×40 mm×16=16000 mm² requiring high throughput. In contrast, the latter has a mask area as small as 25 mm×40 mm=1000 mm², but a high resolution is required.

In order to inspect two different types of stencil masks described above, it is important to make variable a magnification of an image of transmission electrons having passed through the stencil mask. For changing magnification without degrading aberration, it has become apparent from simulation that preferably a distance between the stencil mask 28' and the objective lens 29' serving as the magnifying lens, or a working distance 31', should be changed.

Based on this finding, in the present embodiment, when magnification for magnifying a transmission electron image is to be changed, a distance between the stencil mask 234' as the sample and the objective lens 232' is changed. With this configuration, the magnification of the transmission electron image can be made variable without deteriorating the aberration.

To make variable the magnification of the image of transmission electrons having passed through the stencil mask 234', this embodiment allows a position of the stencil mask 234' to be moved in the direction of the optical axis 205'. In FIG. 34, the position of the stencil mask 234' after movement is indicated by reference numeral 234a'. A magnification of 640 on the position indicated by reference numeral 234' can be reduced to a magnification of 320 by moving the mask to the position indicated by reference numeral 234a', or moving it away from the objective lens 232'. Thus, this embodiment makes a distance between the sample 234' and the objective lens 232' variable.

As for a primary electron beam in this case, assuming that the image forming condition of the crossover by the NA aperture 240' is kept unchanged, the image forming condition of the mask image by the shaping aperture 216' should allow a certain level of blur of the image. To this end, in a preferred embodiment, the shaping aperture 216' is provided with a plurality of differently shaped apertures. In FIG. 34, they are indicated by reference numerals 216a' to 216c'. When the magnification of the transmission image is to be changed, preferably the size of the shaping aperture 216' may be changed by switching it to either one of those designated by reference numerals 216a' to 216c' to thereby change an illumination area.

As for means for moving the stencil mask 234', in other words, means for adjusting the distance between the sample (stencil mask 234') and the electron lens (objective lens 232') located close to the sample, it may be implemented in a form in which some actuator is interlocked with the stencil mask 234' so as to move it. Alternatively, it may be implemented in another form in which a cassette for carrying the stencil masks 234' and a holder section for receiving the cassette are provided, wherein a position for carrying the stencil masks 234' is changed for each cassette, and when the sample is exchanged to another, the cassette in its entirety including the sample is replaced, thereby changing a distance between the sample and the objective lens.

(Structure of the Objective Lens 301')

Figure 37:
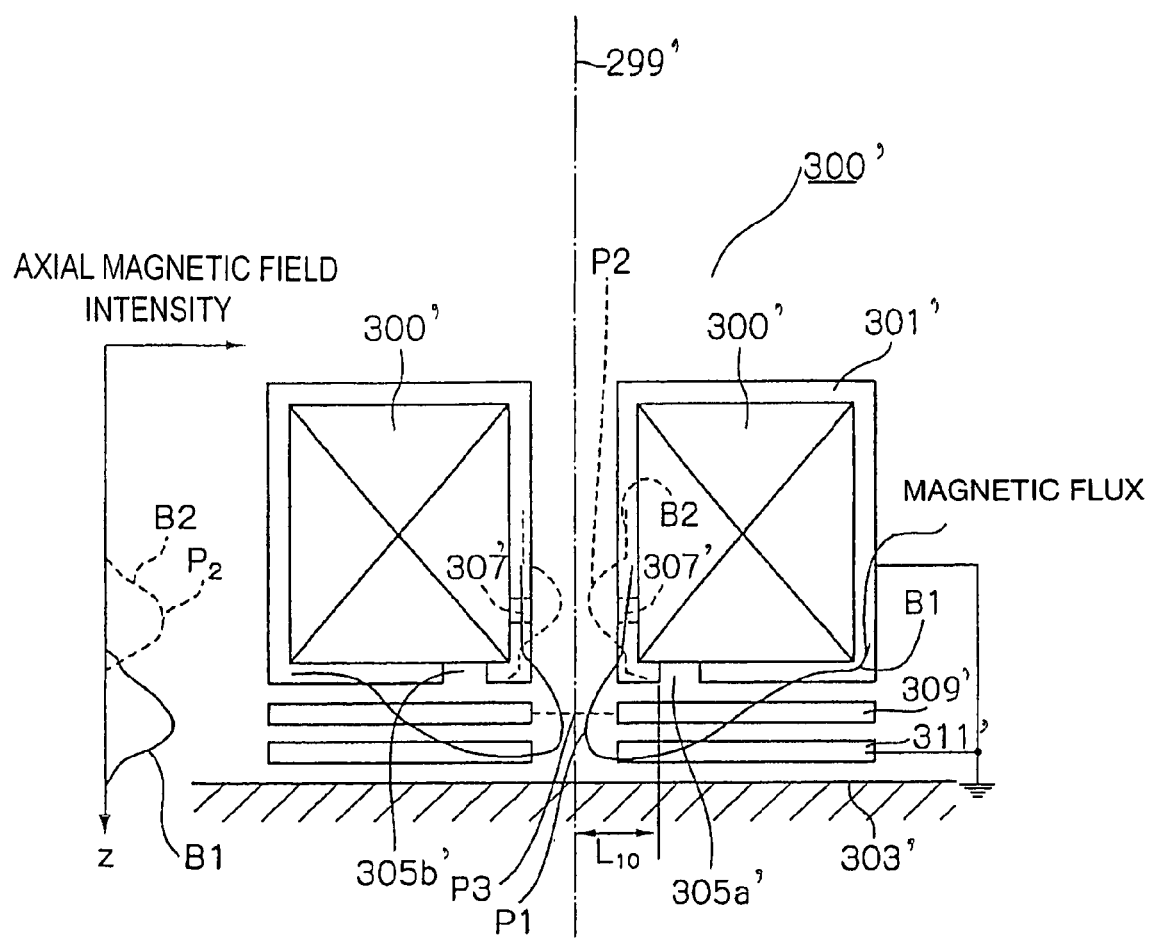
FIG. 37 is a schematic sectional view or an end view of an objective lens (an electromagnetic lens).

For producing a magnified image of secondary electrons or transmission electrons, once a transverse chromatic aberration has been compensated for satisfactorily, an axial chromatic aberration determines an ultimate aberration. Especially, in order to improve transmissivity of the secondary electrons or the like, it is important to reduce the axial chromatic aberration. FIG. 37 shows a structure of an objective lens 300' aiming for reducing the axial chromatic aberration with a large angle of numerical aperture. This objective lens 300' can be used as the objective lens 32' shown in FIG. 29 or the objective lens 29' shown in FIG. 34. FIG. 37 is a longitudinal sectional view of the objective lens 300' along optical axis 299'. In FIG. 37, reference numeral 299' designates the optical axis. The electromagnetic lens serving as the objective lens 300' has an annular structure with a path formed through a center thereof for allowing an electron beam to pass therethrough. The electromagnetic lens 300' includes an annular lens gap 305' formed on the sample side thereof, which is oriented toward the sample 303' side. In this embodiment, the lens gap 305' is defined in a position to be symmetrical around the optical axis 299'. A width of the lens gap 305' may be set appropriately in dependence on a design of the electromagnetic lens 300'.

An axial magnetic field distribution for a case provided with the lens gap 305' is indicated by B1 in FIG. 37. The axial field distribution for a case provided with lens gap 307' on the optical axis 299' side according to a related art structure is indicated by B2. Defining as P1 a Z position having a maximum value in the axial magnetic field distribution B1 and as P2 a Z position having a maximum value in the axial magnetic field distribution B2, the position P1 is much closer to the sample 303' than is the position P2. Thus, providing the lens gap 305' on the sample 303' side forms a Z position representing a maximum value near the sample. Owing to this, an axial chromatic aberration coefficient can be reduced.

Further, preferably two pieces of electrodes dedicated for the electrostatic lens may be arranged between the electromagnetic lens 300' and the sample 303'. In this embodiment, electrodes 309' and 311' serving as the electrostatic lens are disposed between the electromagnetic lens 300' and the sample 303'. Herein, a positive high voltage is applied to the electrode 309', and the electrode 311' and electromagnetic lens magnetic pole 301' are grounded, thereby allowing this unit of components to be functional as a uni-potential lens. Besides, applying a negative high voltage to the sample 303' allows the unit to be functional as a decelerating-electric field lens, thereby further reducing axial chromatic aberration.

The aberration can also be reduced by aligning a peak of the axial magnetic field distribution with the position of the electrode 309' of the two electrostatic lenses (309', 311') by changing the distance L between the lens gap 305' of the electrostatic lens 300' and the optical axis 299'. In FIG. 37, the above-described position is indicated by reference numeral P3. It is to be noted that the electrode 309' is the electrode disposed on the electromagnetic lens 300' side. In this case, only the single electrode 309' may be provided.

In a case where the electron beam system according to the embodiment of the third invention is applied to a device manufacturing method, the method may consist of a process similar to those shown in FIG. 16 and FIG. 17A, for example.

1. In the embodiment according to the third invention, since the aperture or the aperture image is provided in the vicinity of the principle plane of the objective lens, the electron beam contributing to the pattern image passes through the area near the optical axis in the region around the objective lens, so that aberration can be reduced. Further, intensity of the secondary electrons can be made uniform by adjusting a geometry of the shaping aperture.

2. Further, since the E×B separator is disposed between the last electron lens and the detector, aberration can be suppressed to a lower degree as compared with a pixel size even with some level of deflection aberration existing.

3. Further, by making the magnitude of electromagnetic deflection double of that of the electrostatic deflection, electron beams having different energy can be deflected by about the same degree, and a deflection chromatic aberration can be reduced.

4. Further, in the second embodiment, since the two-stage arrangement of lenses can reduce the magnification chromatic aberration and make a small value of distortion, inspection can be provided for a stencil mask with high precision. Further, magnification can be changed without deteriorating an aberration level by changing a position of the stencil mask or the sample on the optical axis.

5. Further, the lens structure with a small axial chromatic aberration may be provided by arranging a lens gap on the sample side. Further, the axial chromatic aberration can be reduced more by combining an electromagnetic lens with an electrostatic lens.

6. Yet further, since a primary electron beam satisfies the Koehler illumination condition and the two-stage of electron lenses are included in the configuration, a primary optical system defining a short optical length can be provided.

Although only some exemplary embodiments of this invention have been described in detail above, those skilled in the art will readily appreciate that many modifications are possible in the exemplary embodiments without materially departing from the novel teaching and advantages of this invention. Accordingly, all such modifications are intended to be included within the scope of this invention.

The entire disclosure of Japanese Patent Application No. 2002-253197 filed on Aug. 30, 2002, No. 2002-319687 filed on Nov. 1, 2002 and No. 2003-000178 filed on Jan. 6, 2003, each including specification, claims, drawings and summary is incorporated herein by reference in their entirety.

What is claimed is:

1. An electron beam system comprising:
   an electron gun for emitting an electron beam and for irradiating the electron beam against a sample when the sample is positioned at an irradiation location;
   an electron lens for magnifying the electron beam after having passed through the sample; and
   a detector for detecting the electron beam after having been magnified so as to form an image of the sample,
   wherein a crossover image of said electron gun is to be formed on or in the vicinity of a principle plane of said electrons lens.

2. The electron beam system according to claim 1, wherein
   said electron gun is for irradiating the electron beam against a sample by irradiating the electron beam against a stencil mask or a mask having a pattern formed on a membrane.

3. The electron beam system according to claim 1, further comprising:
   an NA aperture disposed between said electron gun and the irradiation location such that when said electron gun emits the electron beam the electron beam is passed through said NA aperture so as to allow a well-collimated electron beam to be irradiated against the sample.

4. The electron beam system according to claim 1, further comprising:
   a single shaping aperture disposed between said electron gun and the irradiation location such that when said electron gun emits the electron beam the electron beam is passed through said single shaping aperture and irradiated against a surface of the sample so as to allow an image of said single shaping aperture to be formed on the surface of the sample.

5. The electron beam system according to claim 1, further comprising:
   an optical axis; and
   shaping apertures disposed in the vicinity of said optical axis, with an overlapping arrangement of said shaping apertures being changeable so as to make variable an area on the sample to be irradiated by the electron beam when emitted from said electron gun.

6. The electron beam system according to claim 1, wherein
   said electron gun has a thermionic emission cathode and is operable under a space-charge-limited condition.

7. The electron beam system according to claim 1, further comprising:
   at least a two-stage arrangement of electron lenses disposed between said detector and the irradiation location such that said detector is for detecting the electron beam after the electron beam passed through said two-stage arrangement of electron lenses.

8. The electron beam system according to claim 1, further comprising:
   an entrance pupil of an irradiation lens system disposed between said electron gun and the irradiation location such that a source image is formed in said entrance pupil.

9. The electron beam system according to claim 8, further comprising:
   a two-stage arrangement of lenses between said electron gun and the irradiation location,
   wherein said electron lens is constructed and arranged such that by changing a focal length of said electron lens a crossover image can be formed so as to scan a sample surface of the sample with the crossover image, or by reducing an overlap between two shaping apertures the electron beam is made to have a small diameter so as to scan the sample surface of the sample with this electron beam, such that registration of the sample can be performed.

10. The electron beam system according to claim 1, further comprising:
    two magnifying lenses disposed between the irradiation location and said detector, with a magnification of said two magnifying lenses being able to be made variable in response to a size of an irradiation area of the electron beam on the sample.

11. The electron beam system according to claim 1, wherein
    said electron gun is for irradiating the electron beam against the sample by irradiating against the sample an electron beam having an irradiation area that is defined to be rectangular in shape, having long sides and short sides, and
    said electron beam system further comprises a sample table, at the irradiation location, on which the sample is to be loaded, with said sample table being movable such that detection of the sample is performed by said detector while moving said sample table, having the sample loaded thereon, continuously in a direction of the short sides.

12. The electron beam system according to claim 1, further comprising:
    a sample table carrier for controlling the electron beam so as to perform a scanning motion in a step-by-step manner or continuously.

13. The electron beam system according to claim 1, wherein said detector comprises
    (i) a scintillator that is to change the electron beam to an image of light,
    (ii) an optical lens for adjusting a size of the image of light as produced by said scintillator, or an optical system for projecting the image of light, and
    (iii) either one of a CCD detector or a TDI detector on which the image of light, whose size has been adjusted by said optical lens, is to be formed.

14. The electron beam system according to claim 13, further comprising:
    a vacuum window arranged between said scintillator and said optical lens for removing the image of light when directed to said optical lens,
    wherein said scintillator is disposed in a vacuum, and said optical lens and said CCD detector or TDI detector are disposed in an atmosphere.

15. The electron beam system according to claim 13, wherein
    said scintillator, said optical lens and said CCD detector or TDI detector are disposed in a vacuum.

16. The electron beam system according to claim 1, wherein
said electron gun is an electron gun having a small source and having an FE, a TFE or a Schottky cathode.

17. The electron beam system according to claim 1, wherein
said electron gun is disposed under the irradiation location, and
said detector is for detecting a defect in the sample, and is disposed above the irradiation location.

18. The electron beam system according to claim 1, further comprising:
magnifying lenses, for magnifying the electron beam, disposed between said electron gun and said detector,
wherein a magnifying lens, serving as a first one of said magnifying lenses to magnify the electron beam that has passed through the sample, is a doublet lens.

19. The electron beam system according to claim 1, further comprising:
magnifying lenses, for magnifying the electron beam, disposed between said electron gun and said detector, and
an NA aperture disposed between said magnifying lenses,
wherein said NA aperture is able to remove electron beams of a bad collimation that have been scattered by the sample.

20. The electron beam system according to claim 1, wherein
said detector comprises an image detector, with said image detector being composed of an MCP and an EB-CCD detector or an EB-CCD, or otherwise an MCP and an EB-TDI detector or an EB-TDI.

21. The electron beam system according to claim 1, further comprising:
a second detector for detecting secondary electrons or back scattering electrons, which are generated upon scanning of the sample with the electron beam, disposed between the irradiation location and said electron gun.

22. The electron beam system in accordance with claim 1, wherein
a pixel processing rate for an image of said system is set to be equal to at least 200 MHz.

23. The electron beam system according to claim 1, further comprising:
a storage unit in which reference pattern data is stored in advance; and
a control unit for comparing image data, obtained from the electron beam after having passed through the sample, to the pattern data,
wherein said control unit is to perform a defect inspection of the sample based on a comparison of the image data and the pattern data.

24. A manufacturing method of a semiconductor device, comprising:
preparing wafers;
processing said wafers by performing a lithography process by employing a stencil mask which has been inspected for any defect by using the electron beam system according to claim 1; and
assembling devices using the processed wafers.

25. An electron beam system comprising:
an electron gun for emitting a primary electron beam and irradiating the primary electron beam against a sample, when positioned at an irradiation location as a subject to be inspected, so as to form an electron image, by a transmission electron beam having passed through the sample, to be magnified and detected;
an NA aperture disposed in a path of the transmission electron beam; and
an electron lens in the vicinity of the irradiation location,
wherein a principle plane of said electron lens and said NA aperture are in a conjugate relationship with respect to each other.

26. The electron beam system according to claim 25, further comprising:
an optical axis; and
shaping apertures in the vicinity of said optical axis, with an overlapping arrangement of said shaping apertures being changeable so as to make variable an area on the sample to be irradiated by the primary electron beam when emitted from said electron gun.

27. The electron beam system according to claim 25, further comprising:
a shaping aperture in a path of the primary electron beam when emitted by said electron gun,
wherein said shaping aperture and the sample, when positioned at the irradiation location, are arranged to be in a conjugate relationship relative to each other.

28. The electron beam system according to claim 25, further comprising:
a two-stage arrangement of electron lenses in a path of the transmission electron beam, said two-stage arrangement of electron lenses including a first stage electron lens and a second stage electron lens, with said first stage electron lens to produce a magnified image that is to be focused on a certain point upstream of said second stage electron lens.

29. The electron beam system according to claim 25, further comprising:
an adjuster for adjusting a distance between the irradiation location and said electron lens when one sample is replaced by another.

30. An electron beam system comprising:
a two-stage arrangement of electron lenses for magnifying an electron image of secondary electrons emanated from a sample surface, back scattering electrons or an electron having passed through the sample so as to be detected,
wherein said two-stage arrangement of electron lenses includes a first stage electron lens and a second stage electron lens, with said first stage electron lens to produce a magnified image that is to be focused on a certain point upstream of said second stage electron lens to thereby reduce a distortion aberration or a magnification aberration.

31. The electron beam system according to claim 30, wherein
a distance between said second stage electron lens and the magnified image is a compensation parameter, and a position of the magnified image when produced by said first stage electron lens is to be set in response to the compensation parameter being optimized.

32. An electron beam system, in which a primary electron beam is irradiated to a sample, and an image of secondary electrons emanated from the sample, an image of back scattering electrons or an image of transmission electrons having passed through the sample is magnified and detected as an image, wherein
a distortion aberration in the detected image is simulated by calculation to thereby determine a difference between a third order of absolute value and a fifth order of absolute value of the distortion aberration, and a compensation parameter is optimized such that the difference is minimized or that the fifth order of absolute value is greater than the third order of absolute value by about 5 to 15%, wherein a position of a magnified image produced by a first stage electron lens is to be set in response to the optimized compensation parameter.

33. An electron beam system comprising:

an electron gun for emitting an electron beam and for irradiating the electron beam against a sample when the sample is positioned at an irradiation location;

an electron lens disposed close to the irradiation location, said electron lens for magnifying, as a transmission electron image, electrons that have passed through the sample so as to be detectable by either one of a CCD, a TDI or an EBCCD; and an NA aperture between said electron gun and said irradiation location, with an NA aperture image to be focused on or in the vicinity of a principle plane of said electron lens, wherein when a magnification for magnifying the electrons is to be changed, a distance between the irradiation location and said electron lens is changed.

* * * * *